(12) United States Patent
Lin et al.

(10) Patent No.: US 8,884,433 B2
(45) Date of Patent: Nov. 11, 2014

(54) CIRCUITRY COMPONENT AND METHOD FOR FORMING THE SAME

(75) Inventors: Mou-Shiung Lin, Hsin-Chu (TW); Chien-Kang Chou, Tainan Hsien (TW); Ke-Hung Chen, Kao-Hsiung (TW)

(73) Assignee: Qualcomm Incorporated, San Diego, CA (US)

(*) Notice: Subject to any disclaimer, the term of this patent is extended or adjusted under 35 U.S.C. 154(b) by 232 days.

(21) Appl. No.: 12/545,880

(22) Filed: Aug. 24, 2009

(65) Prior Publication Data
US 2009/0309224 A1 Dec. 17, 2009

Related U.S. Application Data

(63) Continuation of application No. 11/426,317, filed on Jun. 26, 2006, now Pat. No. 7,582,556.

(60) Provisional application No. 60/693,549, filed on Jun. 24, 2005.

(51) Int. Cl.
| | |
|---|---|
| H01L 29/40 | (2006.01) |
| H01L 23/532 | (2006.01) |
| H01L 23/00 | (2006.01) |
| H01L 23/31 | (2006.01) |
| H01L 21/768 | (2006.01) |
| H01L 23/522 | (2006.01) |

(52) U.S. Cl.
CPC .......... *H01L 24/12* (2013.01); *H01L 23/53295* (2013.01); *H01L 2924/01075* (2013.01); *H01L 2924/01013* (2013.01); *H01L 2924/19042* (2013.01); *H01L 2924/01007* (2013.01);

(Continued)

(58) Field of Classification Search
USPC .......... 257/758, 734, 778, 691, 692, 759, 760
See application file for complete search history.

(56) References Cited

U.S. PATENT DOCUMENTS 5,565,706 A * 10/1996 Miura et al. .................. 257/723
5,615,824 A 4/1997 Fjelstad
(Continued)

FOREIGN PATENT DOCUMENTS

| | | |
|---|---|---|
| CN | 1560911 | 1/2005 |
| EP | 1387402 | 2/2004 |

(Continued)

OTHER PUBLICATIONS

Baba et al.; "Molded Chip Scale Package for High Pin Count"; IEEE Trans. On Components, Packaging and Manufacturing Tech.; Part B; vol. 21; No. 1; Feb. 1998.

(Continued)

*Primary Examiner* — Bilkis Jahan
(74) *Attorney, Agent, or Firm* — Seyfarth Shaw LLP

(57) ABSTRACT

A circuit structure includes a semiconductor substrate, first and second metallic posts over the semiconductor substrate, an insulating layer over the semiconductor substrate and covering the first and second metallic posts, first and second bumps over the first and second metallic posts or over the insulating layer. The first and second metallic posts have a height of between 20 and 300 microns, with the ratio of the maximum horizontal dimension thereof to the height thereof being less than 4. The distance between the center of the first bump and the center of the second bump is between 10 and 250 microns.

22 Claims, 46 Drawing Sheets

(52) U.S. Cl.
CPC .......... *H01L 2924/01005* (2013.01); *H01L 2224/45147* (2013.01); *H01L 2224/05181* (2013.01); *H01L 2924/19043* (2013.01); *H01L 2924/01047* (2013.01); *H01L 2224/05647* (2013.01); *H01L 2924/01045* (2013.01); *H01L 24/03* (2013.01); *H01L 2224/13099* (2013.01); *H01L 2924/01044* (2013.01); *H01L 2924/01082* (2013.01); *H01L 2924/04953* (2013.01); *H01L 2924/30105* (2013.01); *H01L 2924/01046* (2013.01); *H01L 2924/01079* (2013.01); *H01L 2924/01022* (2013.01); *H01L 2924/19041* (2013.01); *H01L 2924/01033* (2013.01); *H01L 24/11* (2013.01); *H01L 2224/0401* (2013.01); *H01L 2224/0347* (2013.01); *H01L 2224/48864* (2013.01); *H01L 23/5227* (2013.01); *H01L 2924/01011* (2013.01); *H01L 2924/12044* (2013.01); *H01L 2924/3011* (2013.01); *H01L 2924/09701* (2013.01); *H01L 2224/05166* (2013.01); *H01L 2224/05624* (2013.01); *H01L 24/05* (2013.01); *H01L 2924/01078* (2013.01); *H01L 24/02* (2013.01); *H01L 2924/01024* (2013.01); *H01L 2924/14* (2013.01); *H01L 2224/05187* (2013.01); *H01L 2924/014* (2013.01); *H01L 23/3192* (2013.01); *H01L 2224/05664* (2013.01); *H01L 2924/01015* (2013.01); *H01L 2224/1147* (2013.01); *H01L 2924/10329* (2013.01); *H01L 2224/48091* (2013.01); *H01L 2924/0105* (2013.01); *H01L 2924/01006* (2013.01); *H01L 2224/05644* (2013.01); *H01L 2924/01019* (2013.01); *H01L 2924/01014* (2013.01); *H01L 2924/01028* (2013.01); *H01L 2924/05042* (2013.01); *H01L 2224/73204* (2013.01); *H01L 2224/04042* (2013.01); *H01L 24/48* (2013.01); *H01L 2224/48847* (2013.01); *H01L 2224/48463* (2013.01); *H01L 2224/05669* (2013.01); *H01L 2224/04073* (2013.01); *H01L 2224/48844* (2013.01); *H01L 24/16* (2013.01); *H01L 2924/01029* (2013.01); *H01L 2924/01074* (2013.01); *H01L 24/10* (2013.01); *H01L 2924/01073* (2013.01); *H01L 2224/05073* (2013.01); *H01L 2924/04941* (2013.01); *H01L 21/76801* (2013.01)
USPC .......... 257/758; 257/734; 257/778; 257/691; 257/692; 257/759; 257/760

(56) References Cited

U.S. PATENT DOCUMENTS

| | | | | |
|---|---|---|---|---|
| 5,745,984 A * | 5/1998 | Cole et al. | | 29/834 |
| 5,801,446 A | 9/1998 | DiStefano | | |
| 5,885,849 A | 3/1999 | DiStefano | | |
| 5,959,256 A * | 9/1999 | Saida et al. | | 174/258 |
| 5,960,316 A | 9/1999 | Bai | | |
| 5,980,270 A | 11/1999 | Fjelstad | | |
| 6,022,758 A | 2/2000 | Badehi | | |
| 6,103,552 A | 8/2000 | Lin | | |
| 6,117,766 A | 9/2000 | Yoon et al. | | |
| 6,154,366 A * | 11/2000 | Ma et al. | | 361/704 |
| 6,162,661 A | 12/2000 | Link | | |
| 6,200,888 B1 | 3/2001 | Ito | | |
| 6,253,992 B1 | 7/2001 | Fjelstad | | |
| 6,284,656 B1 * | 9/2001 | Farrar | | 438/687 |
| 6,294,405 B1 | 9/2001 | Higgins, III | | |
| 6,303,486 B1 | 10/2001 | Park | | |
| 6,324,754 B1 | 12/2001 | DiStefano | | |
| 6,326,701 B1 | 12/2001 | Shinogi | | |
| 6,329,605 B1 | 12/2001 | Beroz | | |
| 6,335,222 B1 | 1/2002 | DiStefano | | |
| 6,365,971 B1 | 4/2002 | Bai | | |
| 6,380,060 B1 | 4/2002 | Zohni | | |
| 6,383,916 B1 * | 5/2002 | Lin | | 438/637 |
| 6,387,734 B1 | 5/2002 | Inaba | | |
| 6,387,793 B1 | 5/2002 | Yap | | |
| 6,465,747 B2 | 10/2002 | DiStefano | | |
| 6,479,900 B1 * | 11/2002 | Shinogi et al. | | 257/758 |
| 6,492,251 B1 | 12/2002 | Haba et al. | | |
| 6,495,442 B1 | 12/2002 | Lin et al. | | |
| 6,495,916 B1 | 12/2002 | Ohuchi | | |
| 6,501,169 B1 | 12/2002 | Aoki | | |
| 6,518,092 B2 | 2/2003 | Kikuchi | | |
| 6,545,354 B1 | 4/2003 | Aoki | | |
| 6,547,124 B2 * | 4/2003 | Shah et al. | | 228/246 |
| 6,607,970 B1 | 8/2003 | Wakabayashi | | |
| 6,639,299 B2 | 10/2003 | Aoki | | |
| 6,645,136 B1 | 11/2003 | Zunker et al. | | |
| 6,656,828 B1 * | 12/2003 | Maitani et al. | | 438/613 |
| 6,673,698 B1 | 1/2004 | Lin et al. | | |
| 6,674,162 B2 | 1/2004 | Takao | | |
| 6,709,469 B1 | 3/2004 | Link | | |
| 6,724,638 B1 * | 4/2004 | Inagaki et al. | | 361/763 |
| 6,765,299 B2 | 7/2004 | Takahashi | | |
| 6,770,971 B2 | 8/2004 | Kouno | | |
| 6,784,087 B2 | 8/2004 | Lee et al. | | |
| 6,818,545 B2 | 11/2004 | Lee et al. | | |
| 6,828,510 B1 * | 12/2004 | Asai et al. | | 174/255 |
| 6,828,668 B2 | 12/2004 | Smith et al. | | |
| 6,847,066 B2 | 1/2005 | Tahara | | |
| 6,870,267 B2 | 3/2005 | Zohni | | |
| 6,924,551 B2 | 8/2005 | Rumer et al. | | |
| 6,943,440 B2 * | 9/2005 | Kim et al. | | 257/690 |
| 6,952,048 B2 | 10/2005 | Terui | | |
| 6,969,910 B2 | 11/2005 | Chinda | | |
| 7,012,339 B2 | 3/2006 | Terui | | |
| 7,029,953 B2 | 4/2006 | Sasaki | | |
| 7,045,899 B2 | 5/2006 | Yamane | | |
| 7,078,819 B2 | 7/2006 | DiStefano | | |
| 7,188,413 B2 | 3/2007 | Jamil | | |
| 7,196,014 B2 | 3/2007 | Dalton et al. | | |
| 7,208,834 B2 | 4/2007 | Lee et al. | | |
| 7,220,657 B2 | 5/2007 | Ihara | | |
| 7,239,028 B2 | 7/2007 | Anzai | | |
| 7,351,915 B2 * | 4/2008 | Ahn et al. | | 174/260 |
| 7,443,036 B2 | 10/2008 | Iwasaki | | |
| 7,468,545 B2 | 12/2008 | Lin et al. | | |
| 7,582,556 B2 | 9/2009 | Lin et al. | | |
| 7,745,931 B2 * | 6/2010 | Takao | | 257/734 |
| 7,855,461 B2 * | 12/2010 | Kuo et al. | | 257/780 |
| 7,960,269 B2 * | 6/2011 | Lo et al. | | 438/598 |
| 8,004,083 B2 * | 8/2011 | Lin et al. | | 257/758 |
| 2002/0070443 A1 * | 6/2002 | Mu et al. | | 257/712 |
| 2002/0096757 A1 | 7/2002 | Takao | | |
| 2002/0121692 A1 | 9/2002 | Lee | | |
| 2002/0190107 A1 | 12/2002 | Shah et al. | | |
| 2003/0038331 A1 | 2/2003 | Aoki | | |
| 2003/0111711 A1 * | 6/2003 | Lin et al. | | 257/635 |
| 2003/0134455 A1 * | 7/2003 | Cheng et al. | | 438/125 |
| 2003/0168254 A1 | 9/2003 | Kariya et al. | | |
| 2004/0094841 A1 * | 5/2004 | Matsuzaki et al. | | 257/758 |
| 2004/0140556 A1 * | 7/2004 | Lin et al. | | 257/723 |
| 2004/0147097 A1 * | 7/2004 | Pozder et al. | | 438/584 |
| 2004/0168825 A1 * | 9/2004 | Sakamoto et al. | | 174/260 |
| 2004/0195686 A1 * | 10/2004 | Jobetto et al. | | 257/734 |
| 2004/0207088 A1 | 10/2004 | Morozumi | | |
| 2005/0062147 A1 | 3/2005 | Wakisaka et al. | | |
| 2005/0098891 A1 | 5/2005 | Wakabayashi | | |
| 2005/0112800 A1 | 5/2005 | Yamano | | |
| 2005/0151130 A1 | 7/2005 | Stasiak | | |
| 2005/0176233 A1 | 8/2005 | Joshi et al. | | |
| 2008/0081458 A1 * | 4/2008 | Lin et al. | | 438/620 |

(56) References Cited

U.S. PATENT DOCUMENTS

| | | | |
|---|---|---|---|
| 2008/0121943 A1* | 5/2008 | Lin et al. | 257/211 |
| 2009/0057895 A1 | 3/2009 | Lin et al. | |

FOREIGN PATENT DOCUMENTS

| | | |
|---|---|---|
| JP | 58158945 A | 9/1983 |
| JP | 09-045691 | 2/1997 |
| JP | 10335528 A | 12/1998 |
| JP | 11054646 A | 2/1999 |
| JP | 2000082716 A | 3/2000 |
| JP | 2000-183090 | 6/2000 |
| JP | 2000-228423 | 8/2000 |
| JP | 2000261284 A | 9/2000 |
| JP | 2001144213 A | 5/2001 |
| JP | 2001244372 A | 9/2001 |
| JP | 2001257310 A | 9/2001 |
| JP | 2001345336 A | 12/2001 |
| JP | 2002093945 A | 3/2002 |
| JP | 2002252250 A | 9/2002 |
| JP | 2002353261 A | 12/2002 |
| JP | 2003203982 A | 7/2003 |
| JP | 2003243394 A | 8/2003 |
| JP | 2004071998 A | 3/2004 |
| JP | 2004273591 A | 9/2004 |
| JP | 2004363250 A | 12/2004 |
| JP | 2005085929 A | 3/2005 |
| JP | 2005093942 A | 4/2005 |
| JP | 2005116714 A | 4/2005 |
| JP | 2005129862 A | 5/2005 |
| JP | 2005158768 A | 6/2005 |
| WO | 20050024912 | 3/2005 |
| WO | WO2005024912 | 3/2005 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Office Action and European Search Report for European Patent Application No. 06012984.8 dated Jul. 18, 2008.

Office Action for Chinese Patent Application No. 201010508077.1 dated Nov. 3, 2011 and an English translated summary.

European Search Report—EP06013044 Search Authority—Munich Patent Office, Jun. 24, 2008.

European Search Report—EP11003815 Search Authority—Munich Patent Office, Jan. 4, 2012.

* cited by examiner

US 8,884,433 B2

CIRCUITRY COMPONENT AND METHOD FOR FORMING THE SAME

This application is a continuation of U.S. application Ser. No. 11/426,317, filed on Jun. 26, 2006, now issued as U.S. Pat. No. 7,582,556, which claims priority to U.S. provisional application No. 60/693,549 filed on Jun. 24, 2005.

BACKGROUND OF THE INVENTION

1. Field of the Invention

The present invention relates to semiconductor devices, particularly to structures of semiconductor devices, and more particularly to post passivation structures for semiconductor devices and packaging processes for such.

2. Description of Related Art

Semiconductor wafers are processed to produce IC (integrated circuit) chip having ever-increasing device density and shrinking feature geometries. Multiple conductive and insulating layers are required to enable the interconnection and isolation of the large number of semiconductor devices in different layers (e.g., active and passive devices, such as TFT, CMOS, capacitors, inductors, resistors, etc). Such large scale integration results in increasing number of electrical connections between various layers and semiconductor devices. It also leads to an increasing number of leads to the resultant IC chip. These leads are exposed through a passivation layer of the IC chip, terminating in I/O pads that allow connections to external contact structures in a chip package.

Wafer-Level Packaging (WLP) refers to the technology of packaging an IC chip at wafer level, instead of the traditional process of assembling the package of each individual unit after wafer dicing. WLP allows for the integration of wafer fabrication, packaging, test, and burn-in at the wafer level, before being singulated by dicing for final assembly into a chip carrier package (e.g., a ball grid array (BGA) package). The advantages offered by WLP include smaller size (reduced footprint and thickness), lesser weight, relatively easier assembly process, lower overall production costs, and improvement in electrical performance. WLP therefore streamlines the manufacturing process undergone by a device from silicon start to customer shipment. While WLP is a high throughput and low cost approach to IC chip packaging, it however invites significant challenges in manufacturability and structural reliability.

WLP basically consists of extending the wafer fabrication processes to include device interconnection and device passivation processes. The first step to WLP is to enlarge the pad pitch of standard ICs by redistribution technology post passivation of the IC semiconductor structure. Low cost stencil printing of solder or placing preformed solder balls is then possible. Examples of redistribution technology are disclosed, for example, in U.S. Pat. No. 6,642,136; U.S. Pat. No. 6,784,087; and U.S. Pat. No. 6,818,545, commonly assigned to the assignee of the present invention. As disclosed in these patents, a redistribution layer (RDL) contacts the I/O pad of the semiconductor structure. The RDL is supported on a layer of polymer or elastomer deposited over a passivation layer. A contact post is formed on the RDL, using a photo-masking process. The resultant contact post is freestanding, unsupported on its lateral sides. The resultant structure can be further assembled into a chip carrier package using flip chip assembly technique. While the post passivation structures and related processes provide for IC packaging with improved pitch resolution, there is still a limitation to meeting the increasing demand for finer pitch resolution in view of the ever increasing scale of integration in ICs. There is also potential risk for stress-induced failures, as noted below.

U.S. Pat. No. 6,103,552 discloses another WLP process including a post passivation RDL. The RDL is supported on a layer of polymeric material that is deposited on the passivation layer of the semiconductor structure. Another polymeric layer is deposited over the RDL, and etched or drilled to provide a via for over-filling with a metal to form an interconnect (i.e., a conducting post) that extends above and beyond the opening of the via. The top polymeric layer and the bottom polymeric layer are separated by a layer of chrome-copper, and therefore do not touch between the RDL structures. A solder bump attached to the protruding end of the post is formed by electroless plating, screen or stencil printing. Because the post extends beyond the surface of the polymeric layer, and the top surface of the structure is otherwise not smooth, high-resolution lithography cannot be achieved to form the vias for the conductive posts and to plate the solder bumps. Consequently, the pitch of the contacts for the IC package would be limited. This limitation would be more pronounced with an increase in thickness of the polymeric layer, which otherwise may be desirable to provide better stress relief, as discussed below. Further, as noted, the bottom polymeric layer is separate from the top polymeric layer, therefore the bottom polymeric layer alone does not provide good stress relief. If the bottom polymeric layer is made thin to reduce lateral RDL displacements, stress relief would be poor, leading to issues further discussed below.

One of the challenges to structural reliability includes providing adequate stress relief in the resultant WLP processed multilayered structure, including the semiconductor IC die and the additional post passivation structure. For example, the thin film bonded on the passivation layer is subject to biaxial stress that is thermally induced. Equation (1) represents a theoretical mathematical modeling of the biaxial thermal stress in the post passivation thin film in relationship to various physical parameters of the bonded structure on a silicon (Si) substrate:

$$\sigma_{ppt} = \frac{1}{6R} \frac{Y_s x_{Si}^2}{(1 - v_{Si})x_{ppt}} \qquad \text{Equation (1)}$$

where:
$\sigma_{ppt} = \sigma_x = \sigma_y$; biaxial stress in the post passivation thin film;
R=radius of curvature of the Si substrate caused by thermal stress;
$Y_s$=Young's modulus of Si substrate;
$v_{si}$=Poisson's ratio of Si substrate;
$x_{Si}$=thickness of Si substrate; and
$x_{ppt}$=thickness of the post-passivation thin film.

Based on the above formula, there are two ways to lowering the biaxial stress $\sigma_{ppt}$ (in addition to increasing $v_{si}$): (a) lower $x_{Si}$, which means making the Si substrate thinner; or (b) increase $x_{ppt}$, which means increasing the thickness of the post-passivation thin film structure.

FIG. 1 schematically shows a prior art post passivation structure 10, including an RDL 12 and a stress-relieving polymer (or stress buffer) layer 14, formed over a passivation layer 16 at the top layer of the semiconductor IC chip 18. The polymer layer 14 is made of, for example, an elastomer, epoxy, low-K dielectric material, or other polymer. Elastomer is used mainly for providing sufficient mechanical flexibility for the bonded structure. As can also be deduced from Equation (1) above, when a polymer layer is deposited over an IC chip 18, the stress generated by the chip and the structure bonded thereto can be absorbed or buffered to reduce local damage to the chip; this in turn enhances the reliability of the structure 10, especially the delicate circuits in the IC chip. According to the relationship set forth in Equation (1), the performance of this buffering effect is increased as the thickness of the polymer layer increases.

There is a generic problem associated with using a thick polymer layer. The RDL 12 shown in FIG. 1 is typically made of copper; it is intended to connect IC I/O pads 20 on the IC chip 18 to external circuitry. When deposited with solder bumps and/or provided with copper conductive post atop at pads 22, the RDL 12 can be bonded to the next level packaging structure firmly (e.g., a chip carrier). The RDL 12 escalates from a lower plane (i.e., the plane with the IC I/O pads 20) to a higher one (the top of the polymer) via a sloping ramp 22 defined by the polymer layer 14. The slope in the ramp 22 is desired for metal step coverage on the sidewall of the thick opening in the polymer layer 14. In practice, the slope of the ramp 22 could vary for each opening in the polymer layer 14, depending on the actual process conditions and inherent physical properties and characteristics of the polymer (e.g., wetting angle, which has to do with the surface energy of the materials). For example, in many cases the slope of the ramp 22 in the polymer layer 14 on the IC passivation layer 16 can be as low as about 45°. Consequently, the RDL 12 must necessarily translate by a significant amount of lateral displacement to extend from the IC I/O pad 20 to the top of the thick layer of polymer 14. Consequently, this lateral displacement necessitates the allowance of a significant amount of tolerance in the layout of the RDL 12. As a result of the tolerance allowance necessary to accommodate the varying slopes of ramps for different openings in the polymer layer 14 and the varying lateral displacements of RDLs, the pitch between adjacent contact structures (e.g., defined by solder bumps and/or copper posts) on the RDLs is limited, and the distances between the contact structures and the openings in the passivation layer are increased. This results in a post passivation structure that does not have fine pitch structures for the next level of packing structure. On the other hand, if a thick layer of polymer is not used, stress buffering would not be sufficient, leading to possible stress induced failure of the delicate circuits in the IC chip. Further, there would be insufficient lateral support to tall conductive posts, resulting in limited pitch of the I/O structures. It is desirable to have tall conductive posts, as they provide sufficient distance to reduce capacitance coupling between the I/O pads 22 and the electrical circuits in the IC chip 18.

The issues noted above collectively placed a limitation on reducing the pitch of the contact structures achievable on the post passivation structures, and thus also a limitation on increasing the scale of integration of ICs.

It is desirable to provide a WLP structure, and a process relating to same, that allows for both improved stress relief and fine pitch contact structures.

SUMMARY OF THE INVENTION

The present invention overcomes the drawbacks of the prior art, by providing post passivation structures and related processes that accommodate both stress relief and fine pitch contact structures. In accordance with the present invention, a pitch of <250 μm, and a pin count of >400 may be achieved for the IC packaging.

In one aspect, the present invention provides a post passivation rerouting support structure that comprises a relatively thin support layer (e.g., a polymer layer) above the passivation layer to support fine pitch rerouting structures, and in addition a relatively thick support layer (e.g., a polymer layer) for the fine pitch rerouting structures for next level packaging structure.

To achieve the abovementioned objectives, the present invention proposes a circuit structure and a fabrication method thereof. The circuit structure of the present invention comprises: a substrate; a first metallic post, formed on the substrate, and 20 to 300 microns high with the ratio of the maximum horizontal dimension thereof to the height thereof less than 4; and a second metallic post, formed on the substrate, and 20 to 300 microns high with the ratio of the maximum horizontal dimension thereof to the height thereof less than 4, wherein the distance between the center of the first metallic post to the center of the second metallic post is 10 to 250 microns.

To achieve the abovementioned objectives, the present invention proposes a circuit structure and a fabrication method thereof. The circuit structure of the present invention comprises: a semiconductor substrate; a first metallic post, formed on the semiconductor substrate, and 20 to 300 microns high with the ratio of the maximum horizontal dimension thereof to the height thereof less than 4; a second metallic post, formed on the semiconductor substrate, and 20 to 300 microns high with the ratio of the maximum horizontal dimension thereof to the height thereof less than 4; an insulation layer, formed on the semiconductor substrate, and covering the first and second metallic posts; a first bump, formed on the first metallic post or the insulation layer; and a second bump, formed on the second post or the insulation layer, wherein the distance between the center of the first bump and the center of the second bump is 10 to 250 microns.

To achieve the abovementioned objectives, the present invention proposes a circuit structure and a fabrication method thereof. The circuit structure of the present invention comprises: a semiconductor substrate; a first metallic post, formed on the semiconductor substrate, and 20 to 300 microns high with the ratio of the maximum horizontal dimension thereof to the height thereof less than 4; a second metallic post, formed on the semiconductor substrate, and 20 to 300 microns high with the ratio of the maximum horizontal dimension thereof to the height thereof less than 4; and a metallic wire, interconnecting the top of the first metallic post and the top of the second metallic post, wherein the material of the metallic wire includes gold.

To achieve the abovementioned objectives, the present invention proposes a circuit structure and a fabrication method thereof. The circuit structure of the present invention comprises: a semiconductor substrate; a first metallic post, formed on the semiconductor substrate, and 20 to 300 microns high with the ratio of the maximum horizontal dimension thereof to the height thereof less than 4; a second metallic post, formed on the semiconductor substrate, and 20 to 300 microns high with the ratio of the maximum horizontal dimension thereof to the height thereof less than 4; a metallic wire, interconnecting the top of the first metallic post and the top of the second metallic post; and a polymer layer, formed on the metallic circuit.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4, wherein a conductive wire can be connected to the metallic post or the semiconductor substrate with a wire-bonding method.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; and a polymer layer, formed on the semiconductor substrate, and covering the metallic post, wherein a bump 10~150 microns high can be formed on the metallic post or the insulation layer.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; a polymer layer, formed on the semiconductor substrate, and covering the metallic post; and a metallic coil, formed on the polymer layer, and 1 to 15 microns thick.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; and a bump, formed on the metallic post or the semiconductor substrate, wherein the bump may be a 10 to 30 microns thick golden layer.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; and a bump, formed on the metallic post or the semiconductor substrate, wherein the bump may be a titanium-containing metallic layer.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; and a bump, formed on the metallic post or the semiconductor substrate, wherein the bump may be a chromium-containing metallic layer.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; and a bump, formed on the metallic post or the semiconductor substrate, wherein the bump may be a tantalum-containing metallic layer.

To achieve the abovementioned objectives, the present invention proposes a circuit structure and a fabrication method thereof. The circuit structure of the present invention comprises: a semiconductor substrate; a metallic post, formed on the semiconductor substrate, and 20 to 300 microns high with the ratio of the maximum horizontal dimension thereof to the height thereof less than 4; a first polymer layer, formed on the semiconductor layer, and covering the metallic post; a substrate; a bump, formed between the metallic post and the substrate or formed between the first polymer layer and the substrate; and a second polymer layer, formed between the substrate and the semiconductor substrate, and covering the bump.

To enable the objectives, technical contents, characteristics and accomplishments of the present invention to be more easily understood, the embodiments of the present invention are to be described in detail in cooperation with the attached drawings.

DETAILED DESCRIPTION OF THE INVENTION

The present invention pertains to a circuit structure and a fabrication method thereof, wherein multiple metallic posts are formed on a semiconductor substrate, and the spacing between the neighboring metallic posts is reduced to less than 250 µm. Below, several embodiments are used to exemplify the present invention.

Embodiment 1

Figure 1:
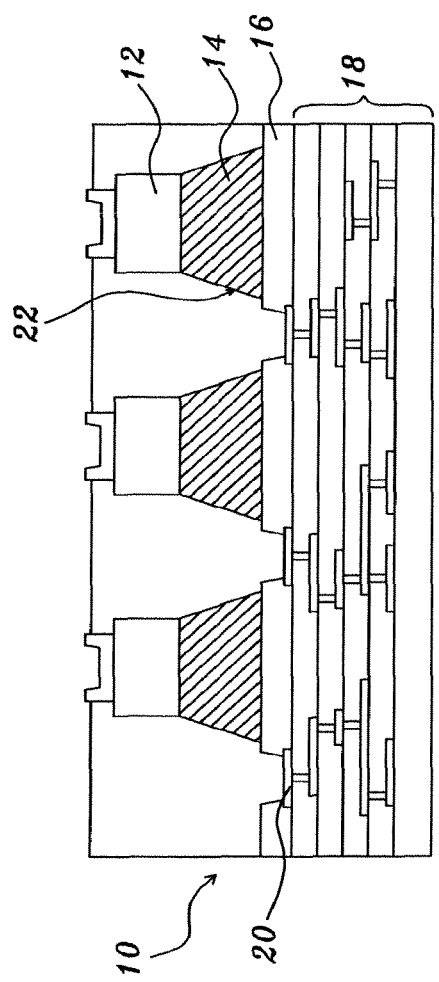
FIG. 1 is a sectional view schematically showing a conventional technology.
Figure 2:
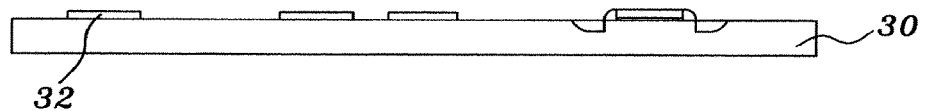
FIG. 2 is a sectional view schematically showing a semiconductor substrate according to the present invention.

Refer to FIG. 2. Firstly, a semiconductor substrate 30 is provided, and the semiconductor substrate 30 may be Si substrate, GaAs substrate, GeSi substrate or SOI (silicon-on-insulator) substrate. In Embodiment 1, the semiconductor substrate 30 is a circular semiconductor wafer. The semiconductor substrate 30 has an active surface having multiple electronic elements 32, which are formed via doping trivalent or pentavalent ions, such as boron ions or phosphorus ions. The electronic elements 32 may be MOS transistors, MOS devices, p-channel MOS devices, n-channel MOS devices, BiCMOS devices, Bipolar Junction Transistors, diffusion areas, resistors, capacitors, or CMOS devices.

Figure 3:
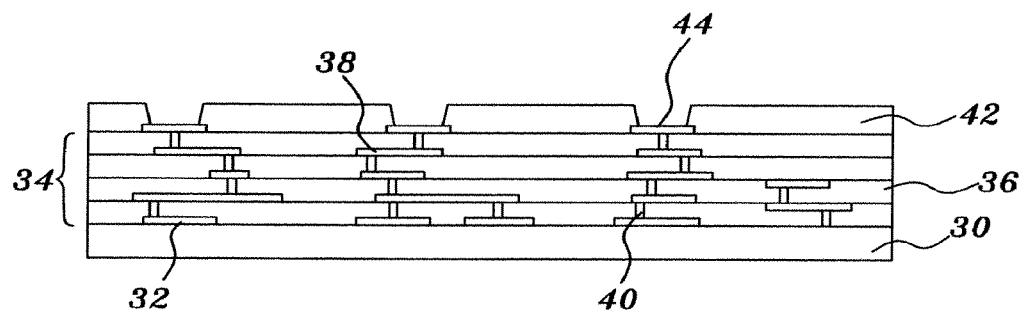
FIG. 3 is a sectional view schematically showing that a minute connection structure and a passivation layer are formed the semiconductor substrate according to the present invention.

Refer to FIG. 3. A fine-line connection structure 34 is formed on the active surface. The fine-line connection structure 34 comprises multiple thin-film insulating layers 36 having a thickness less than 3 µm and multiple thin-film circuit layers 38 also having a thickness less than 3 µm. The thin-film circuit layers 38 are made of a copper material or an aluminum material. The thin-film insulating layers 36 are usually formed with a CVD (Chemical Vapor Deposition) method. The material of the thin-film insulating layers 36 may be silicon oxide, TEOS (Tetraethoxysilane), SiwCxOyHz, compound of silicon and nitrogen/compound of silicon, nitrogen and oxygen, SOG (Spin-On Glass), FSG (Fluoro-Silicate Glass), SiLK, black diamond, polyarylene ether, PBO (Polybenzoxazole), or porous silicon oxide. The dielectric constant of the thin-film insulating layers 36 may be lower than 3.

When a damascene process is used to form one of multiple thin-film circuit layers 38 over the semiconductor substrate 30, a diffusion-barrier layer is firstly sputtered on the upper surface of one of the thin-film insulating layers 36 and on the bottoms and the lateral walls of the openings in said one of the thin-film insulating layers 36; next, a seed layer, such as a copper seed layer, is sputtered on the diffusion-barrier layer; next, a copper layer is electroplated on the seed layer; and then, the electroplated copper layer, seed layer and diffusion-barrier layer outside the openings in said one of the thin-film insulating layers 36 are removed with a chemical mechanical polishing method until the upper surface of said one of the thin-film insulating layers 36 is exposed. In another method to form one of multiple thin-film circuit layers 38 over the semiconductor substrate 30, an aluminum layer or an aluminum alloy layer is sputtered on one of the thin-film insulating layers 36; and then, the aluminum layer or the aluminum alloy layer is patterned with a photolithographic process and an etching process. The thin-film circuit layers 38 can be interconnected or connected to the electronic elements 32 via the conductive vias in the thin-film insulating layers 36. The thickness of one of the thin-film circuit layers 38 is generally 0.1~0.55 m. The thin-film circuit layers 38 are fabricated with a 5× stepper or 5× scanner or other superior equipment in the step of a photolithographic process.

Next, a passivation layer 42 is formed over the semiconductor substrate 30 with a CVD method. Multiple contact pads 44 are respectively exposed by openings in the passivation layer 42. The passivation layer 42 can protect the electronic elements 32 on the semiconductor substrate 30 from foreign ion contamination. The passivation layer 42 can retard the penetration of mobile ions (such as sodium ions), moisture, transition metals (such as gold, silver, and copper) and impurities. Thereby, the passivation layer 42 can protect the thin-film circuit layers 38, the thin-film insulating layers 36 and the underlying electronic elements 32 including: transistors, polysilicon resistors, polysilicon-polysilicon capacitors. The passivation layer 42 is usually composed of silicon oxide, compounds of silicon and oxygen, silicate and phosphate glass, silicon nitride, or silicon oxy-nitride, etc. Below, ten methods for depositing the passivation layer 42 are to be introduced.

Method 1

A silicon oxide layer with a thickness of between 0.2 and 1.2 μm is formed with a CVD method; and next, a silicon nitride layer with a thickness of between 0.2 and 1.2 μm is formed on the silicon oxide with a CVD method.

Method 2

A silicon oxide layer with a thickness of between 0.2 and 1.2 μm is formed with a CVD method; next, a silicon oxy-nitride layer with a thickness of between 0.05 and 0.15 μm is formed on the silicon oxide with a plasma-enhanced CVD method; and next, a silicon nitride layer with a thickness of between 0.2 and 1.2 μm is formed on the silicon oxy-nitride layer with a CVD method.

Method 3

A silicon oxy-nitride layer with a thickness of between 0.05 and 0.15 μm is formed with a CVD method; next, a silicon oxide layer with a thickness of between 0.2 and 1.2 μm is formed on the silicon oxy-nitride layer with a CVD method; and next, a silicon nitride layer with a thickness of between 0.2 and 1.2 μm is formed on the silicon oxide layer with a CVD method.

Method 4

A first silicon oxide layer with a thickness of between 0.2 and 0.5 μm is formed with a CVD method; next, a second silicon oxide layer with a thickness of between 0.5 and 1 μm is formed on the first silicon oxide layer with a spin-coating method; next, a third silicon oxide layer with a thickness of between 0.2 and 0.5 μm is formed on the second silicon oxide layer with a CVD method; and next, a silicon nitride layer with a thickness of between 0.2 and 1.2 μm is formed on the third silicon oxide layer with a CVD method.

Method 5

A silicon oxide layer with a thickness of between 0.5 and 2 μm is formed with a HDP-CVD (High Density Plasma-Chemical Vapor Deposition) method; and next, a silicon nitride layer with a thickness of between 0.2 and 1.2 μm is formed on the silicon oxide layer with a CVD method.

Method 6

A USG (Undoped Silicate Glass) layer with a thickness of between 0.2 and 3 μm is firstly formed; next, an insulating layer with a thickness of between 0.5 and 3 μm, such as TEOS, BPSG (Borophosphosilicate Glass) or PSG (Borophosphosilicate Glass), is formed on the USG layer; and next, a silicon nitride layer with a thickness of between 0.2 and 1.2 μm is formed on the insulating layer with a CVD method.

Method 7

A first silicon oxy-nitride layer with a thickness of between 0.05 and 0.15 μm is optionally formed with a CVD method; next, a silicon oxide layer with a thickness of between 0.2 and 1.2 μm is formed on the first silicon oxy-nitride layer with a CVD method; next, a second silicon oxy-nitride layer with a thickness of between 0.05 and 0.15 μm is optionally formed on the silicon oxide layer with a CVD method; next, a silicon nitride layer with a thickness of between 0.2 and 1.2 μm is formed on the second silicon oxy-nitride layer or on the silicon oxide layer with a CVD method; next, a third silicon oxy-nitride layer with a thickness of between 0.05 and 0.15 μm is optionally formed on the silicon nitride layer with a CVD method; and next, a silicon oxide layer with a thickness of between 0.2 and 1.2 μm is formed on the third silicon oxy-nitride layer or on the silicon nitride layer with a CVD method.

Method 8

A first silicon oxide layer with a thickness of between 0.2 and 1.2 μm is formed with a PECVD (Plasma Enhanced Chemical Vapor Deposition) method; next, a second silicon oxide layer with a thickness of between 0.5 and 1 μm is formed on the first silicon oxide layer with a spin-coating method; next, a third silicon oxide layer with a thickness of between 0.2 and 1.2 μm is formed on the second silicon oxide layer with a CVD method; next, a silicon nitride layer with a thickness of between 0.2 and 1.2 μm is formed on the third silicon oxide layer with a CVD method; and next, a fourth silicon oxide layer with a thickness of between 0.2 and 1.2 μm is formed on the silicon nitride layer with a CVD method.

Method 9

A first silicon oxide layer with a thickness of between 0.5 and 2 μm is formed with a HDP-CVD method; next, a silicon nitride layer with a thickness of between 0.2 and 1.2 μm is formed on the first silicon oxide layer with a CVD method; and next, a second silicon oxide layer with a thickness of between 0.5 and 2 μm is formed on the silicon nitride layer with a HDP-CVD method.

Method 10

A first silicon nitride layer with a thickness of between 0.2 and 1.2 μm is formed with a CVD method; next, a silicon oxide layer with a thickness of between 0.2 and 1.2 μm is formed on the first silicon nitride layer with a CVD method; and next, a second silicon nitride layer with a thickness of between 0.2 and 1.2 μm is formed on the silicon oxide layer with a CVD method.

The thickness of the passivation layer 42 is generally more than 0.35 μm, and the thickness of the silicon nitride layer is generally more than 0.3 μm under an optimal condition.

Figure 4A:
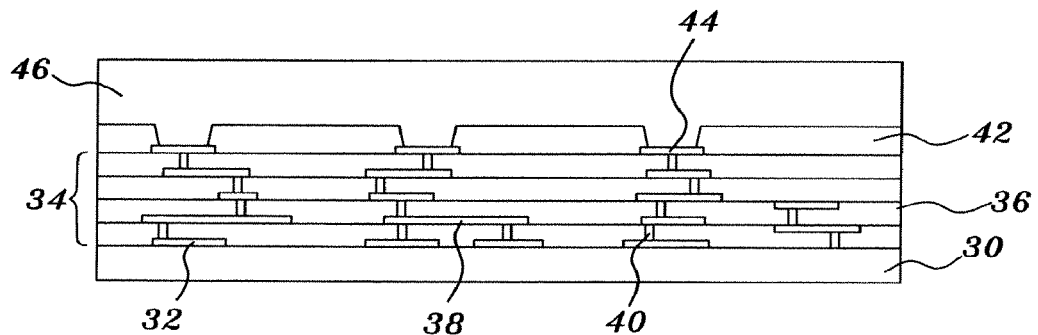
FIG. 4a and FIG. 4b are sectional views schematically showing the fabrication procedures of a first polymer layer according to the present invention.
Figure 4B:
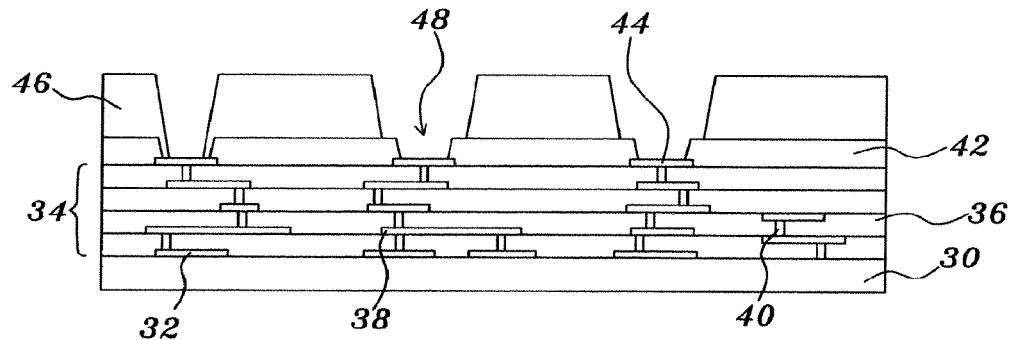

Refer to FIG. 4a. After the passivation layer 42 has been completed, a first polymer layer 46 with a thickness of between 3 and 50 μm is formed on the passivation layer 42 and used for insulating. The material of the first polymer layer 46 is thermoplastic, thermosetting plastic, polyimide, BCB (Benzo-Cyclo-Butene), polyurethane, epoxy, parylene-based polymer, solder-mask material, elastic material, or porous dielectric material. The method of forming the first polymer layer 46 includes spin-coating an oligomer film on the passivation layer 42. Refer to FIG. 4b. Next, the spun-on oligomer layer 46 with a photosensitive material is patterned with a photolithography method to form multiple openings 48 in the oligomer layer 46 exposing the contact pads 44 on the semiconductor substrate 30. It is to be noted: when the first polymer layer 46 is made of a photosensitive material, it can be patterned with a photolithographic process; when the first polymer layer 46 is made of a non-photosensitive material, it can be patterned with a photolithographic process and an etching process.

Next, the patterned oligomer layer 46 is cured via heating it to the temperature of 200~320° C. with a baking method, a microwave heating method, or an infrared heating method or to the temperature of 320~450° C. The cured first polymer layer 46 has a dimensional shrinkage and a moisture content less than 1%, which is determined via that the weight variation is less than 1% when the first polymer layer 46 is placed at the temperature of 425~450° C. Alternatively, the method of forming the first polymer layer 46 includes: laminating a dry film with a photosensitive material on the passivation layer 42 with a heat-pressing method and then forming openings in the dry film using a photolithography method; or screen-printing an oligomer film on the passivation layer 42 with multiple openings in the oligomer film exposing the contact pads 44, and then curing the oligomer film using a heating process.

Figure 5A:
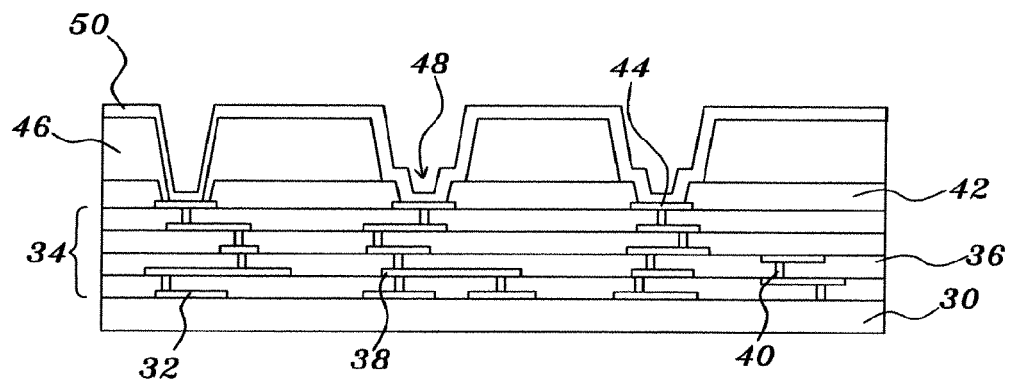
FIG. 5a is a sectional view schematically showing the fabrication procedures of a first adhesion/barrier/seed layer according to the present invention.

Refer to FIG. 5. A first adhesion/barrier layer 50 with a thickness of between 400 and 7000 Å is formed on the first polymer layer 46 and the contact pads 44 with a sputtering method. The material of the first adhesion/barrier layer 50 is titanium metal, titanium nitride, titanium-tungsten alloy, chromium metal, chromium-copper alloy, tantalum metal, or tantalum nitride. Alternatively, the first adhesion/barrier layer 50 may be a composite of the above-mentioned materials. Next, A seed layer (not shown) with a thickness of between 500 and 5000 angstroms may be formed on the first adhesion/barrier layer 50 using a sputtering process. The seed layer is used to benefit the formation of the succeeding metallic wires; therefore, the material of the seed layer varies with the material to be used by the succeeding metallic wires.

When a copper metallic wire is to be electroplated on the seed layer, copper is a preferable material to the seed layer. When a silver metallic wire is to be electroplated on the seed layer, silver is a preferable material to the seed layer. When a palladium metallic wire is to be electroplated on the seed layer, palladium is a preferable material to the seed layer. When a platinum metallic wire is to be electroplated on the seed layer, platinum is a preferable material to the seed layer. When a rhodium metallic wire is to be electroplated on the seed layer, rhodium is a preferable material to the seed layer. When a ruthenium metallic wire is to be electroplated on the seed layer, ruthenium is a preferable material to the seed layer. When a rhenium metallic wire is to be electroplated on the seed layer, rhenium is a preferable material to the seed layer. When a nickel metallic wire is to be electroplated on the seed layer, nickel is a preferable material to the seed layer.

Figure 6A:
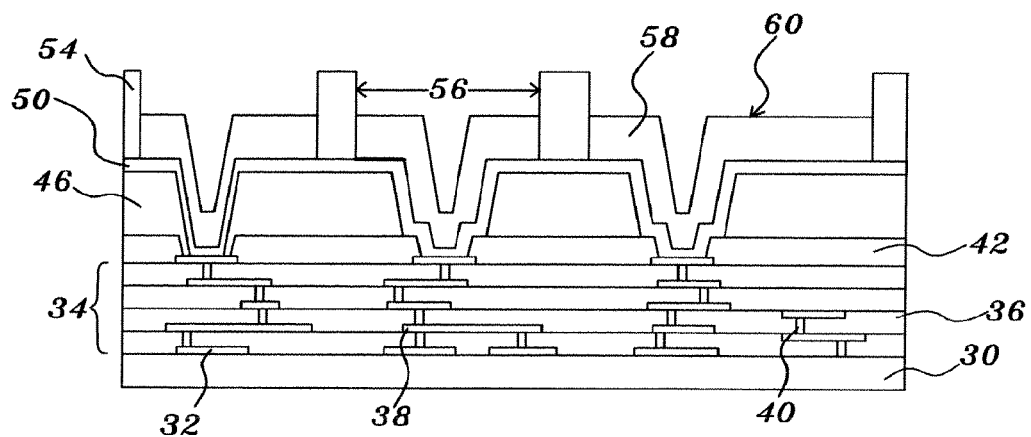
FIG. 6a to FIG. 6e are sectional views schematically showing the fabrication procedures of a first RDL and metallic posts according to the present invention.

Refer to FIG. 6*a*. Next, a first patterned photoresist layer 54 is formed on the seed layer on the first adhesion/barrier layer 50. Multiple openings 56 is formed in the first patterned photoresist layer 54 with a 1× stepper or 1× scanner. The first patterned photoresist layer 54 is a positive photoresist, for example. The openings 56 expose the seed layer on the first adhesion/barrier layer 50. Next, a first metallic layer 58 with a thickness of between 1 and 50 μm is electroplated on the seed layer 50 formed on the first adhesion/barrier layer 50 and exposed by the openings 56, and the thickness of the first metallic layer 58 is preferred to be 2~30 μm. Thereby, the first metallic layer 58 is electrically connected to the thin-film circuit layers 34. The first metallic layer 58 may be a single layer of gold, copper, silver, palladium, platinum, rhodium, ruthenium, rhenium, or nickel. Alternatively, the first metallic layer 58 may be a composite of the above-mentioned materials. Next, the first patterned photoresist layer 54 is removed. The first metallic layer 58 is not only simply formed inside the openings 48 but also extended to some portions over the first polymer layer 46. The extended first metallic layer 58 can benefit the formation of the succeeding metal posts.

Figure 6B:
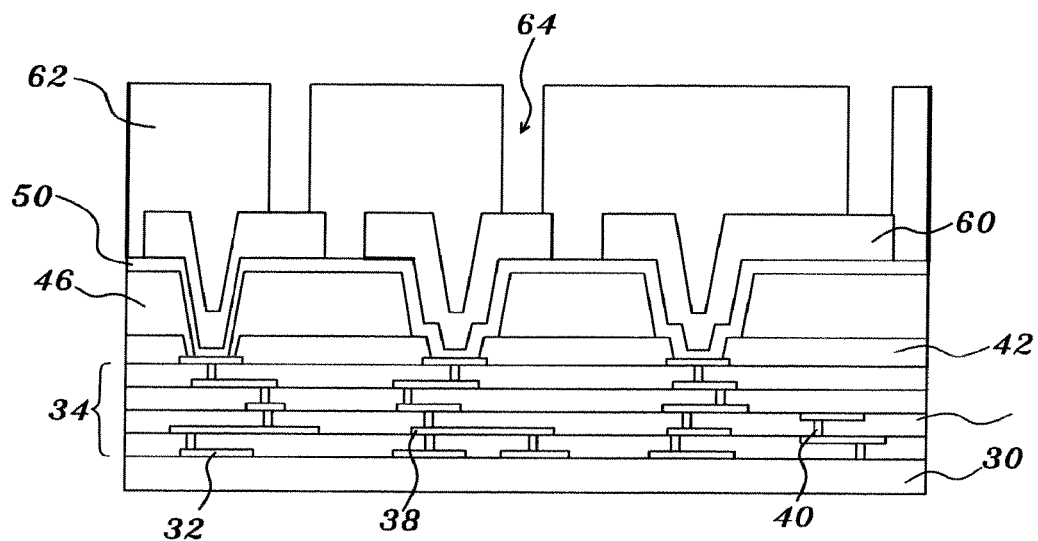
Figure 6C:
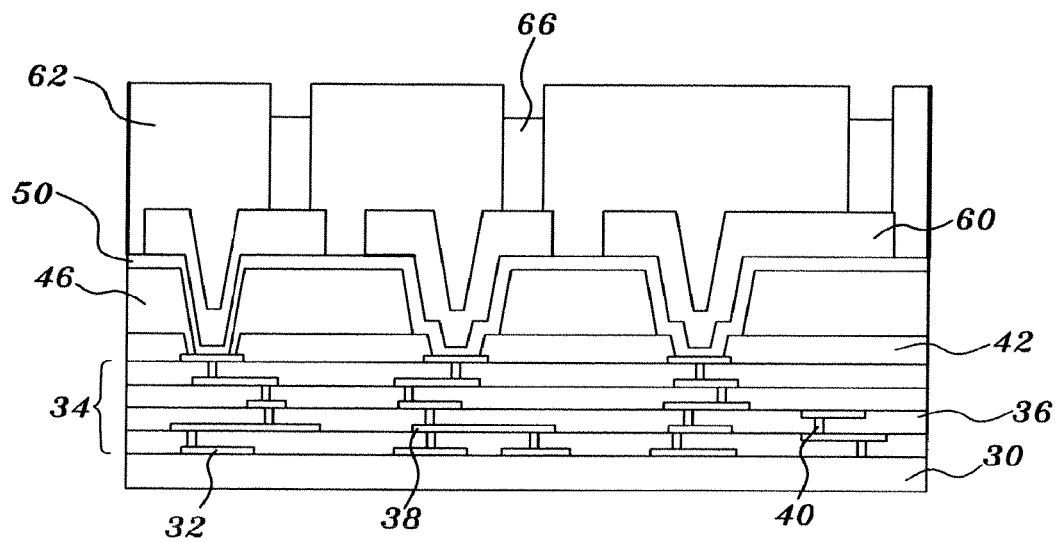

Next, as shown in FIG. 6*b*, a second patterned photoresist layer 62 is formed on the first metallic layer 58 and the seed layer on the adhesion/barrier layer 50. Multiple openings 64 in the second patterned photoresist layer 62 expose the first metallic layer 58. Next, as shown in FIG. 6*c*, a second metallic layer 66 with a thickness of between 20 and 200 μm is formed on the first metallic layer 58 exposed by the openings 64 via electroplating, and the maximum horizontal dimension of each metal post 66 ranges from 3 to 50 μm. The second metallic layer 66 serves as metal posts. The material of the second metallic layer 66 may be a single metal layer of gold, copper, silver, palladium, platinum, rhodium, ruthenium, rhenium, or nickel. Alternatively, the second metallic layer 66 may be a composite of the above-mentioned materials. The thickness of the second metallic layer 66 is preferred to be 30 to 100 microns.

When a second metallic layer 66 of copper is to be electroplated on the first metallic layer 58, copper is a preferable material to the topmost layer of the first metallic layer 58. When a second metallic layer 66 of silver is to be electroplated on the first metallic layer 58, silver is a preferable material to the topmost layer of the first metallic layer 58. When a second metallic layer 66 of palladium is to be electroplated on the first metallic layer 58, palladium is a preferable material to the topmost layer of the first metallic layer 58. When a second metallic layer 66 of platinum is to be electroplated on the first metallic layer 58, platinum is a preferable material to the topmost layer of the first metallic layer 58. When a second metallic layer 66 of rhodium is to be electroplated on the first metallic layer 58, rhodium is a preferable material to the topmost layer of the first metallic layer 58. When a second metallic layer 66 of ruthenium is to be electroplated on the first metallic layer 58, ruthenium is a preferable material to the topmost layer of the first metallic layer 58. When a second metallic layer 66 of rhenium is to be electroplated on the first metallic layer 58, rhenium is a preferable material to the topmost layer of the first metallic layer 58. When a second metallic layer 66 of nickel is to be electroplated on the first metallic layer 58, nickel is a preferable material to the topmost layer of the first metallic layer 58.

Figure 6D:
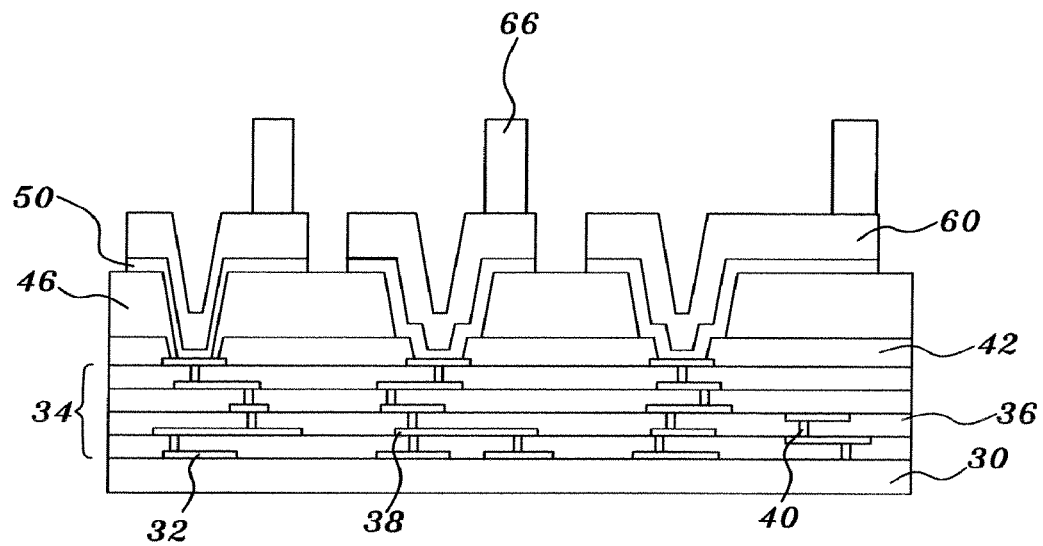
Figure 6E:
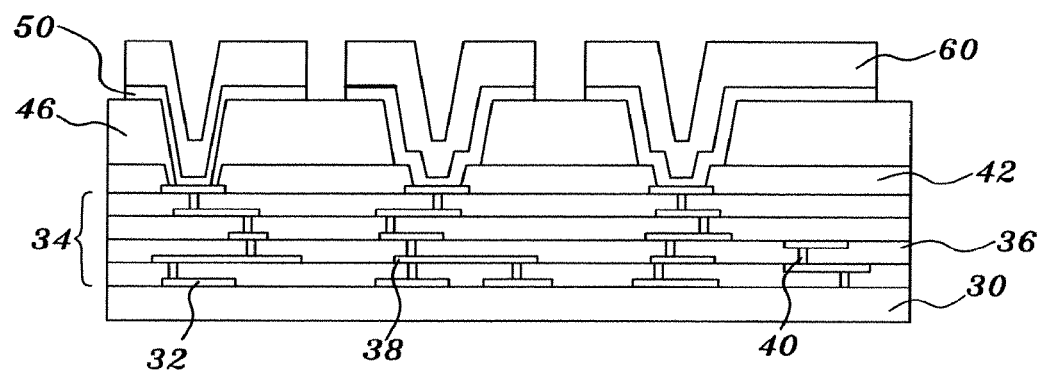

Next, as shown in FIG. 6*d*, the second patterned photoresist layer 62 is removed; next, the seed layer and the first adhesion/barrier layer 50 not under the first metallic layer 58 are subsequently removed using an etching process. If the first adhesion/barrier layer 50 is titanium tungsten alloy, the etchant for etching the first adhesion/barrier layer 50 can be hydrogen peroxide. If the seed layer is gold, the etchant for etching the seed layer is potassium iodide. As shown in FIG. 6*e*, the step of removing the seed layer and the first adhesion/barrier layer 50 not under the first metallic layer 58 may be undertaken before forming the metal Posts 68.

Figure 7A:
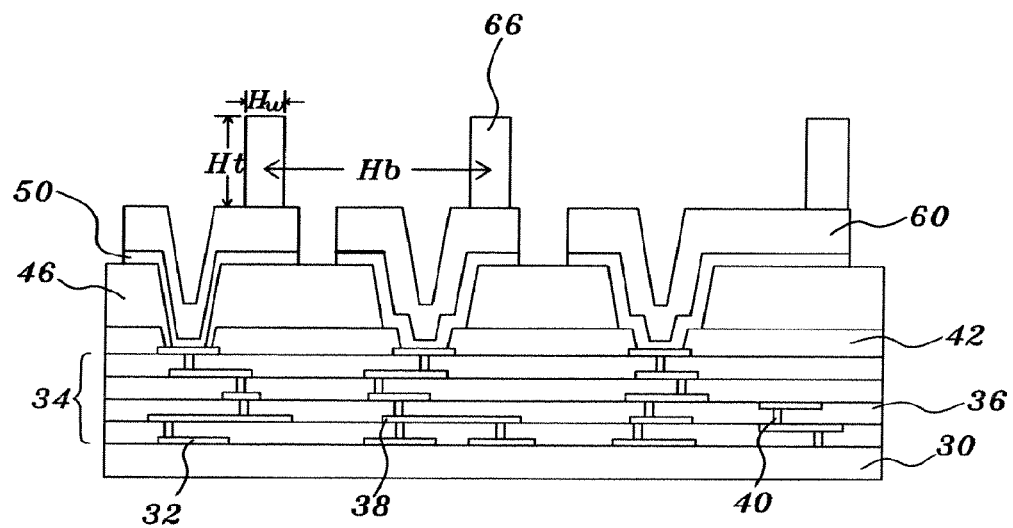
FIG. 7a and FIG. 7b are respectively a sectional view schematically showing the parameters of the metallic posts and a top view schematically showing the metallic posts according to the present invention.
Figure 7B:
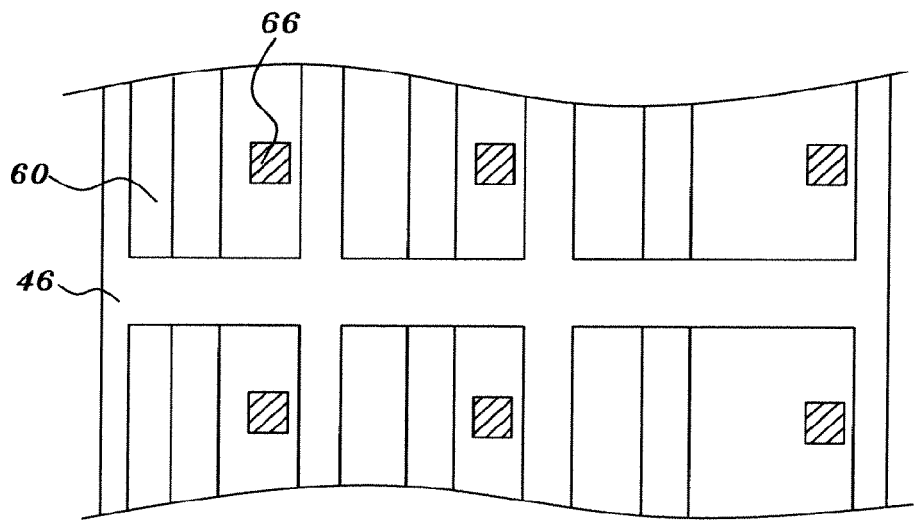

As shown in FIG. 7*a* and FIG. 7*b*, The ratio of the maximum horizontal dimension Hw of the metallic post 66 to the height Ht of the metallic post 66 is less than 4, and the ratio may also be less than 3, 2 or 1. The maximum horizontal dimension of the metallic post 68 is within 3~50 microns; therefore, the metallic post 66 is a fine post, which is distinct from the conventional technology. The pitch Hb between the centers of the neighboring metallic posts 68 is 10~250 microns, and the preferable spacing Hb is 10~200 microns, 10~175 microns, or 10~150 microns. FIG. 7*b* is a top view showing that the metallic Posts 68 are implemented with the redistribution layer 60 composed of the first adhesion/barrier layer 50 and the first metallic layer 58. From FIG. 7*b*, it can be observed that the metallic post 66 is not formed on the redistribution layer 60 over the openings 48 but formed on the redistribution layer 60 over the first polymer layer 46.

Figure 8A:
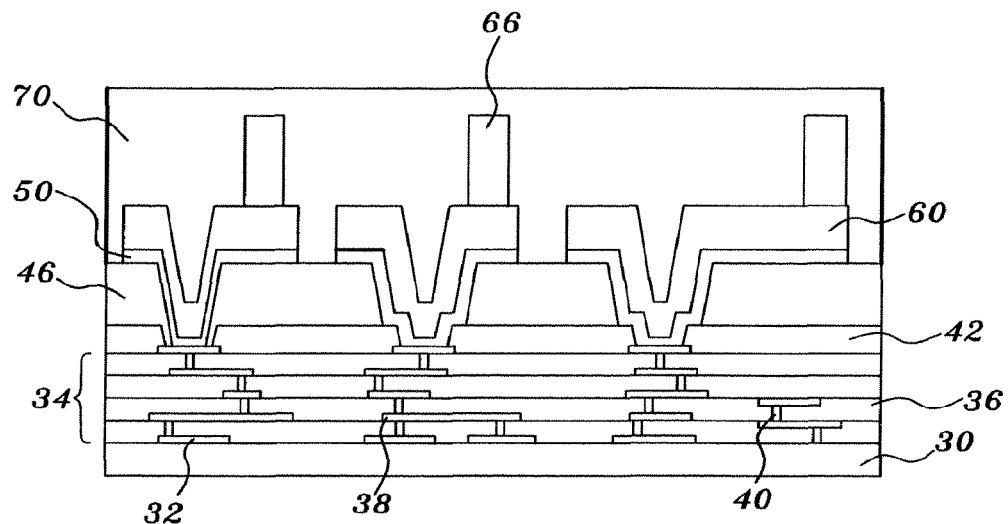
FIG. 8a is a sectional view schematically showing the fabrication procedures of a second polymer layer according to the present invention.
Figure 8B:
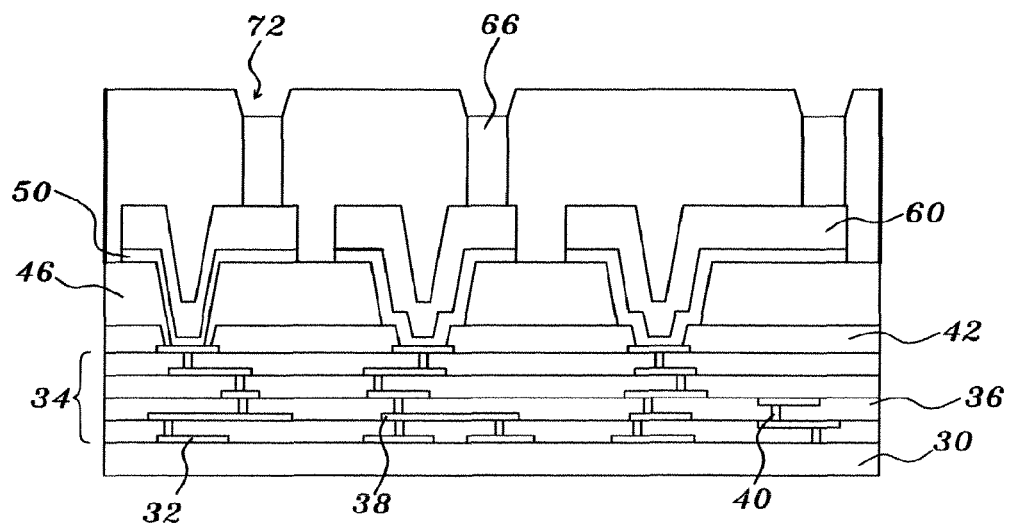
FIG. 8b is a sectional view schematically showing the fabrication procedures of the openings of the second polymer layer according to the present invention.
Figure 8C:
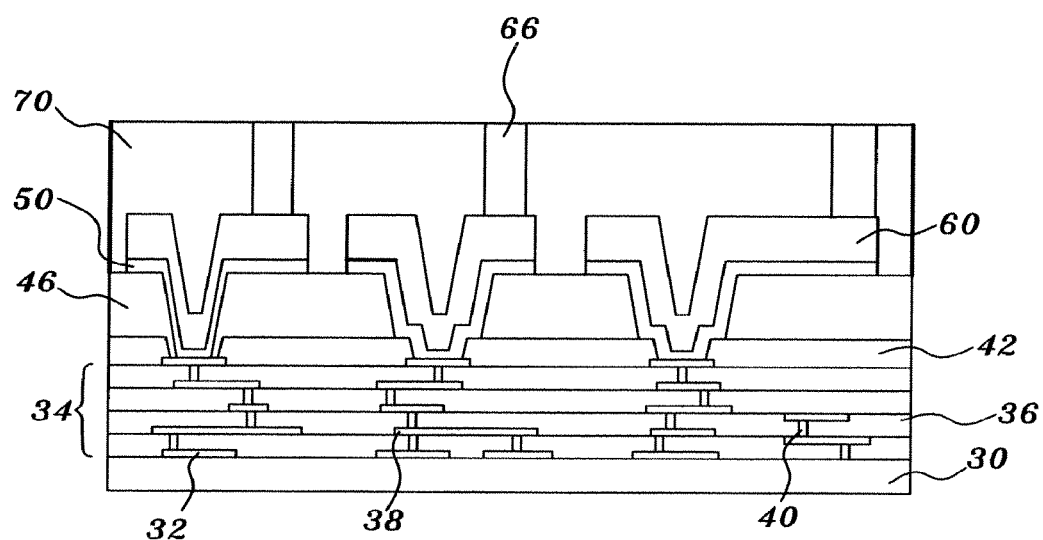
FIG. 8c is a sectional view schematically showing the procedure of polishing the second polymer layer according to the present invention.

Next, as shown in FIG. 8*a*, a second polymer layer 70 is formed over the semiconductor substrate 30 and covers the metallic Posts 68 and the redistribution layer 60. The material of the second polymer layer 70 may be thermoplastic, thermosetting plastic, polyimide, BCB (Benzo-Cyclo-Butene), polyurethane, epoxy, parylene polymer, solder-mask material, elastic material, or porous dielectric material. The methods of forming the second polymer layer 70 may include a screen-printing method or a spin-coating method. As shown in FIG. 8*b*, if the second polymer layer 70 is formed with a screen-printing method, multiple openings 72, whereby the top ends of the metallic Posts 68 are revealed, can be formed in the second polymer layer 70 just when screen printing the second polymer layer 70. If the second polymer layer 70 is formed with a spin-coating method, multiple openings 72, whereby the top ends of the metallic Posts 68 are revealed, must be fabricated with a patterning procedure, such as a photolithographic method or a photolithographic method plus an etching method. As shown in FIG. 8*c*, beside via the openings 72, the metallic Posts 68 may also be revealed via a polishing method. However, the second polymer layer 70 needs curing before the polishing procedure. After the second polymer layer 70 has been cured, a CMP (Chemical Mechanical Polishing) procedure or mechanical grinding to polish or grind the second polymer layer 70 is used to reveal the top ends of the metallic Posts 68. The curing procedure may also be undertaken with a baking method, a microwave heating method, or an infrared heating method under the temperature of between 200 and 320 degrees centigrade or between 320 and 400 degrees centigrade.

Here, it is to be stated beforehand that the structures of the following embodiments are predominantly the extensions of the structures shown in FIG. 8b and FIG. 8c, wherein the metallic Posts 68 has a fine pitch, and the spacing between the centers of the neighboring metallic Posts 68 is within 10~250 microns; the ratio of the maximum horizontal dimension of the metallic post 66 Hw to the height of the metallic post 66 Ht is less than 4. The first embodiment is based on the structure illustrated in FIG. 8c, and the succeeding embodiments are usually with respect to the variations of the metallic post 66.

Figure 9:
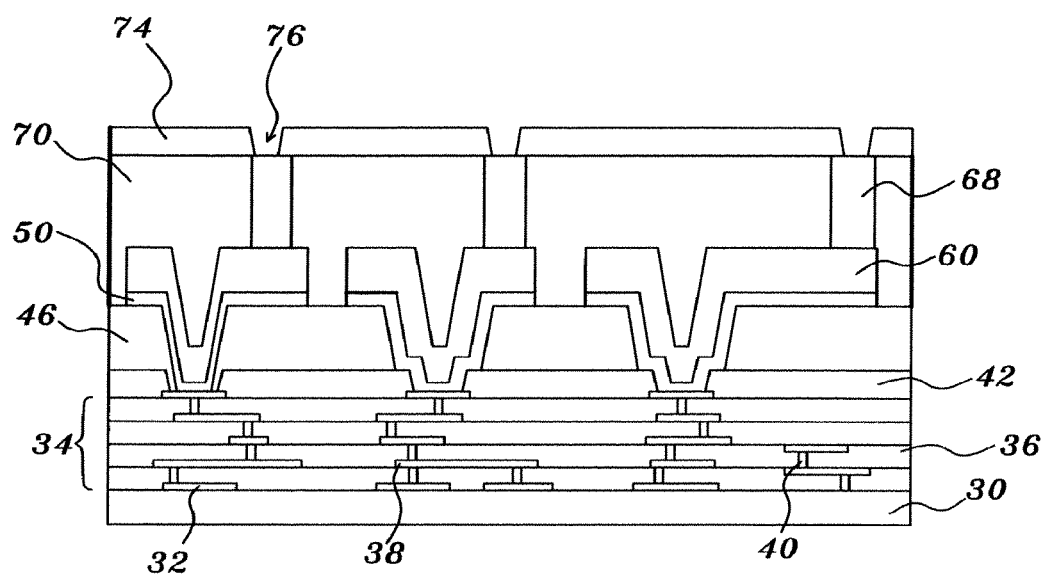
FIG. 9 is a sectional view schematically showing the fabrication procedures of a third polymer layer according to the present invention.

Next, as shown in FIG. 9, a third polymer layer 74 is formed on the second polymer layer 70 using a spin coating process. Multiple openings 76 are formed in the third polymer layer 74 with a patterning procedure, wherein the patterning procedure is undertaken with a photolithographic method or a photolithographic method plus an etching method. Alternatively, the method of forming the first polymer layer 46 includes: laminating a dry film with a photosensitive material on the passivation layer 42 with a heat-pressing method and then forming openings in the dry film using a photolithography method; or screen-printing an oligomer film on the passivation layer 42 with multiple openings in the oligomer film exposing the contact pads 44, and then curing the oligomer film using a heating process. The material of the third polymer layer 74 is thermoplastic, thermosetting plastic, polyimide, BCB (Benzo-Cyclo-Butene), polyurethane, epoxy, parylene-based polymer, solder-mask material, elastic material, or porous dielectric material. The metallic posts 68 have a same structure as the previous-mentioned metallic Posts 68. The process for forming the metallic posts 68 is the same as that for forming the previously mentioned metallic Posts 68.

Figure 10A:
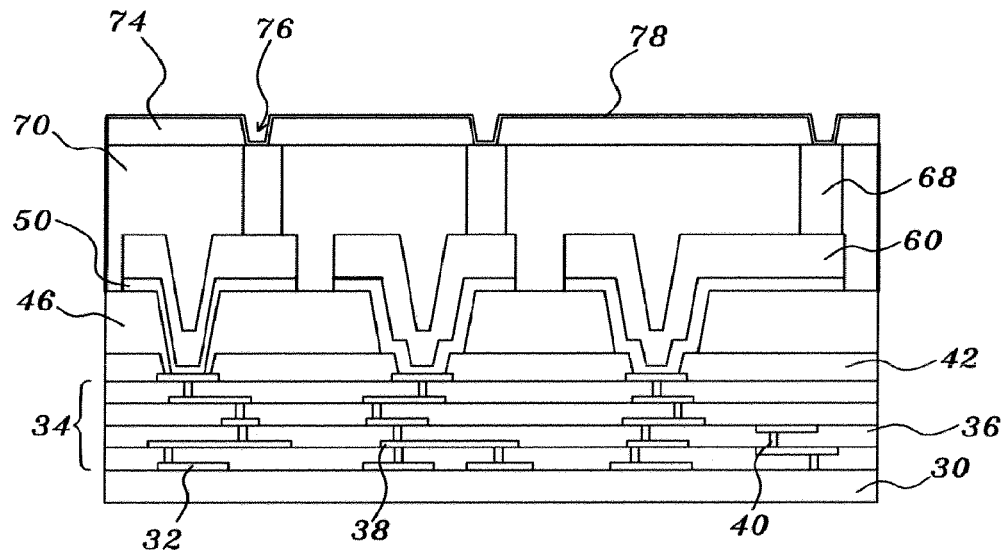
FIG. 10a to FIG. 10d are sectional views schematically showing the fabrication procedures of a third metallic layer according to the present invention.
Figure 10B:
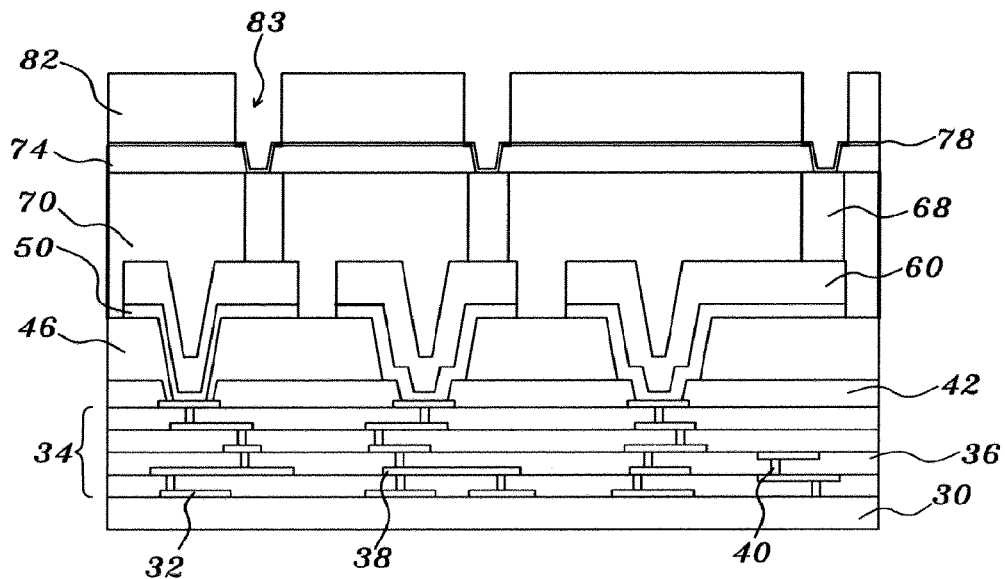

Next, as shown in FIG. 10a, a second adhesion/barrier layer with a thickness of between 400 and 7000 Å is formed on the third polymer layer 74 and the top ends of the metallic posts 68 with a sputtering method. The material of the second adhesion/barrier layer 78 is titanium metal, titanium nitride, titanium-tungsten alloy, chromium metal, chromium-copper alloy, tantalum metal, or tantalum nitride. Alternatively, the second adhesion/barrier layer 78 may also be a composite of the above-mentioned materials. Next, A seed layer (not shown), such as copper or gold, with a thickness of between 500 and 5000 angstroms may be formed on the second adhesion/barrier layer 78 using a sputtering process. Next, as shown in FIG. 10b, a third patterned photoresist layer 82 is formed on the seed layer on the second adhesion/barrier layer 78, wherein the third patterned photoresist layer 82 is a positive-type photoresist. Multiple openings 83 in the third patterned photoresist layer 82 expose the seed layer on the second adhesion/barrier layer 78 over the top ends of the metal posts 68.

Figure 10C:
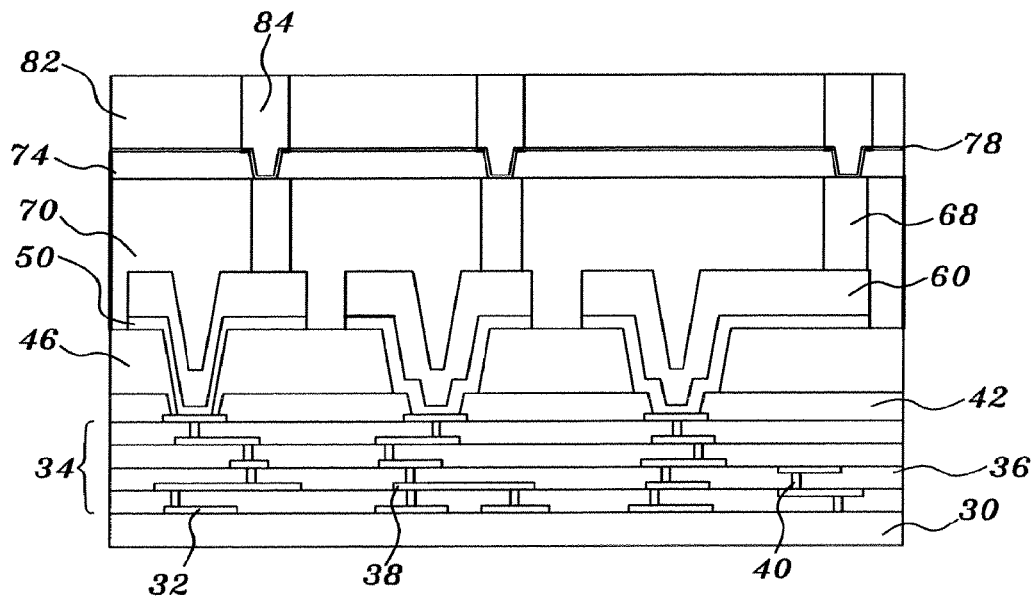
Figure 10D:
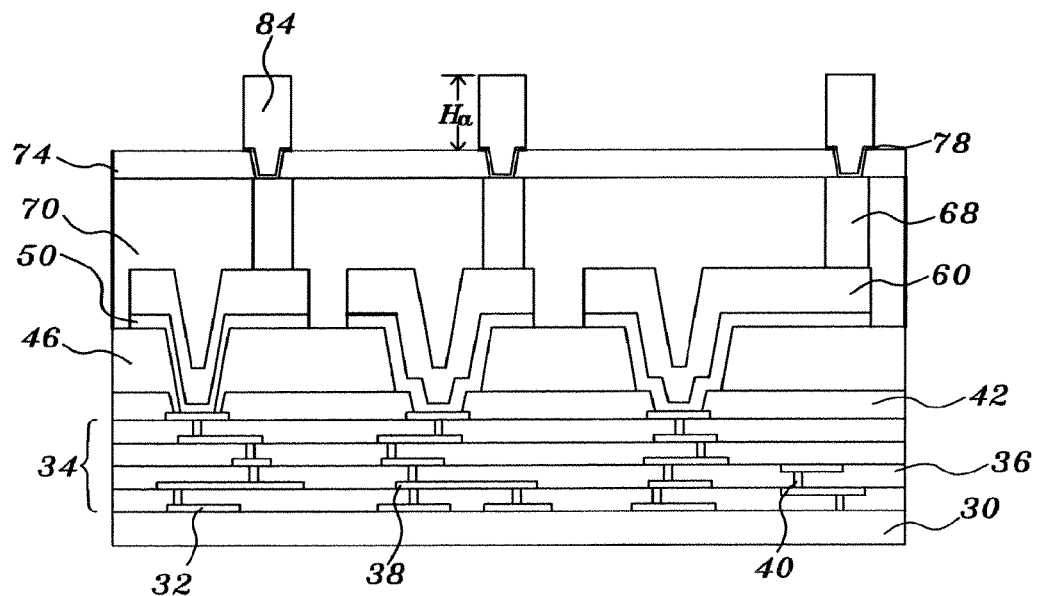

Next, as shown in FIG. 10c, a third metallic layer 84 is formed on the seed layer on the second adhesion/barrier layer 78 exposed by the openings 83 via electroplating. The third metallic layer 84 may be formed by electroplating a gold layer having a thickness of between 1 and 50 microns on the seed layer, made of gold, exposed by the openings 83. Other materials used to form the third metallic layer 84 may be silver, palladium, platinum, rhodium, ruthenium, or rhenium. Next, as shown in FIG. 10d, the third patterned photoresist layer 82 is removed; next, the seed layer and the underlying second adhesion/barrier layer 78 are subsequentially removed. If the second adhesion/barrier layer 78 is titanium tungsten alloy, the etchant for etching the second adhesion/barrier layer 78 can be hydrogen peroxide. If the seed layer is gold, the etchant for etching the seed layer is potassium iodide. It is to be noted that the thickness, material and position of the electroplated third metallic layer 84 is determined by which types of external devices or circuits are connected to the bumps or pads 84, i.e. the thickness of the third patterned photoresist layer 82, the width of the openings 83 and the position of the openings 83 vary according to the intended application. The abovementioned external circuit may be a flexible circuit board, a semiconductor chip, a printed circuit board, a ceramic substrate, or a glass substrate.

Figure 11:
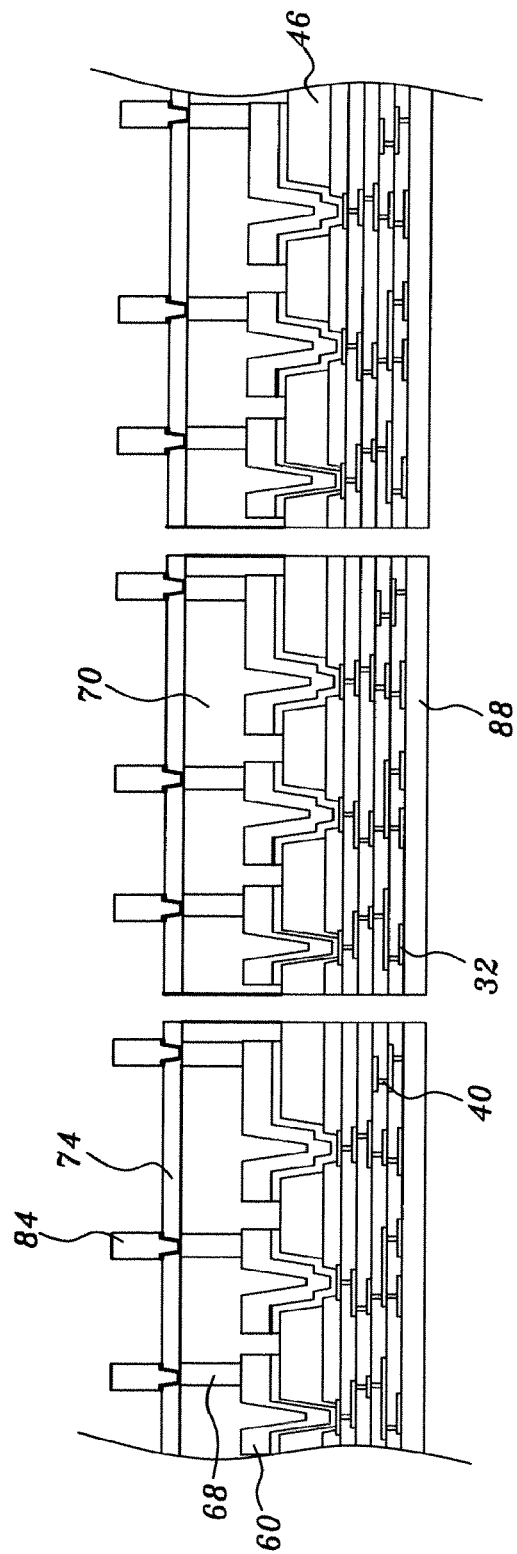
FIG. 11 is a sectional view schematically showing that the semiconductor substrate is diced according to the present invention.

In this embodiment, the third metallic layer 84 may be presented in the form of bumps, contact pads, RDL's, or solder balls. As shown in FIG. 10d, when the third metallic layer 84 is a single layer of gold, copper, silver, palladium, platinum, rhodium, ruthenium, or rhenium, and when the thickness Ha of the third metallic layer 84 is 5~30 microns and preferably is 10~25 microns, the third metallic layer 84 is defined to be a bump 86. Next, as shown in FIG. 11, the semiconductor substrate 30 is diced into multiple semiconductor units 88. The bumps 86 on the semiconductor unit 88 can be electrically connected to an external circuit with ACF (Anisotropic Conductive Film).

Figure 12A:
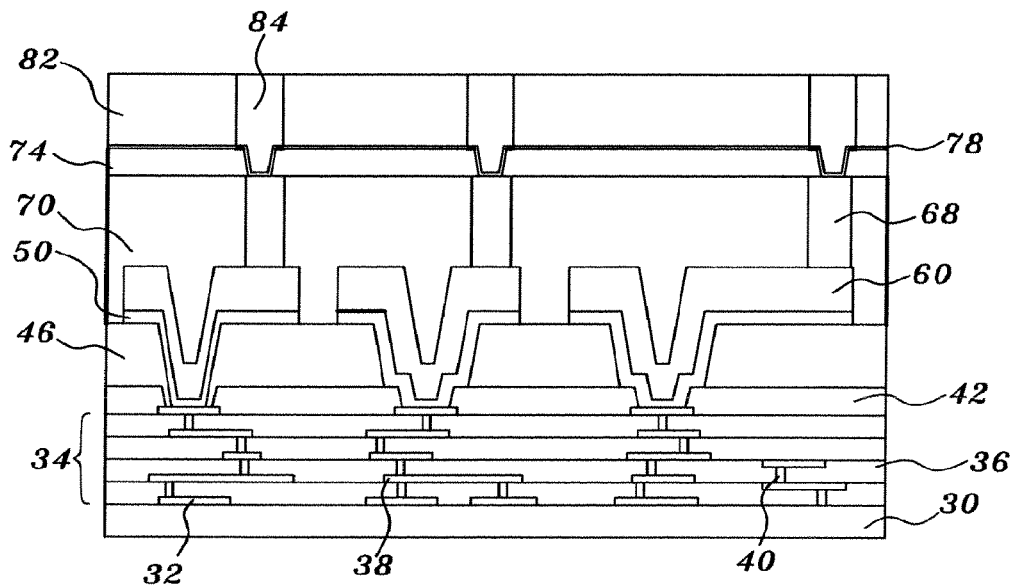
FIG. 12a to FIG. 12c are sectional views schematically showing the fabrication procedures of solder balls according to the present invention.
Figure 12B:
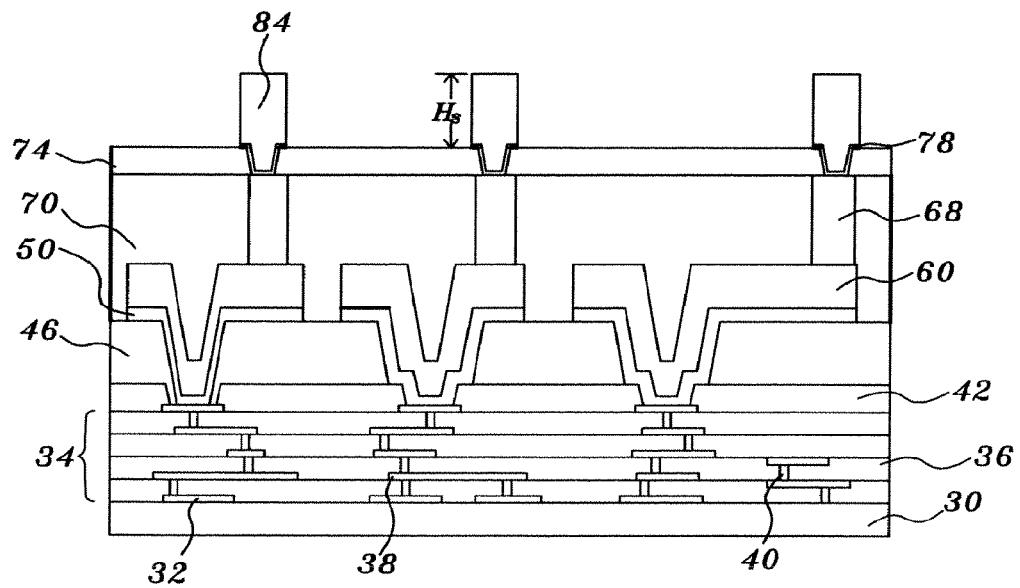
Figure 12C:
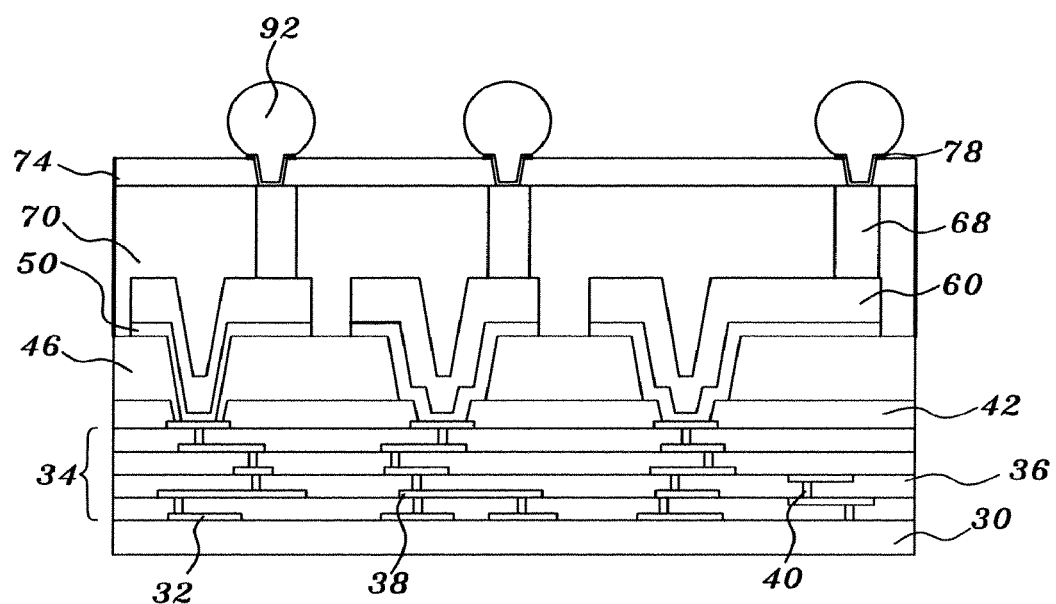
Figure 12D:
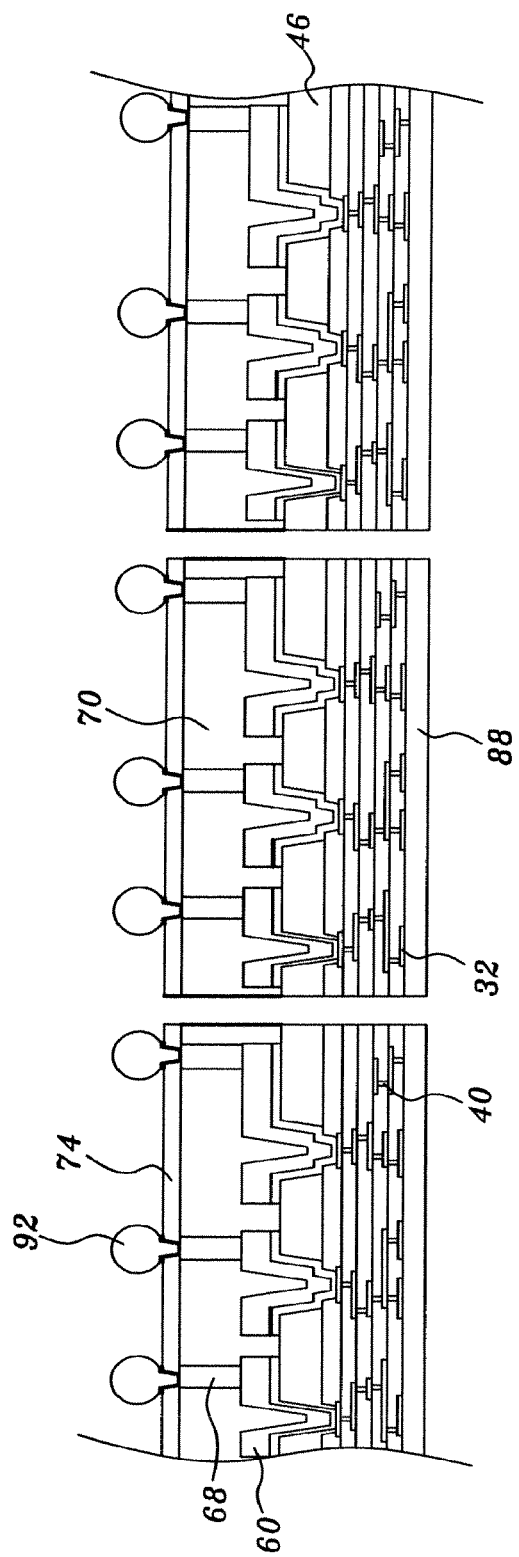
FIG. 12d and FIG. 12e are sectional views respectively schematically showing that the semiconductor substrate is diced and that the semiconductor unit is joined to a substrate according to the present invention.
Figure 12E:
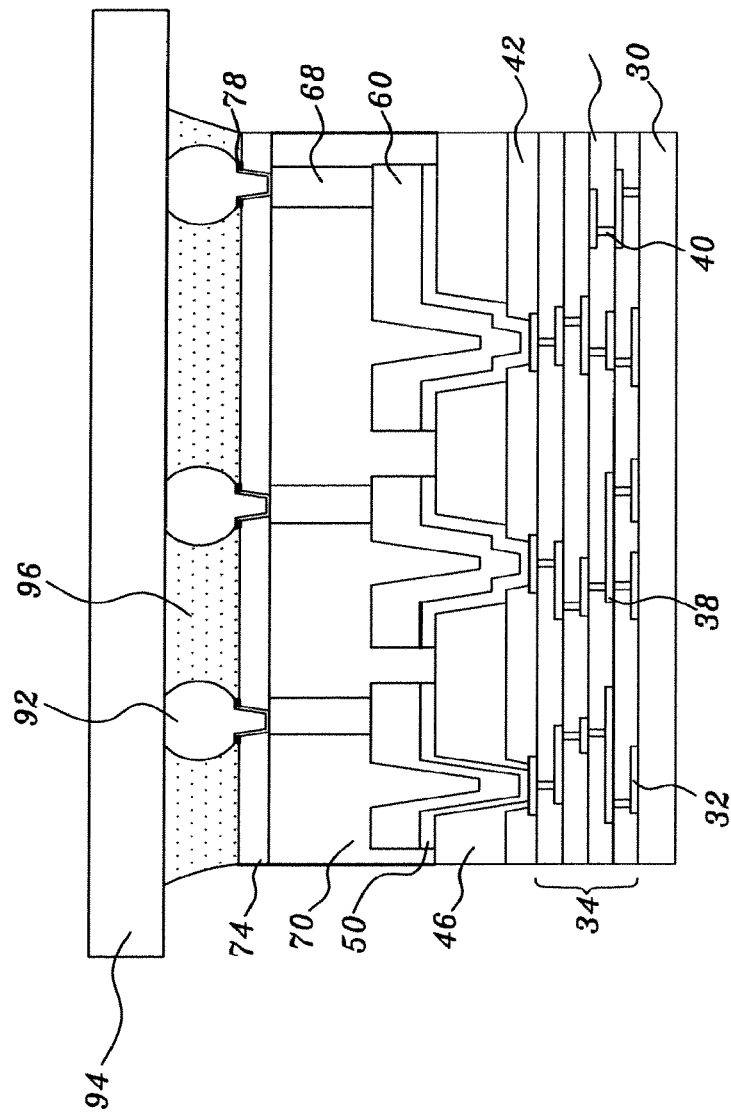

Refer to FIG. 12a, FIG. 12b and FIG. 12c. When the third metallic layer 84 has a solder layer, such as a tin-lead alloy, a tin-silver alloy, a tin-silver-copper alloy or lead-free solder, and has a thickness Hs of between 20 and 150 microns, and preferably between 30 and 100 microns, the semiconductor substrate 30 can be heated to reflow the solder layer of the third metallic layer 84 with the a ball shape, which is defined to be a solder ball 92. The third metallic layer 84 may be formed by electroplating a copper layer having a thickness of between 1 and 100 microns on the seed layer, made of copper, exposed by the openings 83, next electroplating a nickel layer having a thickness of between 1 and 10 microns on the copper layer exposed by the openings 83, and next electroplating a tin-containing solder layer, such as a tin-lead alloy, a tin-silver alloy or a tin-silver-copper alloy, having a thickness of between 20 and 150 microns on the nickel layer. Next, as shown in FIG. 12d, the semiconductor substrate 30 is diced into multiple semiconductor units 88. The solder balls 92 on the semiconductor unit 88 can be electrically connected to an external substrate 94, as shown in FIG. 12e. The external substrate 94 may be a semiconductor chip, a printed circuit board, a ceramic substrate, or a glass substrate. The distance between the centers of the neighboring solder balls 92 may be between 10 and 250 microns.

As shown in FIG. 12e, before the solder balls 92 on the semiconductor unit 88 are connected to substrate 94, a fourth polymer layer 96 may be formed on the substrate 94 beforehand. The material of the fourth polymer layer 96 is thermoplastic, thermosetting plastic, polyimide, BCB (Benzo-Cyclo-Butene), polyurethane, epoxy, parylene-based polymer, solder-mask material, elastic material, or porous dielectric material. The fourth polymer layer 96 may be formed on the substrate 94 by laminating a patterned dry film on the substrate 94 using a heat-pressing method, or by laminating a photosensitive dry film on the substrate 94 using a heat-pressing method and patterning the photosensitive dry film with a photolithographic method, or by laminating a non-photosensitive dry film on the substrate 94 using a heat-pressing method and patterning the non-photosensitive dry film with a photolithographic method plus an etching method, or by screen-printing the fourth polymer layer 96 where multiple openings are simultaneously formed in the fourth polymer layer 96, or by spin-coating a photosensitive film on the substrate 94 and then patterning the photosensitive film with a photolithographic method, or by spin-coating a non-photosensitive film on the substrate 94 and patterning the non-photosensitive film with a photolithographic method plus an etching method. After the solder balls 92 on the semiconductor unit 88 are attached to substrate 94, a heating procedure is used to cure the fourth polymer layer 96. The curing procedure is undertaken with a baking method, a microwave heating method, or an infrared heating method.

Figure 13A:
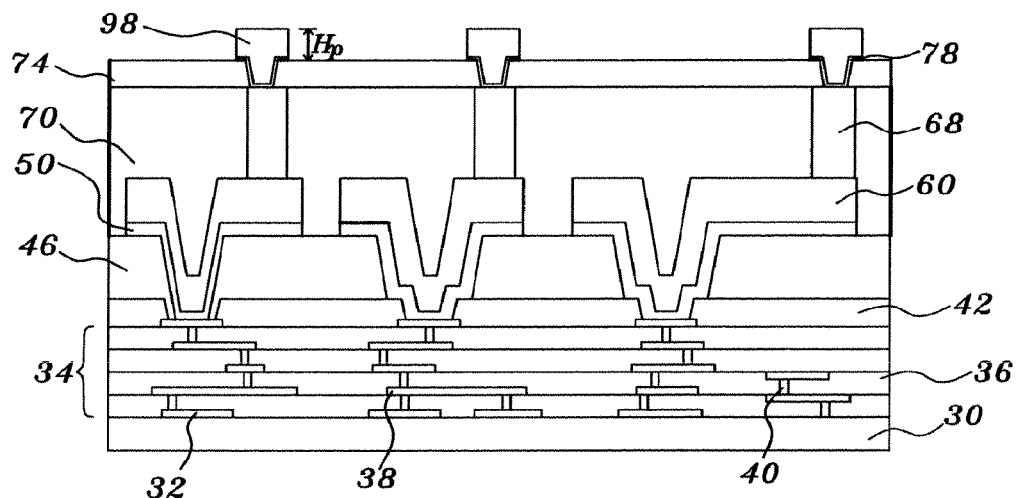
FIG. 13a and FIG. 13b are sectional views schematically showing the wire-bonding procedures of the metallic posts according to the present invention.
Figure 13B:
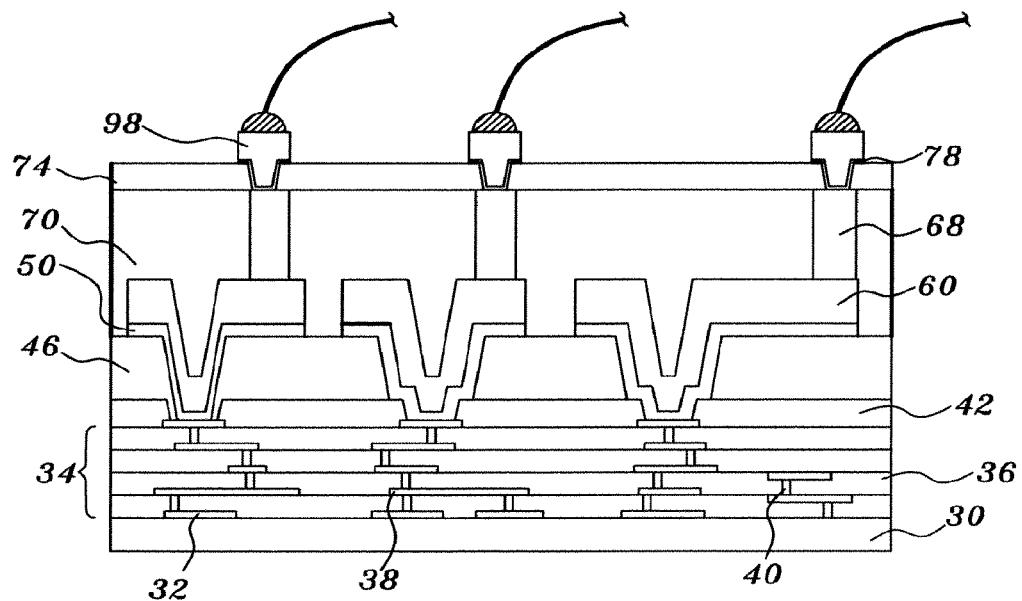

Refer to FIG. 13a and FIG. 13b. When the third metallic layer 84 is a single layer made of gold, copper, silver, palladium, platinum, rhodium, ruthenium, or rhenium, and has a thickness Hp of between 1 and 15 microns and preferably between 2 and 10 microns, the third metallic layer 84 is defined to be a contact pad 98. The contact pads 98 can be connected to an external circuit with wires formed by a wire bonding process.

Figure 14A:
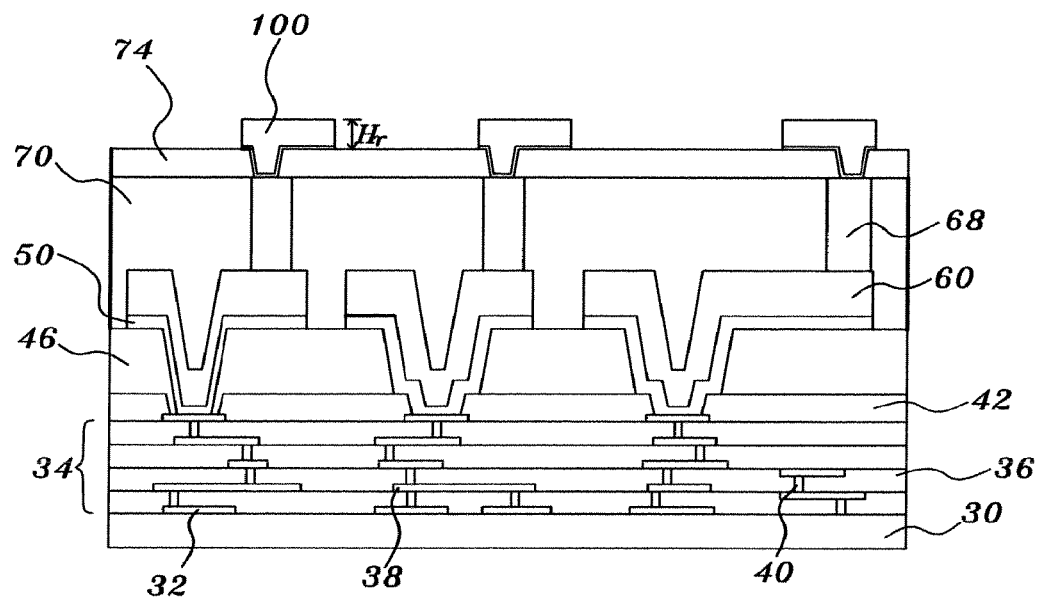
FIG. 14a and FIG. 14b are sectional views schematically showing the procedures of forming a RDL on the metallic posts according to the present invention.
Figure 14B:
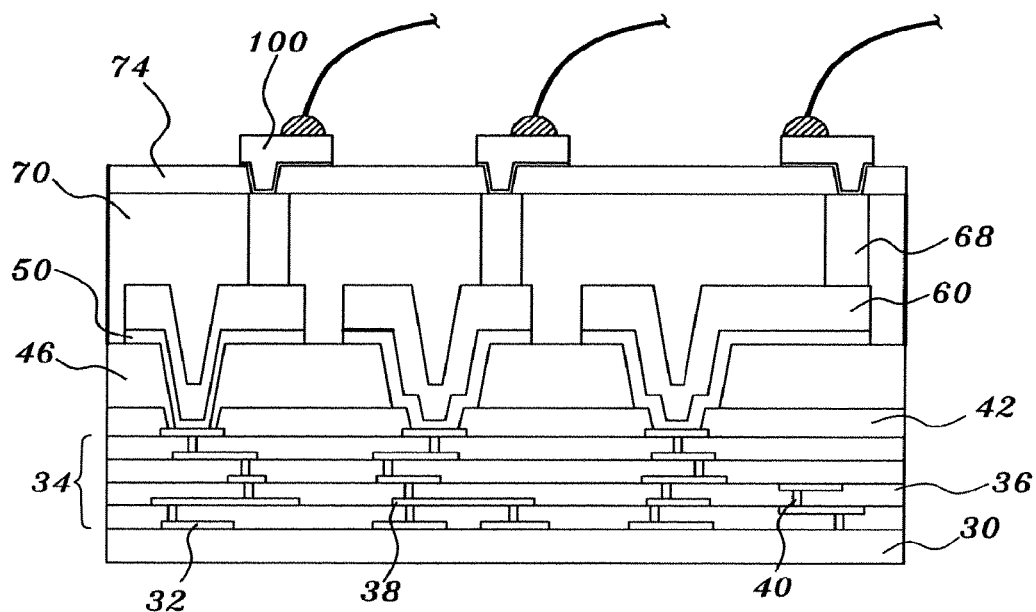

Refer to FIG. 14a and FIG. 14b. When the third metallic layer 84 is made of gold, copper, silver, palladium, platinum, rhodium, ruthenium, or rhenium, and has a thickness Hr of between 5 and 30 microns, and preferably between 10 and 25 microns, the third metallic layer 84 may defined to be a metal trace 100. The metal trace has a relocated pad connected to the metal post 68, wherein the position of the relocated pad and the metal post 68 connected thereto from a top surface is different. The relocated pad of the metal trace 100 can be connected to an external circuit with wires formed by a wire-bonding process. The distance between the centers of the wirebonding pads 92 may be between 10 and 250 microns.

In this embodiment, the structures having the bumps, contact pads, RDL's, and solder balls shown in from FIG. 9 to FIG. 14b are all the structures derived from the structure shown in FIG. 8c. However, those structures may also be derived from the structure shown in FIG. 8b. The structure shown in FIG. 9 is fabricated via forming the third polymer layer 74 on the structure shown in FIG. 8c and patterning the third polymer layer 74 to form multiple openings in the third polymer layer 74. In the structure shown in FIG. 8b, the metallic posts 68 are not revealed via polishing the second polymer layer 70 but revealed via forming multiple openings in the second polymer layer 70 with a patterning procedure. It is unnecessary to form the third polymer layer 74 for the structure shown in FIG. 8b. The structure shown in FIG. 8b is equivalent to the structure shown in FIG. 8c plus the third polymer layer 74. Therefore, the above-mentioned for forming the bumps, contact pads, metal traces, and solder balls derived from FIG. 9, as shown in FIGS. 10a-10d, 11, 12a-12e, 13a-13b and 14a-14b, also can be applied to the structure shown in FIG. 8b.

Embodiment 2

Figure 15A:
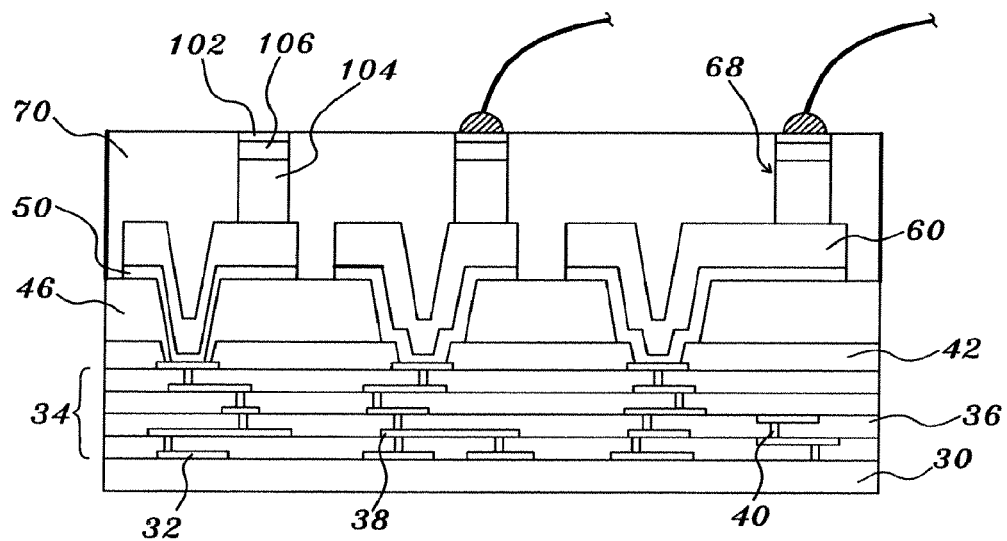
FIG. 15a to FIG. 15c are sectional views respectively schematically showing the wire-bonded copper/nickel/gold metallic posts and the wire-bonded copper/gold metallic posts according to the present invention.
Figure 15B:
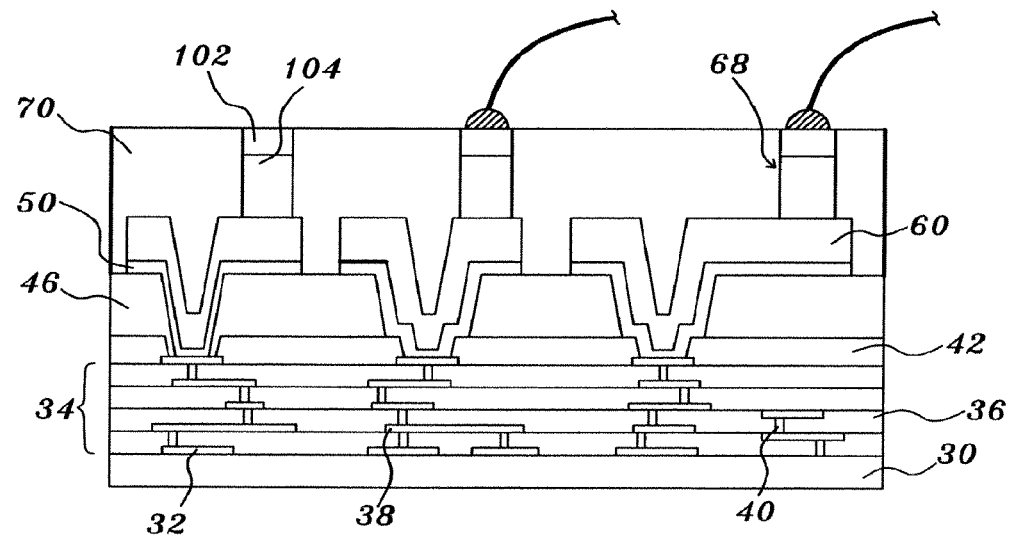
Figure 15C:
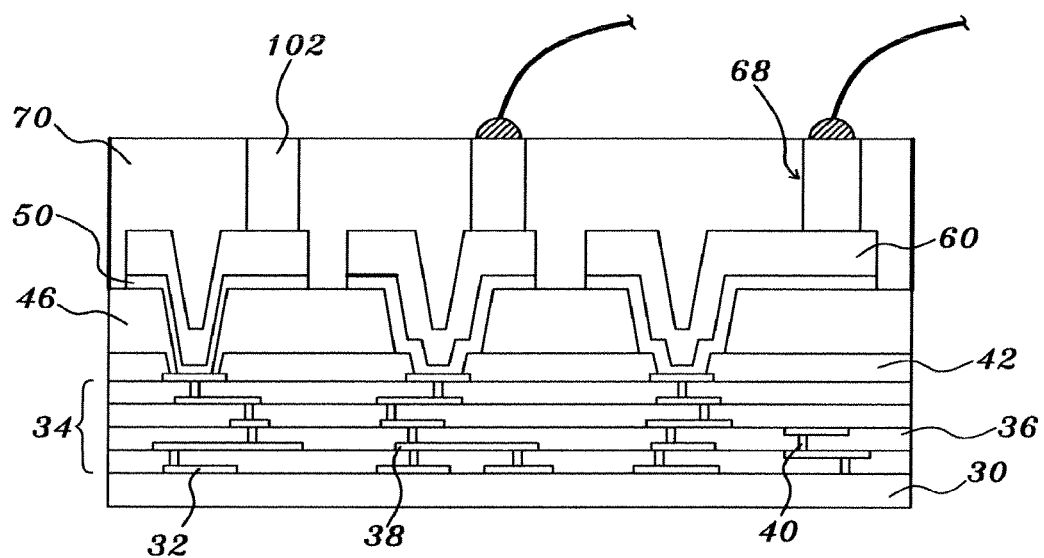

This embodiment is derived from the structure of Embodiment 1 shown in FIG. 8c. As shown in FIG. 15a, the top end of the metallic post 68 is a gold layer 102 having a thickness of between 1 and 30 microns, and a wire formed with a wire-bonding process can be connected onto the gold layer 102 of the metallic post 68. It is to be noted: a nickel layer 106 having a thickness of between 1 and 10 microns and a copper layer 104 having a thickness of between 10 and 100 microns and are sequentially below the gold layer 102 to form a copper/nickel/gold structure for the metal post 68. Alternatively, as shown in FIG. 15b, a copper layer 104 having a thickness of between 10 and 100 microns is below the gold layer 102 having a thickness of between 1 and 30 microns to form a copper/gold structure for the metal post 68. Alternatively, as shown in FIG. 15c, the entire metallic post 68 having a thickness of between 10 and 100 microns may be made of gold.

Embodiment 3

Figure 16A:
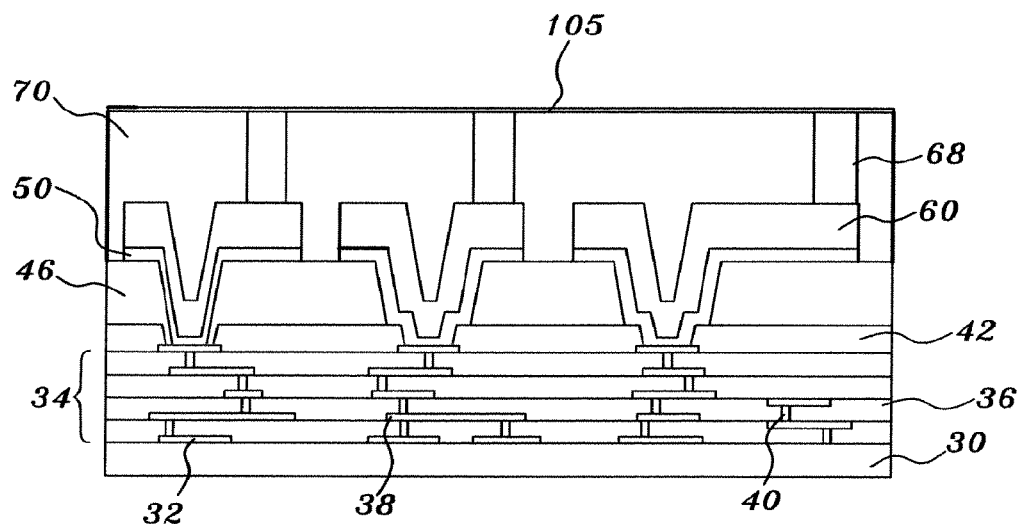
FIG. 16a to FIG. 16f are sectional views schematically showing the fabrication procedures of a first coil-like metallic layer formed above the metallic posts according to the present invention.
Figure 16B:
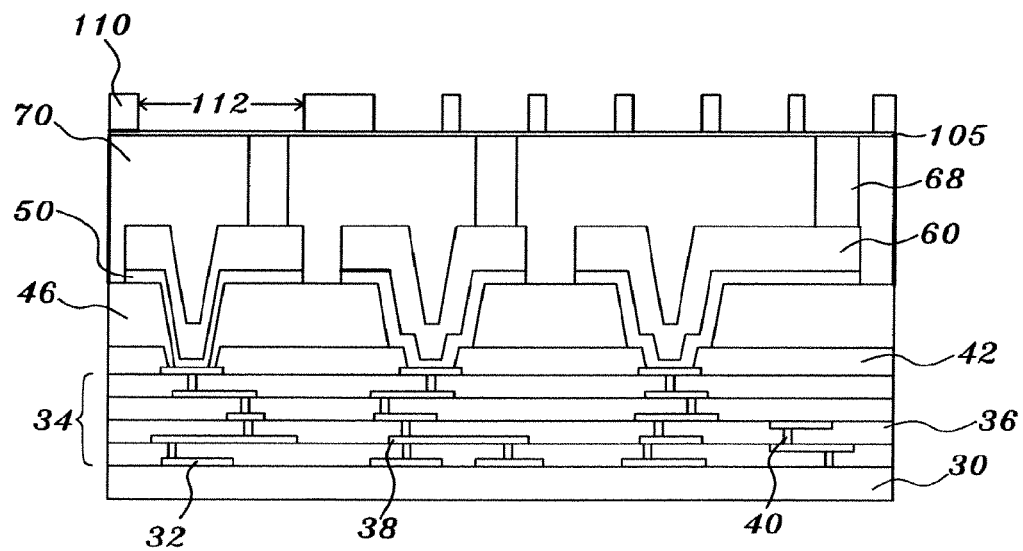
Figure 16C:
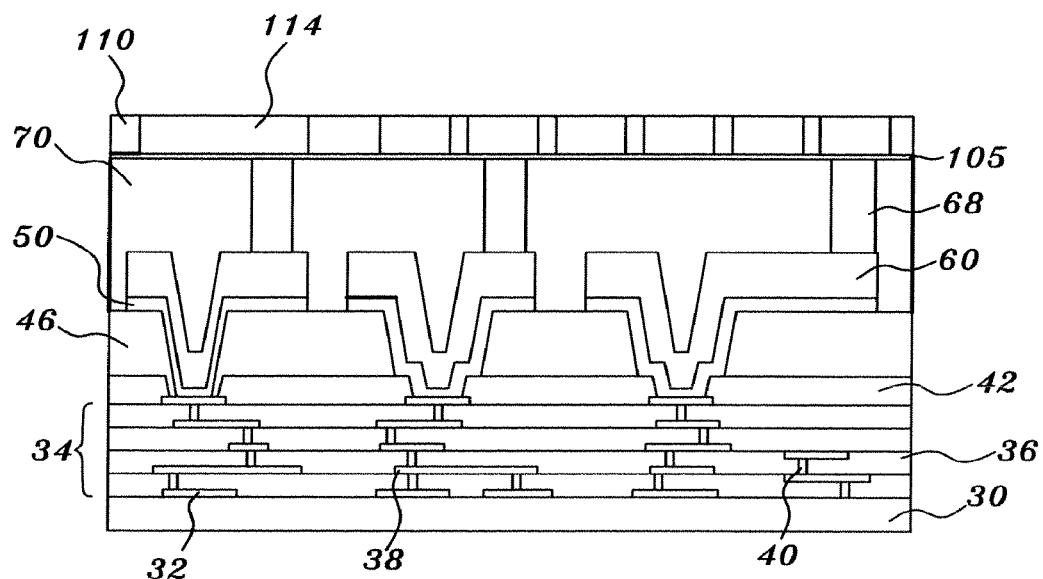
Figure 16D:
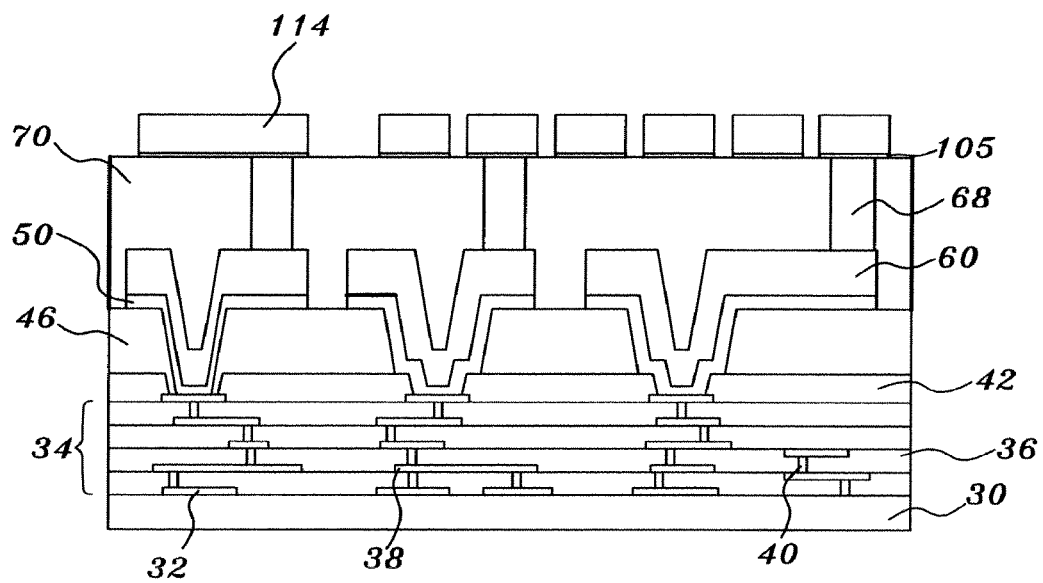
Figure 16E:
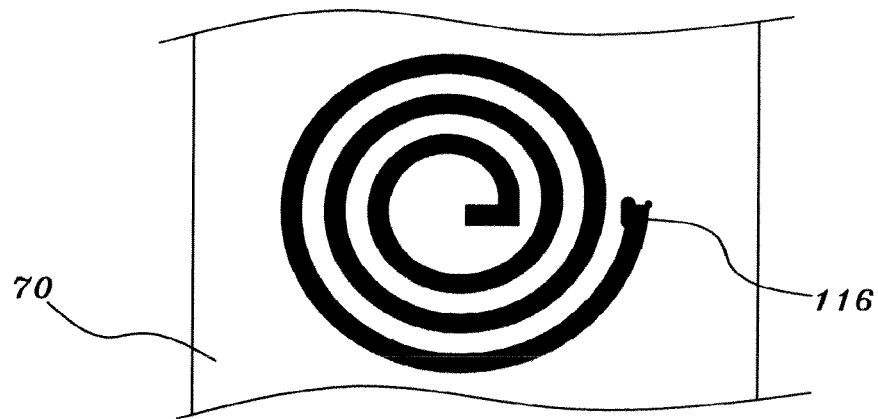
Figure 16F:
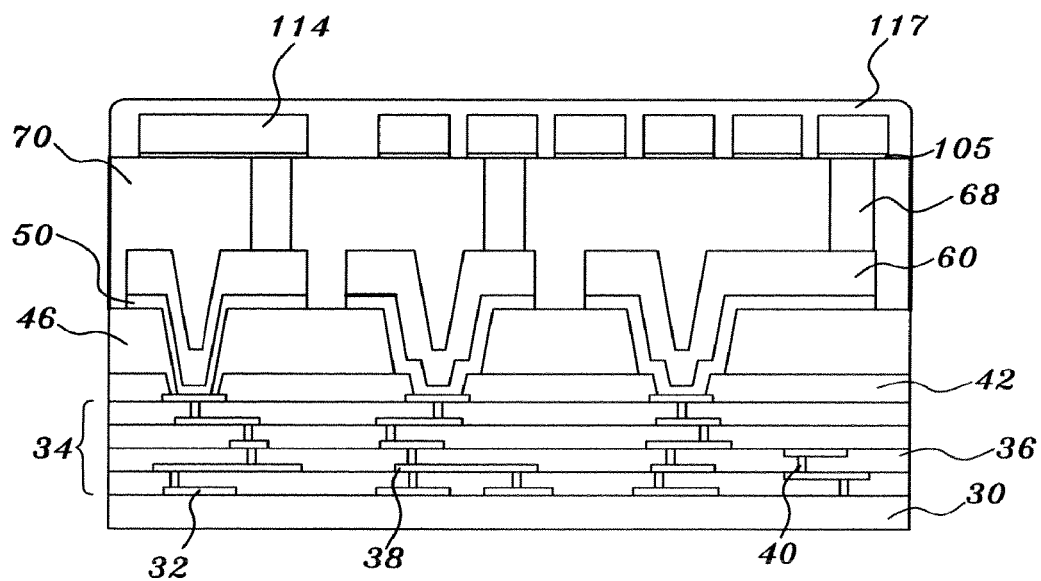

This embodiment is derived from the structure of Embodiment 1 shown in FIG. 8c. As shown in FIG. 16a, a third adhesion/barrier layer 105 is formed on the second polymer layer 70 and on the top end of the metal post 68. The material of the third adhesion/barrier layer 105 is titanium metal, titanium nitride, titanium-tungsten alloy, chromium metal, chromium-copper alloy, tantalum metal, or tantalum nitride. A seed layer (not shown), such as gold, copper, silver, nickel, platinum, palladium, ruthenium, rhodium, or rhenium, may be sputtered on the third adhesion/barrier layer 105. As shown in FIG. 16b, a fourth patterned photoresist layer 110 is formed on the seed layer on the third adhesion/barrier layer 105; a coil-shaped opening 112 in the fourth patterned photoresist layer 110 exposes the seed layer on the adhesion/barrier layer 105. As shown in FIG. 16c, a fourth metallic layer 114 is electroplated on the seed layer exposed by the opening 112 in the fourth patterned photoresist layer 110. The fourth metallic layer 114 may be formed by electroplating a single layer of gold, copper, silver, nickel, platinum, palladium, ruthenium, rhodium, or rhenium, having a thickness of between 1 and 30 microns. Alternatively, the fourth metallic layer 114 may be formed by electroplating a copper layer having a thickness of between 1 and 30 microns, next electroplating a nickel layer having a thickness of between 1 and 10 microns on the copper layer, and next electroplating a gold layer having a thickness of between 1 and 10 microns on the nickel layer. Preferably, the bottommost metal layer of the fourth metallic layer 114 has a same material as the seed layer. As shown in FIG. 16d, the fourth patterned photoresist layer 110 is removed; and next the seed layer and the third adhesion/barrier layer 105 not under the fourth metallic layer 114 are removed. If the third adhesion/barrier layer 105 is titanium tungsten alloy, the etchant for etching the third adhesion/barrier layer 105 can be hydrogen peroxide. If the seed layer is gold, the etchant for etching the seed layer is potassium iodide. As shown in FIG. 16e, the fourth metallic layer 114 appears like a coil; thus, the fourth metallic layer 114 is defined to be a first coil-like metallic layer 116. As shown in FIG. 16f, the metallic posts 68 electrically connect the first coil-like metallic layer 116 to the semiconductor substrate 30; the first coil-like metallic layer 116 may also be electrically connected to an external circuit via a wire-bonding process; a protection layer 117 having a thickness of between 5 and 25 microns may be formed above the first coil-like metallic layer 116 lest the first coil-like metallic layer 116 be damaged or penetrated by moisture. The material of the protection layer 117 may be an organic or inorganic material or may be thermoplastic, thermosetting plastic, polyimide, BCB (Benzo-Cyclo-Butene), polyurethane, epoxy, parylene-based polymer, solder-mask material, elastic material, porous dielectric material, silicon oxide, compounds of silicon and oxygen, silicate and phosphate glass, silicon nitride, or silicon oxy-nitride. The first coil-like metallic layer 116 may be used as a passive device, such as an inductor.

Figure 16G:
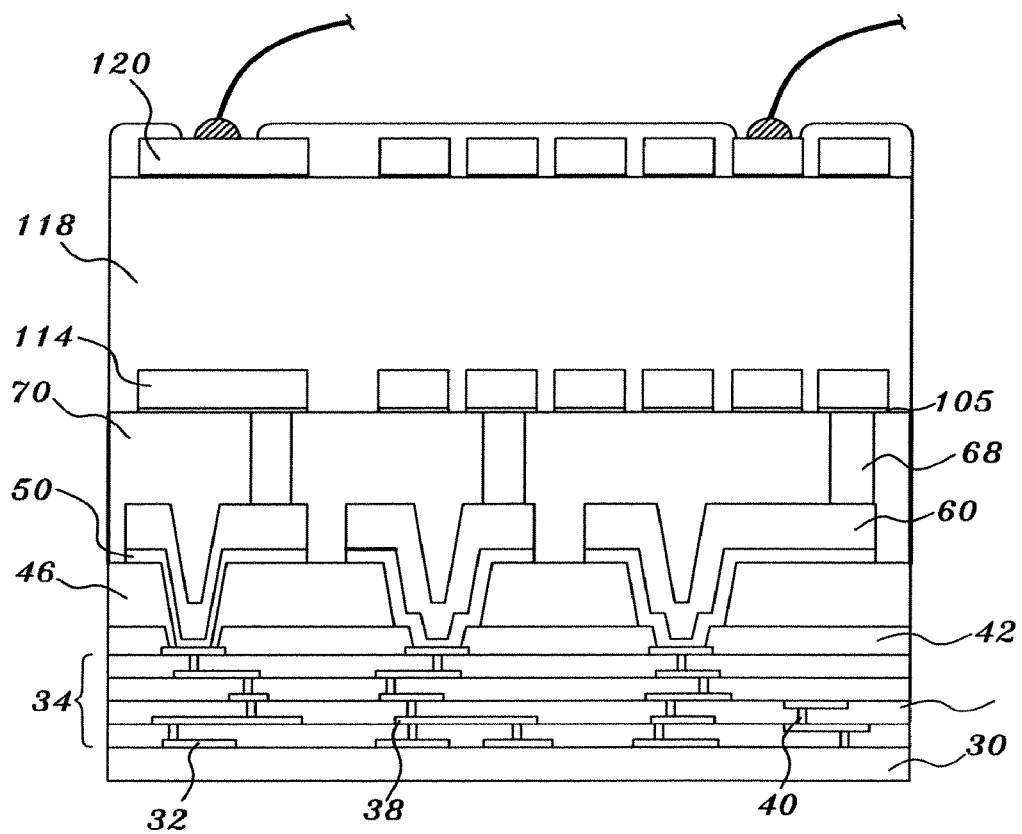
FIG. 16g is a sectional view schematically showing the fabrication procedures of a second coil-like metallic layer according to the present invention.

The case that the first coil-like metallic layer 116 is applied to an inductor is to be exemplified here. As shown in FIG. 16g, a fifth polymer layer 118, such as polyimide or benzo-cyclo-butene (BCB), having a thickness of between 20 and 200 microns is formed to cover the first coil-like metallic layer 116. The fifth polymer layer 118 may be formed by spin coating multiple oligomer layers each having a thickness of between 10 and 25 microns or screen-printing a thick oligomer layer. A second coil-like metallic layer 120 is formed on the fifth polymer layer 118 with the same method as that used to form the first coil-like metallic layer 116. The second coil-like metallic layer 120 is electrically connected to an external circuit. When there is a current variation in the external circuit, an electromotive force is induced in the first coil-like metallic layer 116 by the current through the second coil-like metallic layer 120, thereby creating a signal transmitted to the semiconductor substrate 30.

Figure 16H:
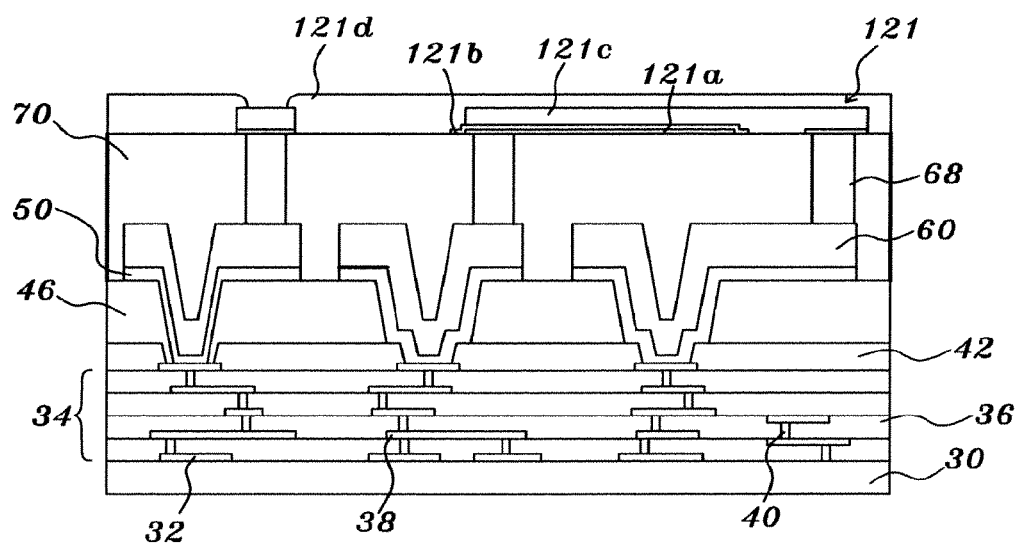
FIG. 16h is a sectional view schematically showing the procedures of forming a capacitor element on the metallic posts according to the present invention.

The abovementioned selective electroplating may also be used to form a capacitor element 121 on the second polymer layer 70. As shown in FIG. 16*h*, a low-permittivity layer 121*a* with a thickness of between 500 and 5000 Å is formed on the second polymer layer 70. The material of the low-permittivity layer 121*a* is titanium metal, titanium-tungsten alloy, tantalum metal, or tantalum nitride, etc. The low-permittivity layer 121*a* is electrically connected to one of the metallic posts 68. Next, a high-permittivity layer 121*b* is formed on the low-permittivity layer 121*a*. The material of the high-permittivity layer 121*b* is silicon oxy-nitride, silicon oxide, or polyimide. A low-resistance layer 121*c* is formed on the high-permittivity layer 121*b* and connected to the other one of the metallic posts 68. The low-resistance layer 121*c* may be fabricated by sputtering an adhesion/barrier layer, such as titanium, titanium-tungsten alloy, chromium, tantalum or tantalum nitride, having a thickness of between 400 and 7500 angstroms on the high-permittivity layer 121*b*, next sputtering a seed layer, preferably made of copper, having a thickness of between 500 and 5000 angstroms on the adhesion/barrier layer, next electroplating a copper layer having a thickness of between 1 and 30 microns on the seed layer, next optionally electroplating a nickel layer having a thickness of between 1 and 10 microns on the copper layer, and next optionally electroplating a gold layer having a thickness of between 1 and 10 microns on the nickel layer or on the copper layer. Alternatively, the low-resistance layer 121*c* may be fabricated by sputtering an adhesion/barrier layer, such as titanium, titanium-tungsten alloy, chromium, tantalum or tantalum nitride, having a thickness of between 400 and 7500 angstroms on the high-permittivity layer 121*b*, next sputtering a seed layer, preferably made of gold, having a thickness of between 500 and 5000 angstroms on the adhesion/barrier layer, next electroplating a gold layer having a thickness of between 1 and 30 microns on the seed layer. A protection layer 121*d* is formed on the low-resistance layer 121*c* and the second polymer layer 70 lest the capacitor element 121 be damaged. The material of the protection layer 121*d* may be an organic or inorganic material or may be thermoplastic, thermosetting plastic, polyimide, BCB (Benzo-Cyclo-Butene), polyurethane, epoxy, parylene-based polymer, solder-mask material, elastic material, porous dielectric material, silicon oxide, compounds of silicon and oxygen, silicate and phosphate glass, silicon nitride, or silicon oxy-nitride.

Embodiment 4

Figure 17A:
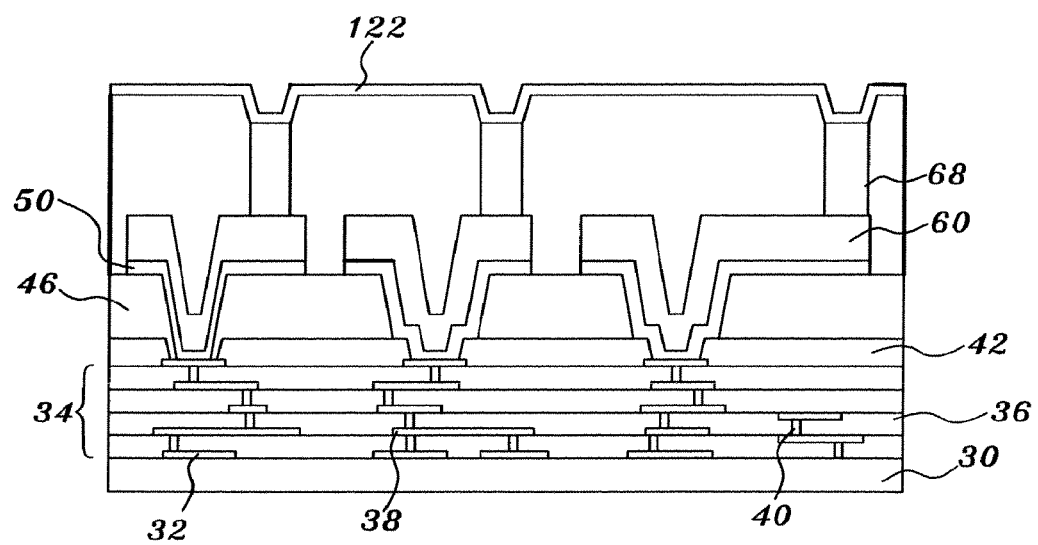
FIG. 17a to FIG. 17d are sectional views schematically showing the fabrication procedures of a metallic layer to interconnect two metallic posts according to the present invention.
Figure 17B:
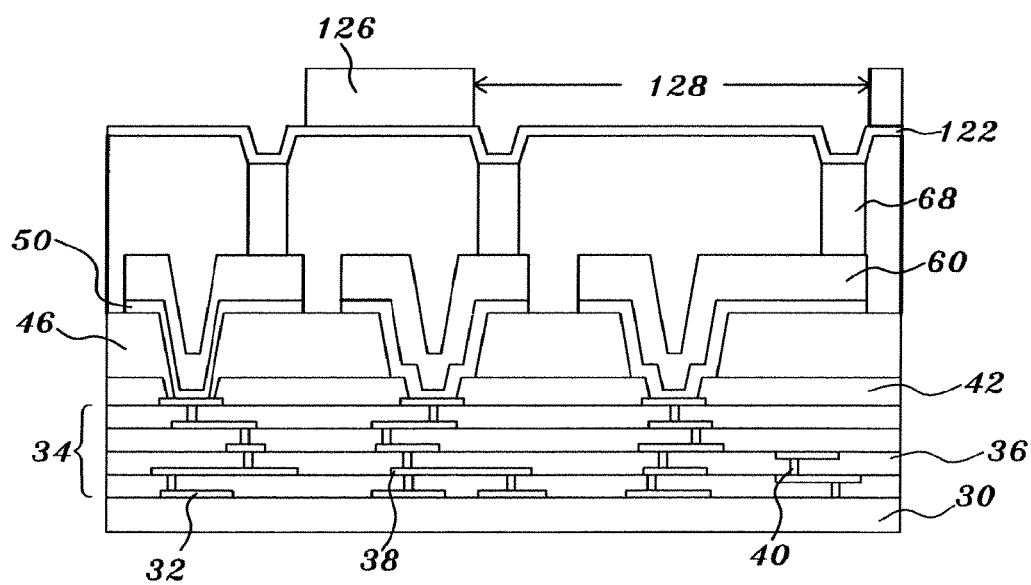
Figure 17C:
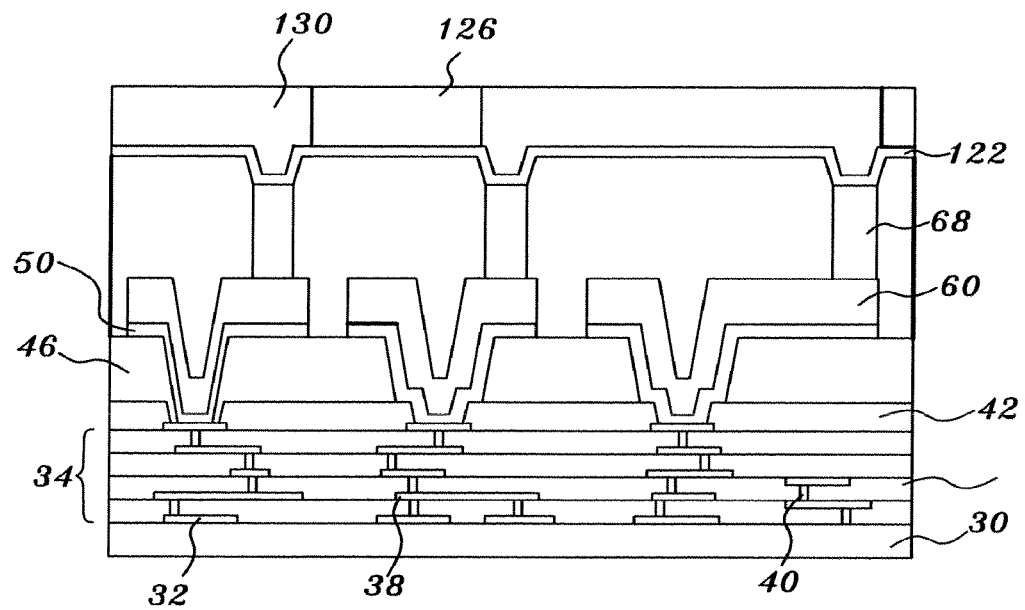
Figure 17D:
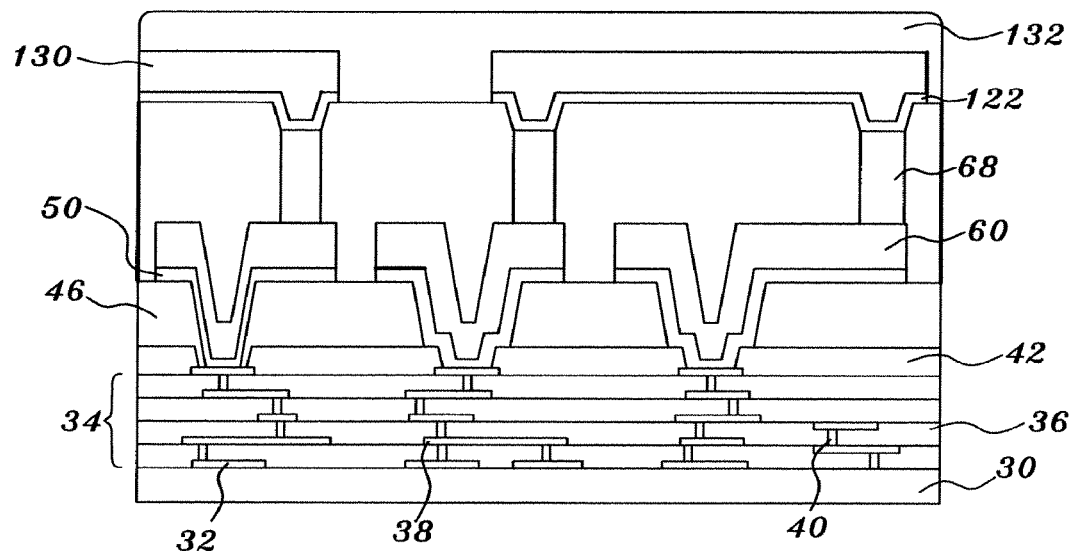

This embodiment is derived from the structure of Embodiment 1 shown in FIG. 8*b*. As shown in FIG. 17*a*, a fourth adhesion/barrier layer 122, such as titanium, titanium tungsten alloy, chromium, tantalum or tantalum nitride, is formed on the second polymer layer 70 and on the top ends of the metal posts 68 using a sputter process. A seed layer, such as gold, copper, silver, nickel, platinum, palladium, ruthenium, rhodium, or rhenium, is sputtered on the fourth adhesion/barrier layer 122. As shown in FIG. 17*b*, a fifth patterned photoresist layer 126 is formed on the seed layer on the fourth adhesion/barrier layer 122. A trace-shaped opening 128 in the fifth patterned photoresist layer 126 exposes the seed layer on the fifth patterned photoresist layer 126. As shown in FIG. 17*c*, a fifth metallic layer 130 having a thickness of between 5 and 30 microns is electroplated on the seed layer on the fourth adhesion/barrier layer 122 exposed by the opening 128 in the fifth patterned photoresist layer 126; the fifth metallic layer 130 is made of a low-resistance material, such as gold, silver or copper. The fifth metallic layer 130 may be formed by electroplating a single layer of gold, copper, silver, nickel, platinum, palladium, ruthenium, rhodium, or rhenium, having a thickness of between 1 and 30 microns. Alternatively, the fifth metallic layer 130 may be formed by electroplating a copper layer having a thickness of between 1 and 30 microns, next electroplating a nickel layer having a thickness of between 1 and 10 microns on the copper layer, and next electroplating a gold layer having a thickness of between 1 and 10 microns on the nickel layer. Preferably, the bottommost metal layer of the fifth metallic layer 130 has a same material as the seed layer. As shown in FIG. 17*d*, the fifth patterned photoresist layer 126 is removed, and next the seed layer and the fourth adhesion/barrier layer 122 not under the fifth metallic layer 130 are etched away. If the third adhesion/barrier layer 105 is titanium tungsten alloy, the etchant for etching the third adhesion/barrier layer 105 can be hydrogen peroxide. If the seed layer is gold, the etchant for etching the seed layer is potassium iodide. The fifth metallic layer 130 is electrically connected to two metallic posts 68 and functions as the interconnection between multiple metallic posts 68. A protection layer 132 is formed to cover the second polymer layer 70 and the fifth metallic layer 130 lest the fifth metallic layer 130 be damaged or penetrated by moisture. The material of the protection layer 132 may be an organic or inorganic material or may be thermoplastic, thermosetting plastic, polyimide, BCB (Benzo-Cyclo-Butene), polyurethane, epoxy, parylene-based polymer, solder-mask material, elastic material, porous dielectric material, silicon oxide, compounds of silicon and oxygen, silicate and phosphate glass, silicon nitride, or silicon oxy-nitride.

Figure 17E:
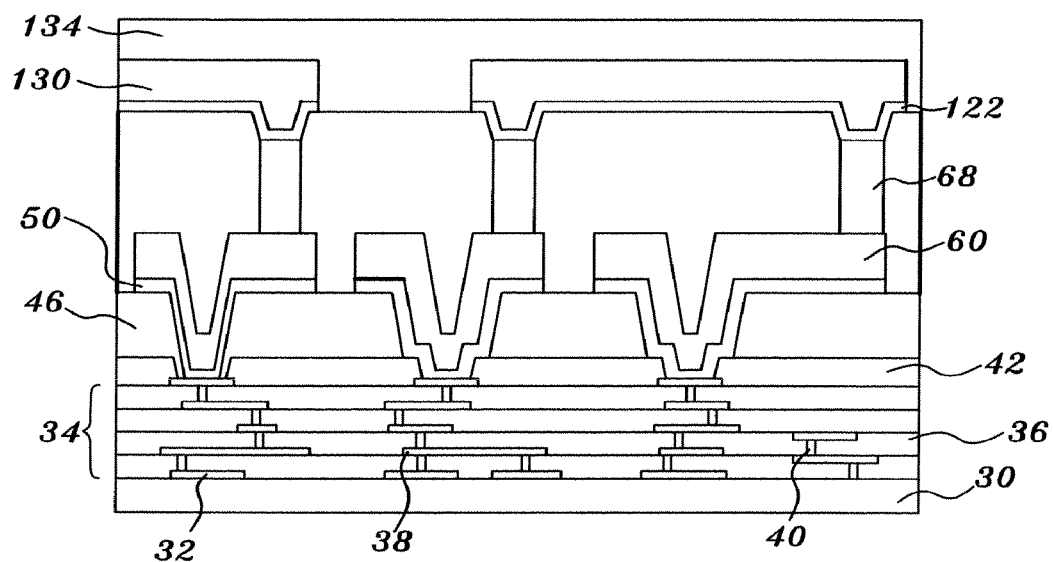
FIG. 17e to FIG. 17m are sectional views schematically showing the procedures of forming a multi-layer circuit on the metallic posts according to the present invention.
Figure 17F:
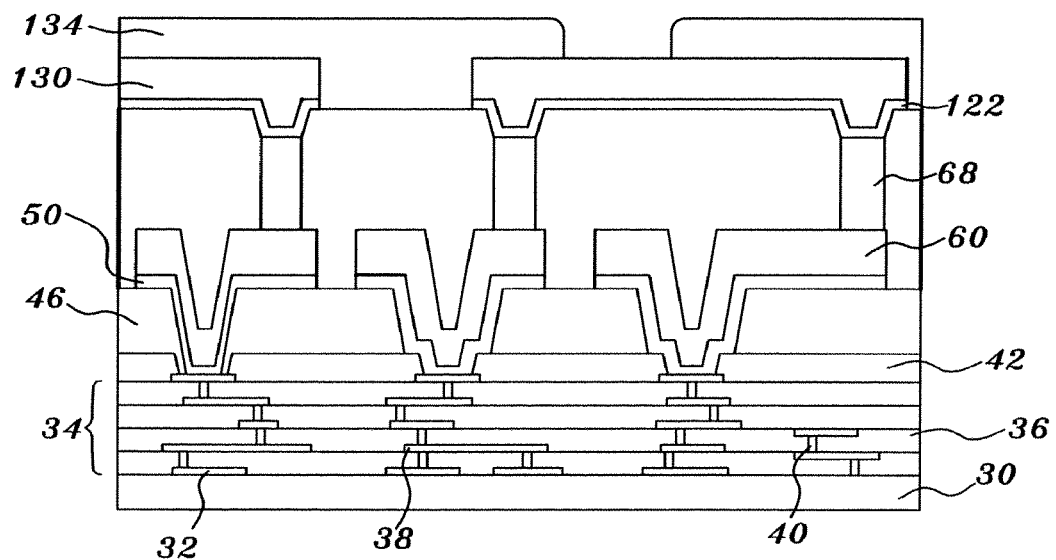
Figure 17G:
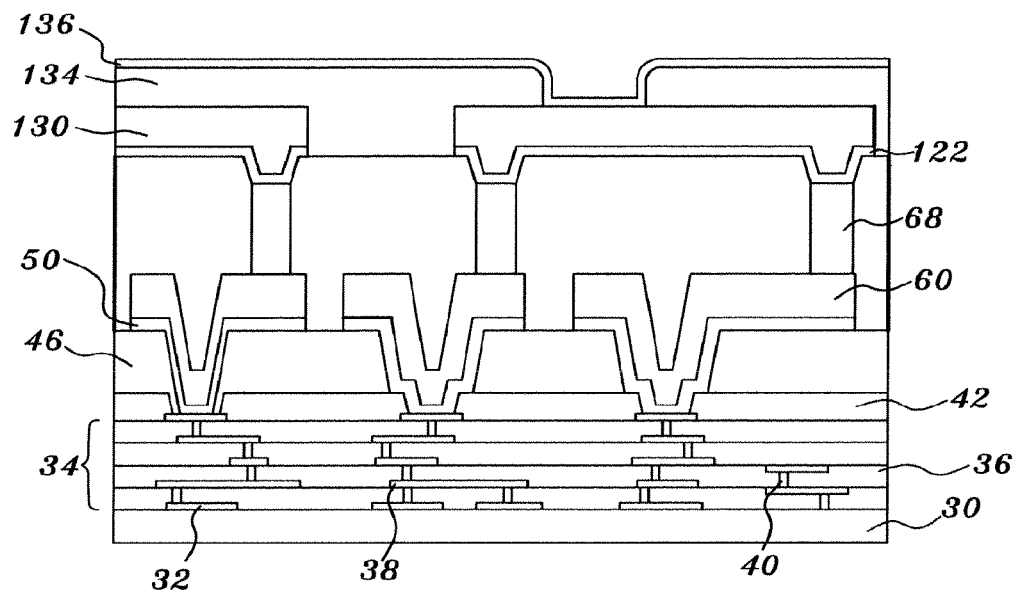
Figure 17H:
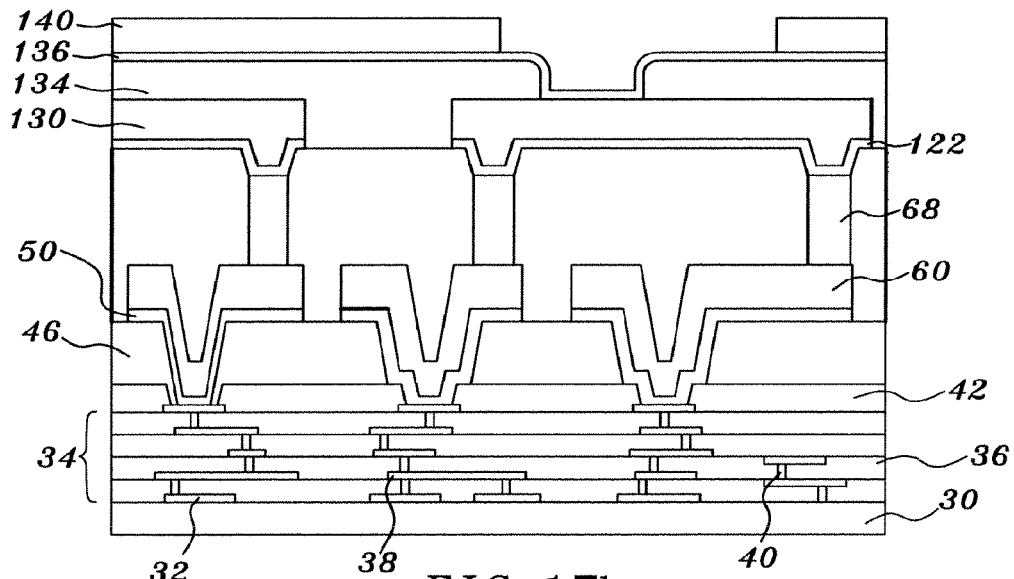
Figure 17I:
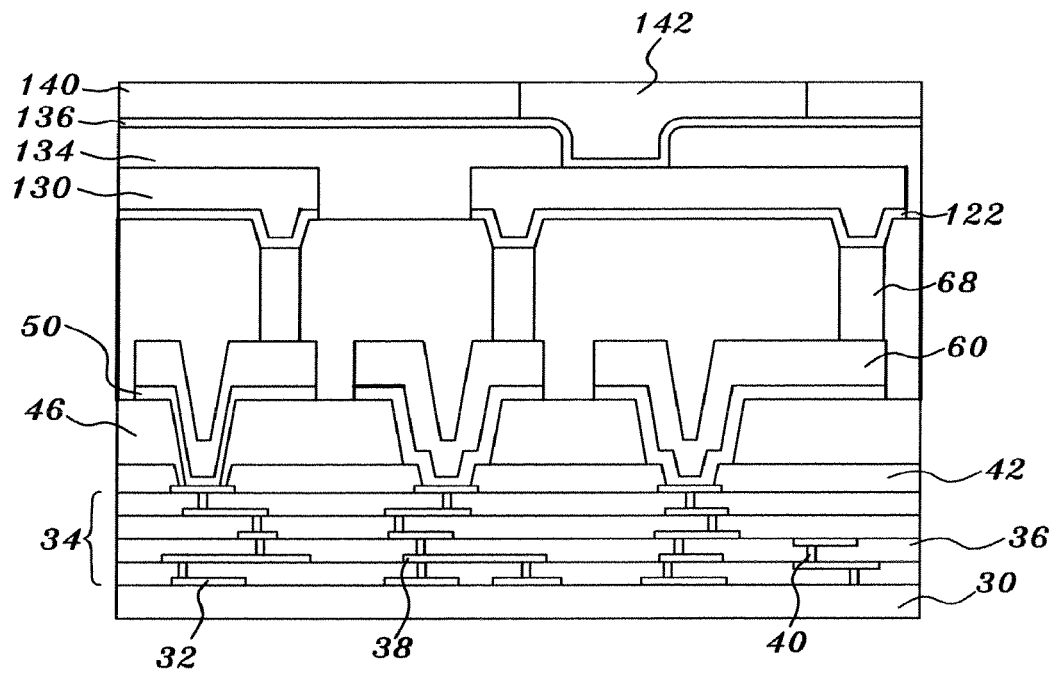
Figure 17J:
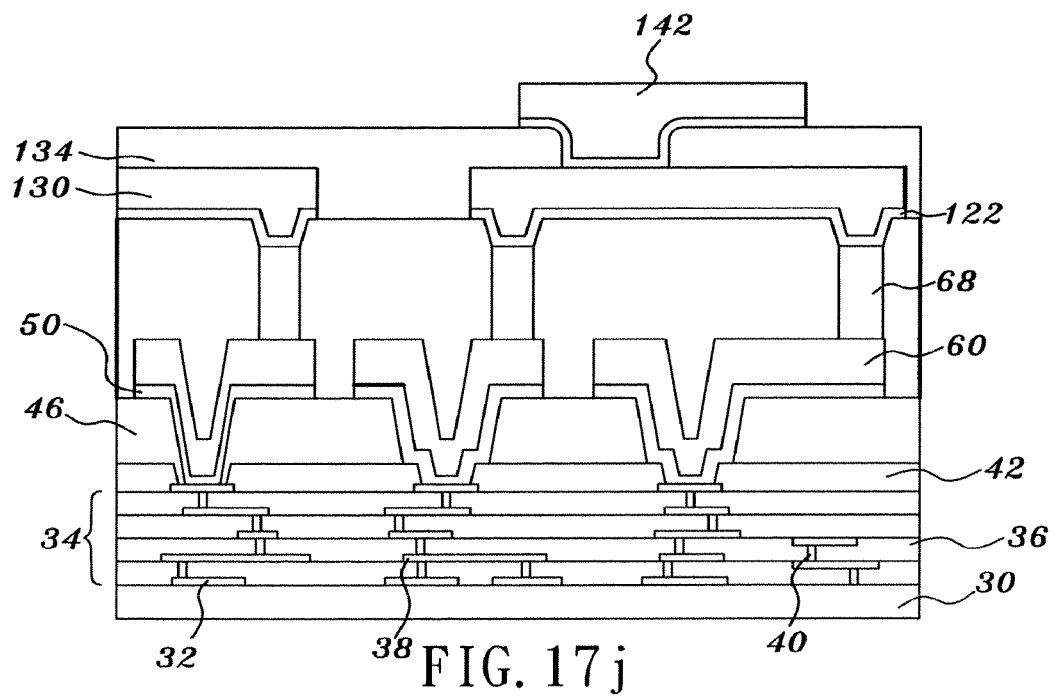
Figure 17K:
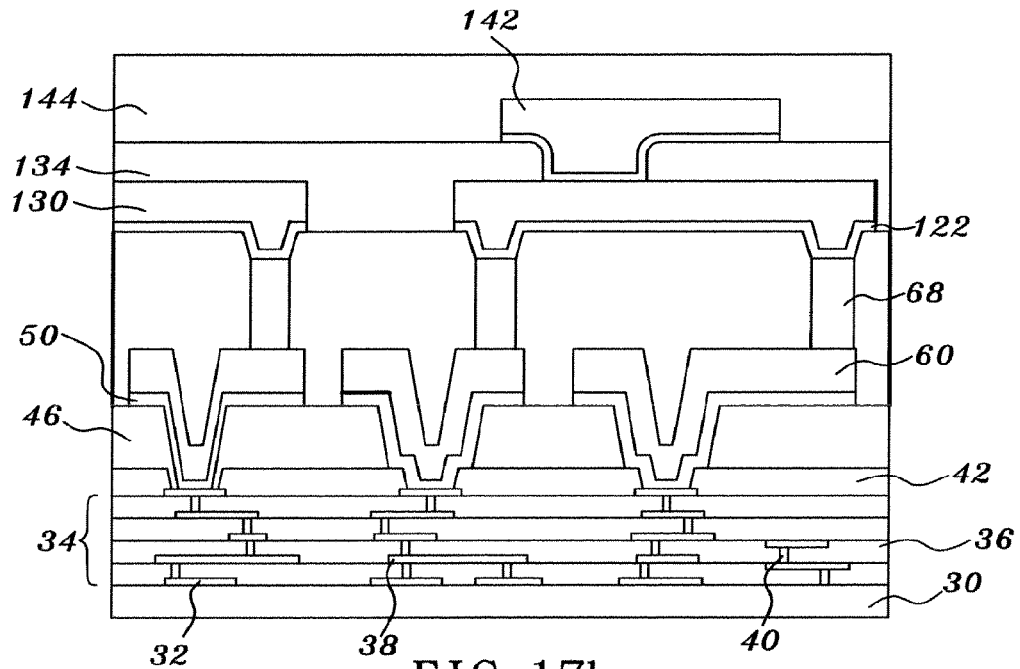
Figure 17L:
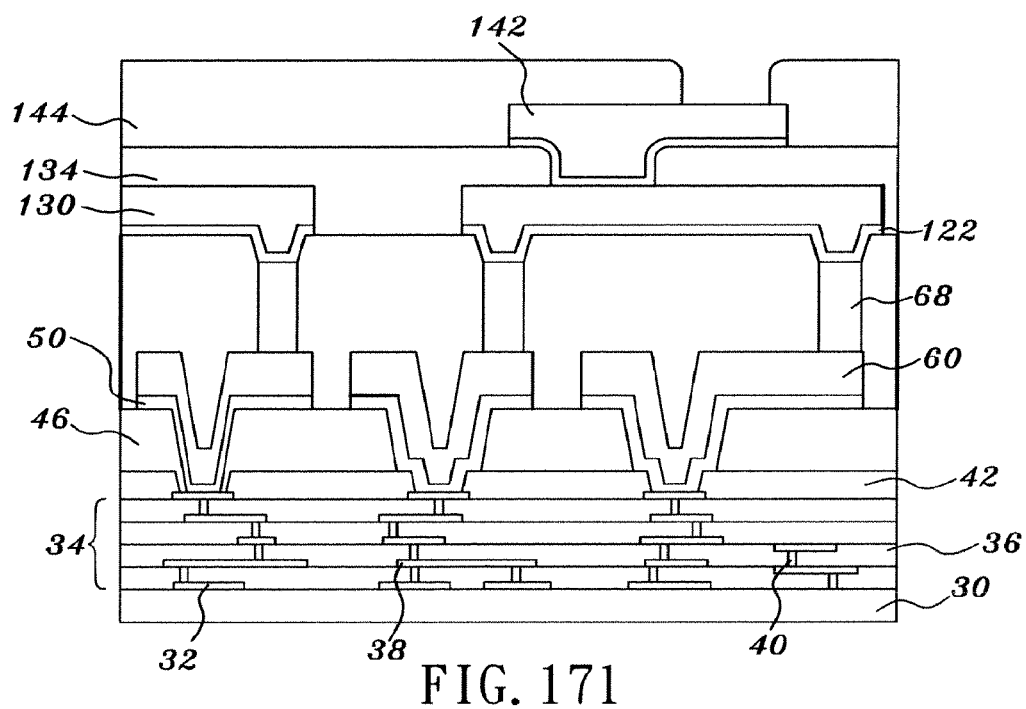
Figure 17M:
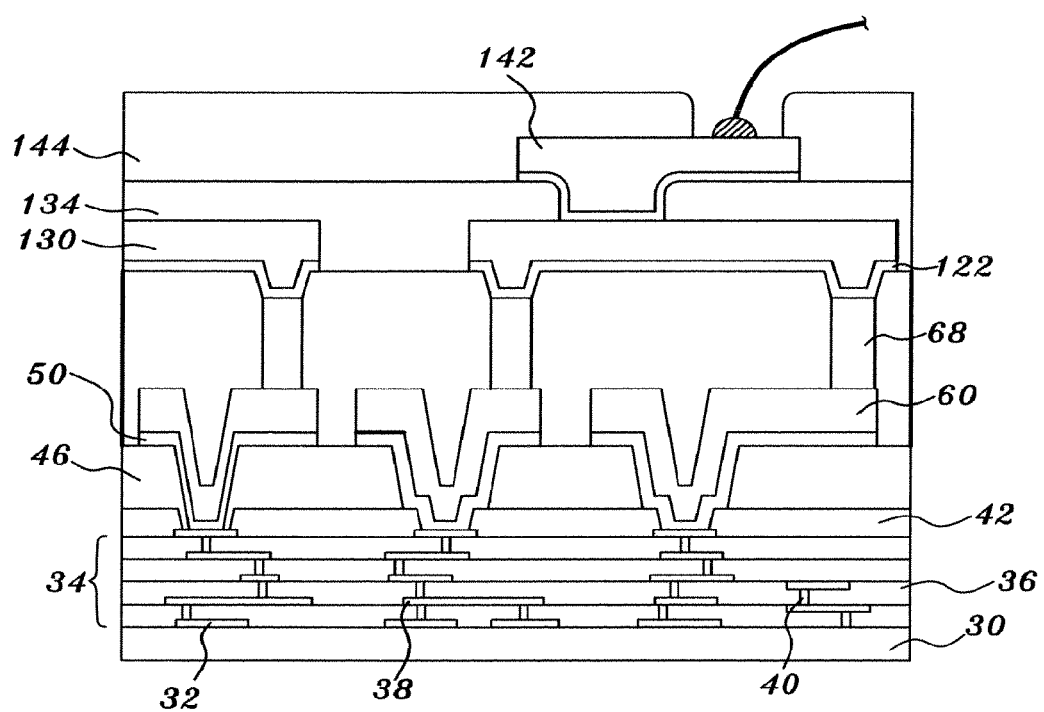

In addition to the fifth metallic layer 130 functioning as the interconnection between the metallic posts 68, multi-layer wire structure may also be fabricated thereby. The metal trace 130 may not be connected up to an external circuitry, but be connected down to transistors or MOS devices. As shown in FIG. 17*e*, a sixth polymer layer 134, such as polyimide or benzo-cyclo-butene (BCB), having a thickness of between 10 and 25 microns is formed on the second polymer layer 70 and on the fifth metallic layer 130. Provided that the metal trace 130 may not be connected up to an external circuitry, but be connected down to transistors or MOS devices, an opening in the sixth polymer layer 134 exposing the metal trace 130 is not necessary. Next, as shown in FIG. 17*f*, the sixth polymer layer 134 is patterned to form multiple openings in the sixth polymer layer 134, whereby the fifth metallic layer 130 is revealed. As shown in FIG. 17*g*, a fifth adhesion/barrier layer 136, such as titanium, titanium tungsten alloy, chromium, tantalum or tantalum nitride, is formed on the sixth polymer layer 134 and on the metal trace 130 with a sputtering method. Next, a seed layer (not shown), such as gold, copper, silver, nickel, platinum, palladium, ruthenium, rhodium, or rhenium, is sputtered on the fifth adhesion/barrier layer 136. As shown in FIG. 17*h*, a sixth patterned photoresist layer 140 is formed on the seed layer on the fifth adhesion/barrier layer 136, an opening in the sixth patterned photoresist layer 140 expose the seed layer on the fifth adhesion/barrier layer 136. As shown in FIG. 17i, a sixth metallic layer 142 is formed on the seed layer exposed by the opening in the sixth patterned photoresist layer 140. The sixth metallic layer 142 may be formed by electroplating a single layer of gold, copper, silver, nickel, platinum, palladium, ruthenium, rhodium, or rhenium, having a thickness of between 1 and 30 microns. Alternatively, the sixth metallic layer 142 may be formed by electroplating a copper layer having a thickness of between 1 and 30 microns, next electroplating a nickel layer having a thickness of between 1 and 10 microns on the copper layer, and next electroplating a gold layer having a thickness of between 1 and 10 microns on the nickel layer. Preferably, the bottommost metal layer of the sixth metallic layer 142 has a same material as the seed layer. As shown in FIG. 17j, the sixth patterned photoresist layer 140 is removed; next, the seed layer and the fifth adhesion/barrier layer 136 not under the sixth metallic layer 142 are sequentially removed. As shown in FIG. 17k, a seventh polymer layer 144, such as polyimide or benzo-cyclo-butene (BCB), having a thickness of between 10 and 25 microns is formed on the sixth polymer layer 134 and the sixth metallic layer 142. As shown in FIG. 17l, the seventh polymer layer 144 is patterned to form multiple openings in the seventh polymer layer 144 exposing the sixth metallic layer 142. As shown in FIG. 17m, the revealed sixth metallic layer 142 may be electrically connected to an external circuit with a wire formed by a wire-bonding process, or with a solder bump or gold bump.

Embodiment 5

Figure 18:
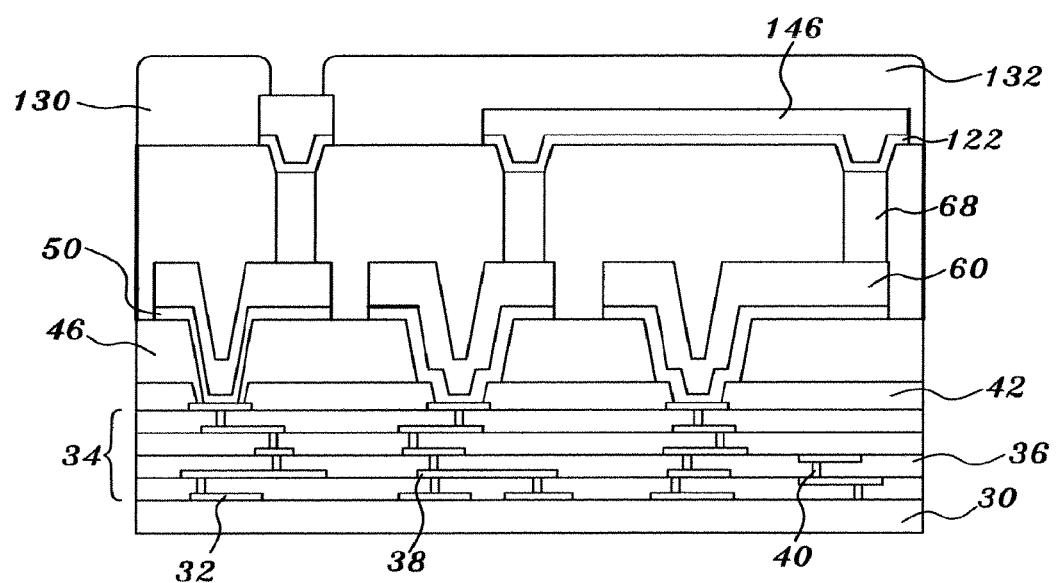
FIG. 18 is a sectional view schematically showing the procedures of forming a resistor element on the metallic posts according to the present invention.

This embodiment is derived from the structure of Embodiment 1 shown in FIG. 8b and is similar to Embodiment 4. Refer to FIG. 18. The fabrication method of this embodiment is similar to that of Embodiment 4. In Embodiment 4, the fifth metallic layer 130 is made of a low-resistance material and used as a contact pad. However, in Embodiment 5, the seventh metallic layer 146 is made of a high-resistance material, such as chromium-nickel alloy, titanium or tungsten, and is only 1~3 microns thick and functions as a resistor element.

Embodiment 6

Figure 19A:
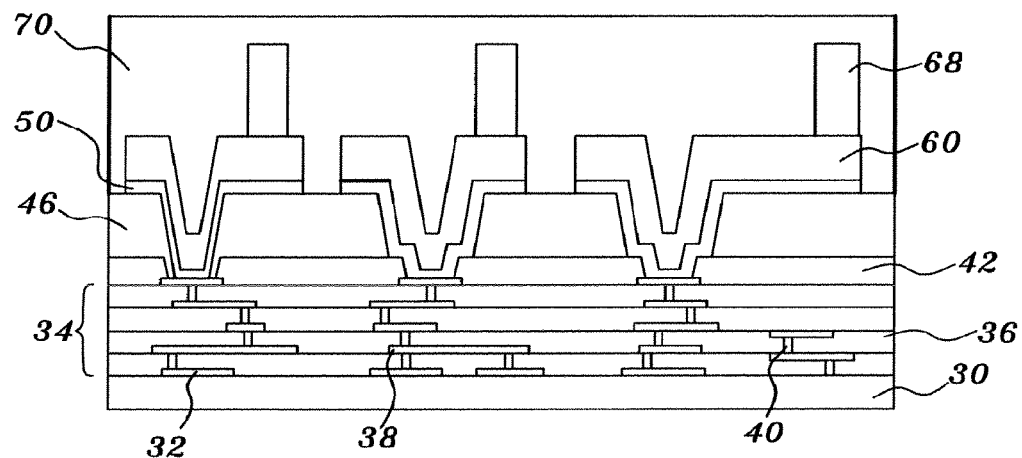
FIG. 19a and FIG. 19b are sectional views schematically showing that a portion of the second polymer layer is removed with an etching method according to the present invention.
Figure 19B:
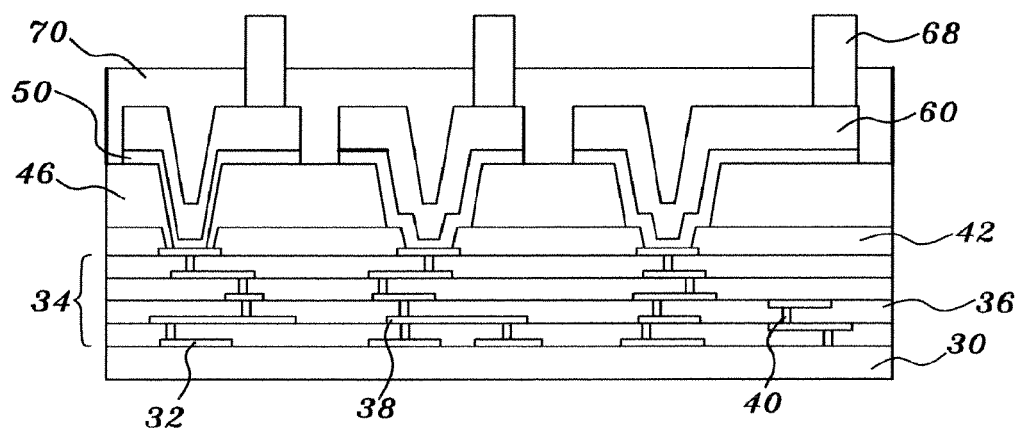
Figure 19C:
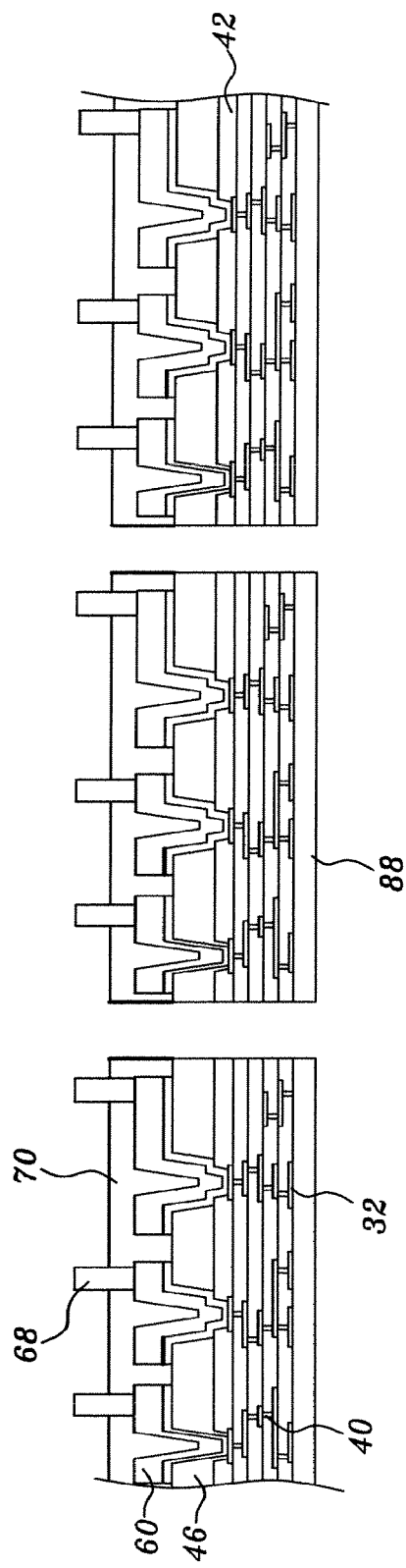
FIG. 19c is a sectional view schematically showing that the semiconductor substrate is diced according to the present invention.
Figure 19D:
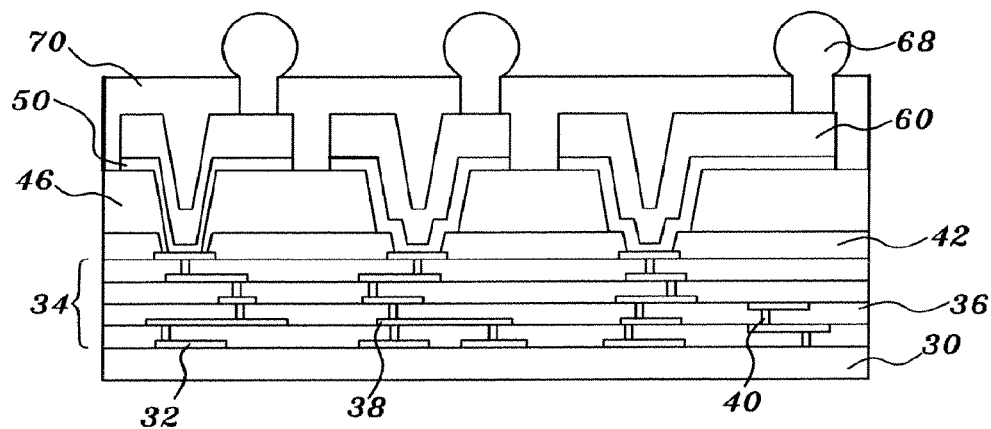
FIG. 19d and FIG. 19e are sectional views respectively schematically showing the procedures of forming solder balls and dicing the semiconductor substrate according to the present invention.

This embodiment is derived from the structure shown in FIG. 8a. As shown in FIG. 19a and FIG. 19.b, in this embodiment, the second polymer layer 70 is removed by first chemical mechanical polishing or mechanical grinding the second polymer layer 70, and then etching the second polymer layer 70 until the top ends and the upper portion of the side walls of the metal posts 68 are revealed. The distance from the top end of the metallic post 68 to the top surface of the second polymer layer 70 may range from 1 to 150 microns. When the topmost metal layer of the metallic post 68 is gold, copper, silver, palladium, platinum, rhodium, ruthenium, or rhenium, and the distance from the top end of the metallic post 68 to the top surface of the second polymer layer 70 may range from 15 to 30 microns, the revealed portion of the metallic post 68 may function as a bump. As shown in FIG. 19c, thereafter, the semiconductor substrate 30 may be similarly diced into multiple semiconductor units 88. The bumps on the semiconductor unit 88 can be similarly electrically connected to an external circuit with ACF (Anisotropic Conductive Film).

Figure 19E:
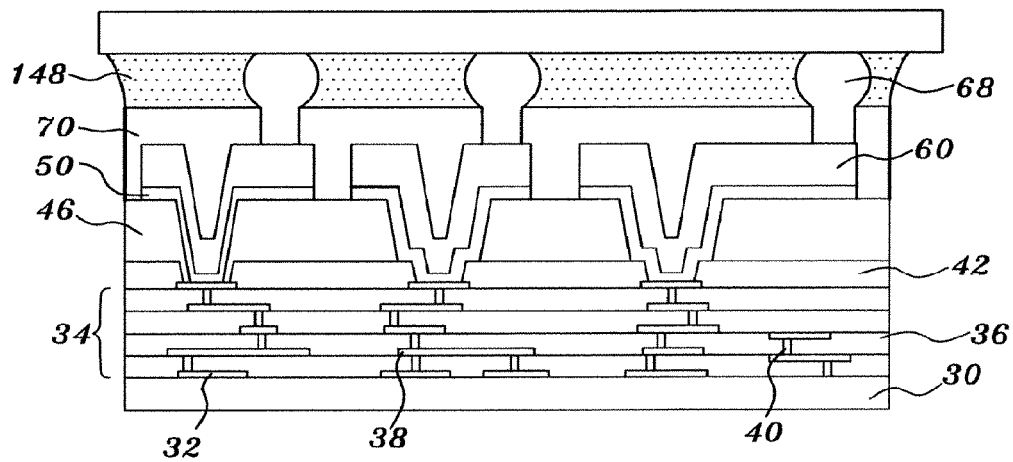

When the topmost metal layer of the metallic post 68 is solder, tin-lead alloy, tin-silver alloy, tin-silver-copper alloy or lead-free solder, and the distance from the top end of the metallic post 68 to the top surface of the second polymer layer 70 may range from 50 to 100 microns, a heating process can be performed to reflow the topmost solder layer of the metallic post 68 to form solder balls after polishing and etching the second polymer layer 70. As shown in FIG. 19e, thereafter, the semiconductor substrate 30 may be similarly diced into multiple semiconductor units. Next, the solder balls on the semiconductor unit are electrically connected to an external substrate, and then an eighth polymer layer 148 is filled into the gap between the semiconductor unit and the external substrate and covers every solder balls.

Figure 19F:
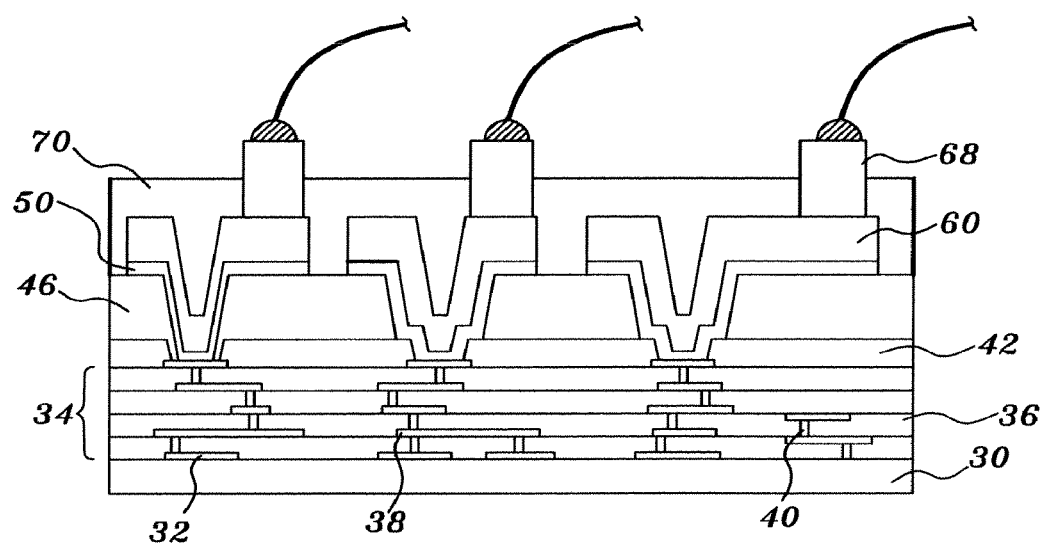
FIG. 19f is a sectional view schematically showing the procedures of forming contact pads according to the present invention.

Refer to FIG. 19f. When the topmost metal layer of the material of the metallic post 68 is gold, copper, silver, palladium, platinum, rhodium, ruthenium, or rhenium, and the distance from the top end of the metallic post 68 to the top surface of the second polymer layer 70 ranges from 1 to 10 microns, the revealed metallic post 68 may function as a contact pad. The contact pads can be connected to an external circuit with wires formed by a wire bonding process.

Figure 19G:
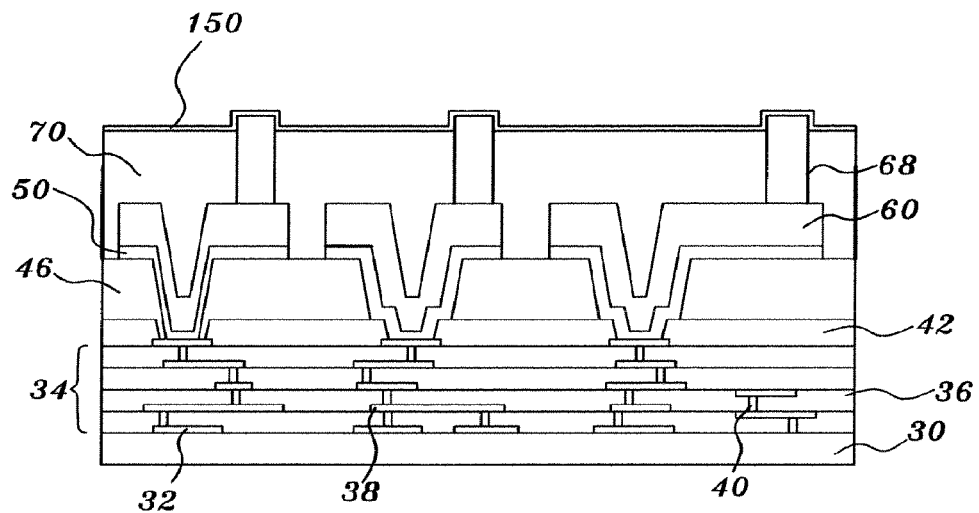
FIG. 19g to FIG. 19k are sectional views schematically showing the procedures of forming a metallic layer to interconnect two metallic posts according to the present invention.
Figure 19H:
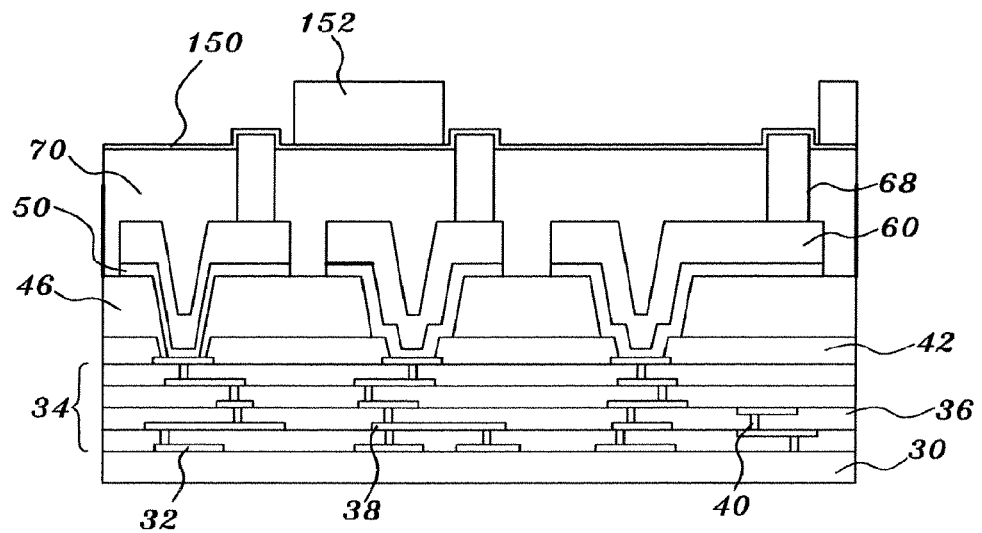
Figure 19I:
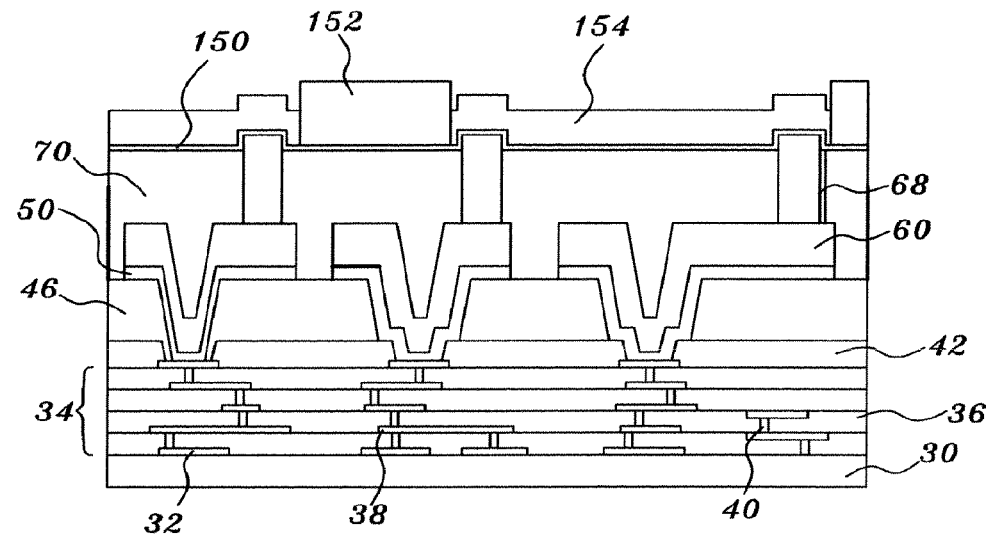
Figure 19J:
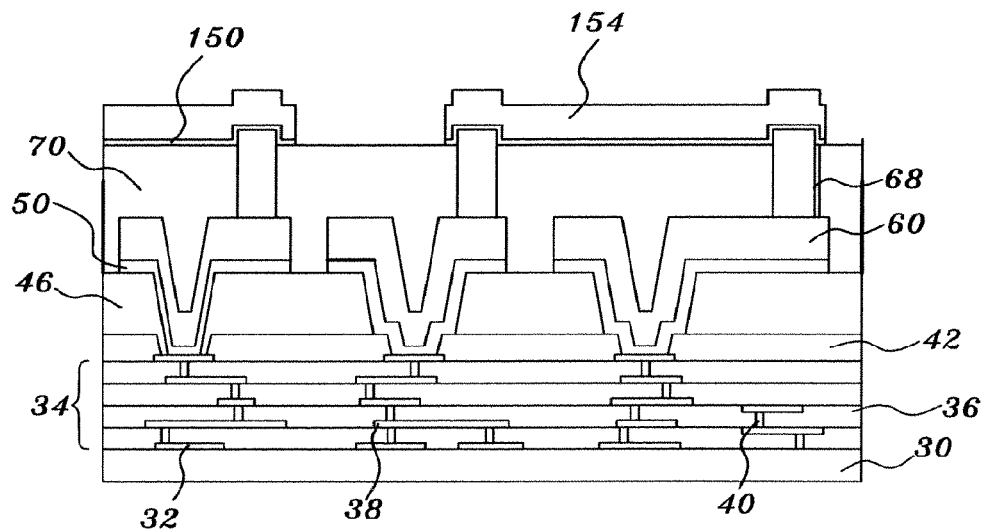
Figure 19K:
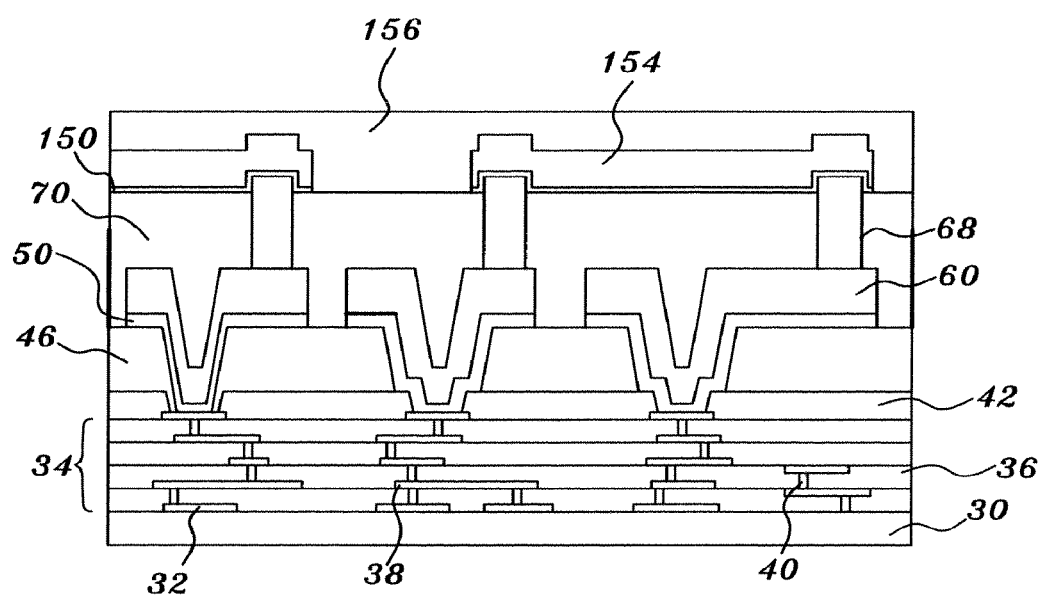

Refer to FIG. 19g. When the material of the metallic post 68 is gold, copper, silver, palladium, platinum, rhodium, ruthenium, or rhenium, and the distance from the top end of the metallic post 68 to the top surface of the second polymer layer 70 may range from 5000 angstroms to 10 microns, the revealed metallic post 68 may function as a contact pad. A sixth adhesion/barrier layer 150, such as titanium, titanium-tungsten alloy, chromium, tantalum, or tantalum nitride, having a thickness of between 1000 and 7500 angstroms is formed on the second polymer layer 70 and on the revealed surface of the metallic posts 68. A seed layer (not shown), such as copper or gold, having a thickness of between 500 and 3000 angstroms is formed on the sixth adhesion/barrier layer 150. As shown in FIG. 19h, a seventh patterned photoresist layer 152 is formed on the seed layer on the sixth adhesion/barrier layer 150, and openings in the seventh patterned photoresist layer 152 reveal the seed layer on the sixth adhesion/barrier layer 150. As shown in FIG. 19i, an eighth metallic layer 154 is electroplated on the seed layer exposed by the openings in the seventh patterned photoresist layer 152. The eighth metallic layer 154 may be formed by electroplating a single layer of gold, copper, silver, nickel, platinum, palladium, ruthenium, rhodium, or rhenium, having a thickness of between 1 and 30 microns. Alternatively, the eighth metallic layer 154 may be formed by electroplating a copper layer having a thickness of between 1 and 30 microns, next electroplating a nickel layer having a thickness of between 1 and 10 microns on the copper layer, and next electroplating a gold layer having a thickness of between 1 and 10 microns on the nickel layer. Preferably, the bottommost metal layer of the fourth metallic layer 114 has a same material as the seed layer. As shown in FIG. 19j, the seventh patterned photoresist layer 152 is removed, and then the seed layer and the sixth adhesion/barrier layer 150 not under the eighth metallic layer 154 are removed The eighth metallic layer 154 interconnects two metallic posts 68 and functions as an interconnection. As shown in FIG. 19k, a protection layer 156 is formed to cover the second polymer layer 70 and the eighth metallic layer 154 lest the eighth metallic layer 154 be damaged. The material of the protection layer 156 may be an organic or inorganic material or may be thermoplastic, thermosetting plastic, polyimide, BCB (Benzo-Cyclo-Butene), polyurethane, epoxy, parylene-based polymer, solder-mask material, elastic material, porous dielectric material, silicon oxide, compounds of silicon and oxygen, silicate and phosphate glass, silicon nitride, or silicon oxy-nitride.

Besides, a coil structure, a capacitor structure, a resistor structure, etc. may be connected to the pad formed by polishing and etching the second polymer layer 70 according to the above mentioned process in the embodiment, wherein the distance from the top end of the metallic post 68 to the top surface of the second polymer layer 70 may range from 5000 angstroms to 10 microns.

Embodiment 7

Figure 20A:
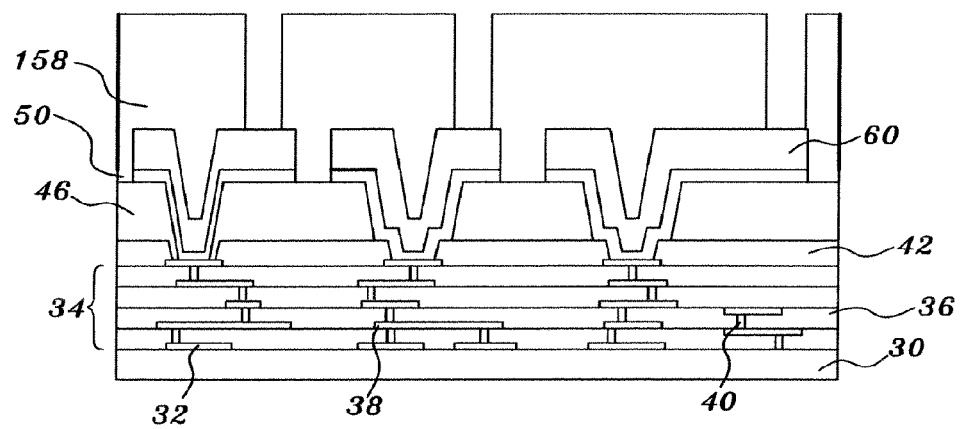
FIG. 20a is a sectional view schematically showing the procedures of forming a ninth patterned polymer layer on the semiconductor substrate according to the present invention.

The structure of this embodiment is similar to that shown in FIG. 8c, but the methods thereof are different for forming the metallic post 68 and the second polymer layer 70. As shown in FIG. 20a, after electroplating the first RDL 60, the photoresist layer 54 is removed and the seed layer and the adhesion/barrier layer not under the first RDL 60 are sequentially removed following FIG. 6a. Thereafter, a ninth patterned polymer layer 158 is formed on the first RDL 60 and on the polymer layer 46, and the openings in the ninth patterned polymer layer 158 are 20~200 microns deep and expose the first RDL 60.

The material of the ninth patterned polymer layer 158 is thermoplastic, thermosetting plastic, polyimide, BCB (Benzo-Cyclo-Butene), polyurethane, epoxy, parylene-based polymer, solder-mask material, elastic material, or porous dielectric material. The ninth patterned polymer layer 158 is fabricated via heat-pressing a patterned dry film onto the semiconductor substrate 30, or via heat-pressing a photosensitive dry film onto the semiconductor substrate 30 and patterning the photosensitive dry film with a photolithographic method, or via heat-pressing a non-photosensitive dry film onto the semiconductor substrate 30 and patterning the non-photosensitive dry film with a photolithographic method plus an etching method, or via screen-printing the ninth polymer layer 158 where multiple openings are simultaneously formed in the ninth polymer layer 156, or via spin-coating a photosensitive film onto the semiconductor substrate 30 and patterning the photosensitive film with a photolithographic method, or via spin-coating a non-photosensitive film onto the semiconductor substrate 30 and patterning the non-photosensitive film with a photolithographic method plus an etching method.

Figure 20B:
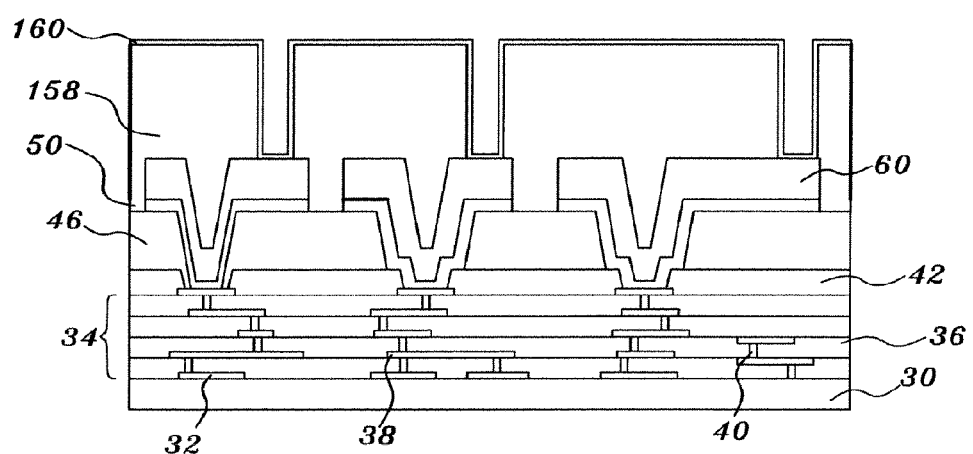
FIG. 20b to FIG. 20d are sectional views schematically showing the procedures of forming the metallic posts with a Damascene method according to the present invention.
Figure 20C:
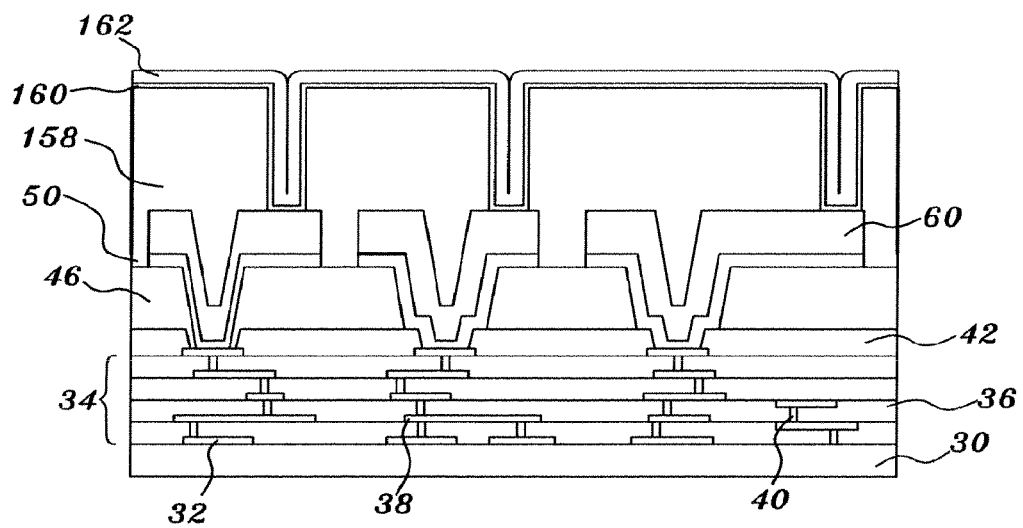

As shown in FIG. 20b, a seventh adhesion/barrier layer 160, such as titanium, titanium-tungsten alloy, chromium, tantalum, or tantalum nitride, having a thickness of between 400 and 7000 Å is sputtered on the ninth patterned polymer layer 158, on the first RDL 60 exposed by the openings in the ninth patterned polymer layer 158, and on the side walls of the openings in the ninth patterned polymer layer 158. A seed layer (not shown), such as copper or gold, having a thickness of between 500 and 7500 angstroms is sputtered on the seventh adhesion/barrier layer 160. As shown in FIG. 20c, a ninth metallic layer 162 is electroplated with a Damascene method on the seed layer on the seventh adhesion/barrier layer 160 until the ninth metallic layer 162 fills all remaining space in the openings in the ninth patterned polymer layer 158. The ninth metallic layer 162 may be formed by electroplating a copper layer having a thickness of between 1 and 30 microns on the seed layer, preferably made of copper, exposed by the openings in the ninth patterned polymer layer 158. Alternatively, the ninth metallic layer 162 may be formed by electroplating a gold layer having a thickness of between 1 and 30 microns on the seed layer, preferably made of gold, exposed by the openings in the ninth patterned polymer layer 158.

Figure 20D:
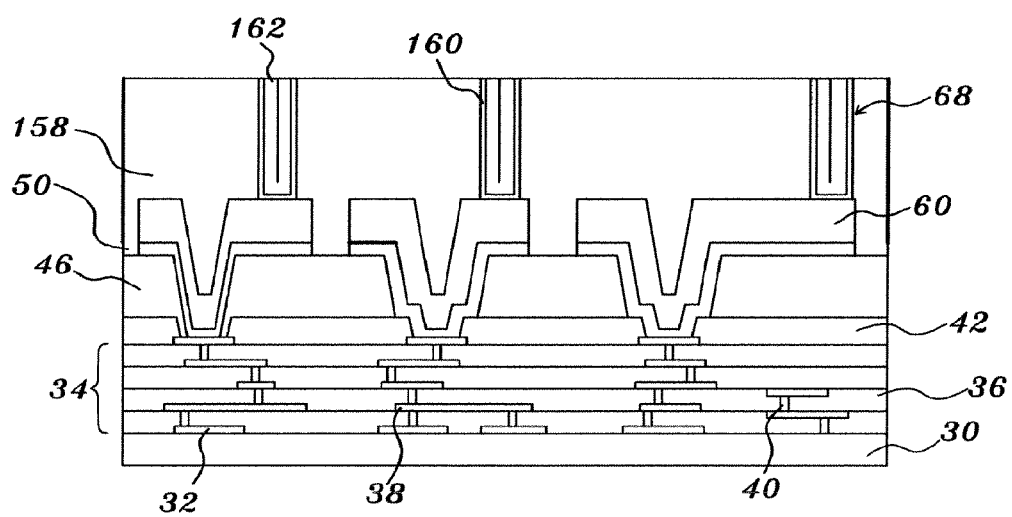
Figure 21A:
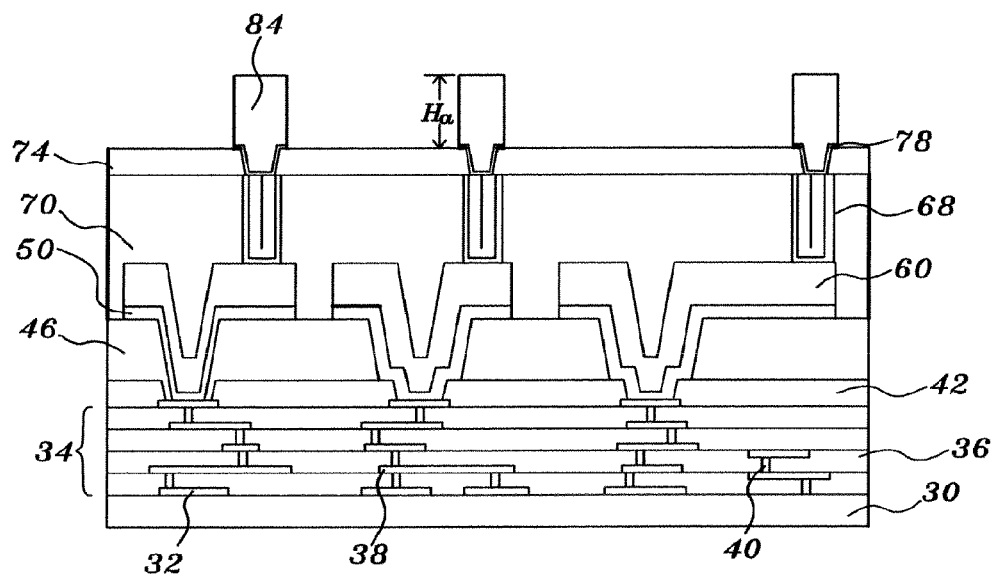
FIG. 21a to FIG. 21d are sectional views respectively schematically showing the structures of the bump, contact pad, solder ball and RDL according to the present invention.
Figure 21B:
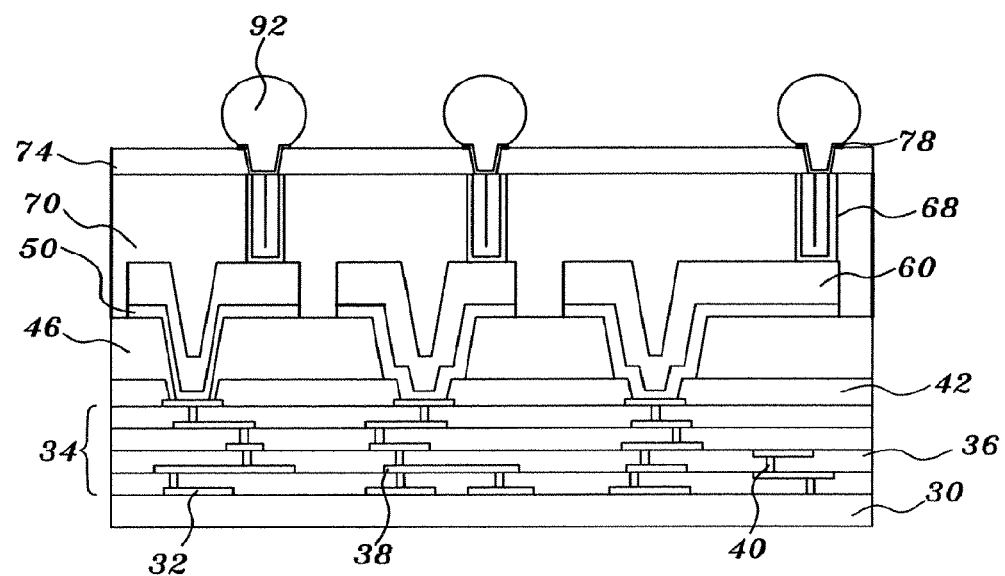
Figure 21C:
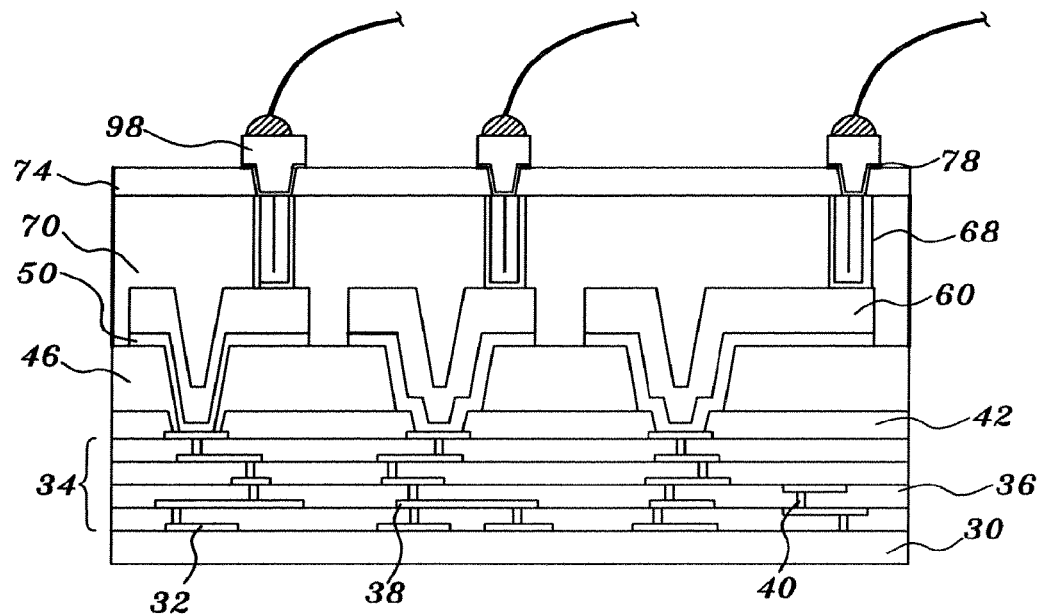
Figure 21D:
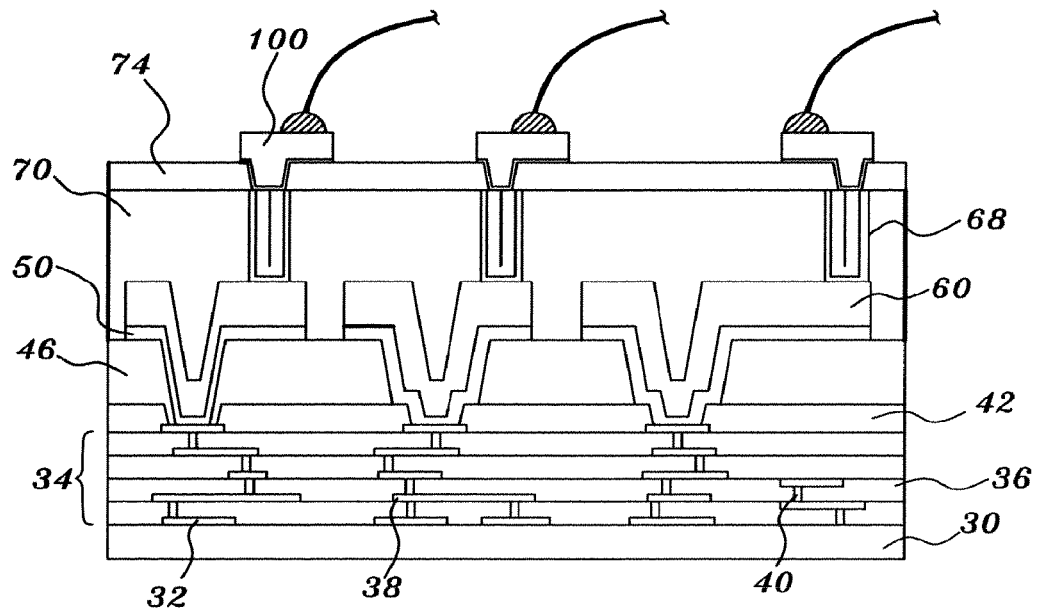
Figure 22:
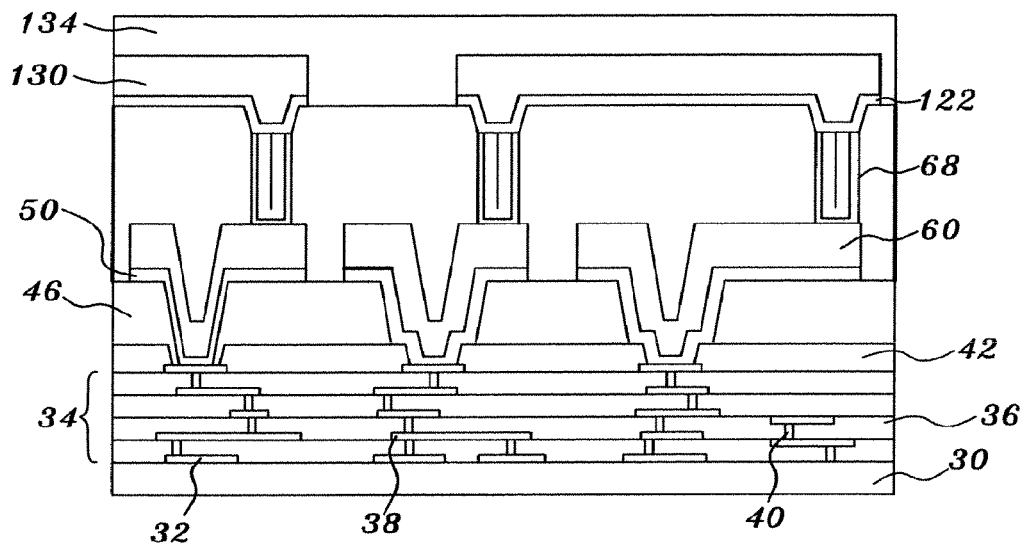
FIG. 22 to FIG. 25 are sectional views respectively schematically showing the structures of the current freeway, coil, capacitor element, and resistor element according to the present invention.
Figure 23:
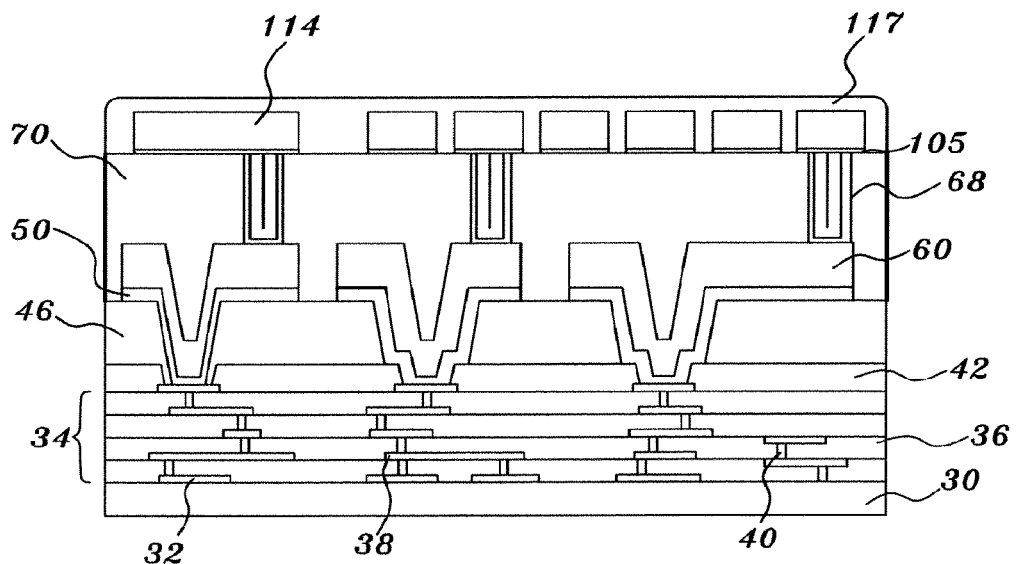
Figure 24:
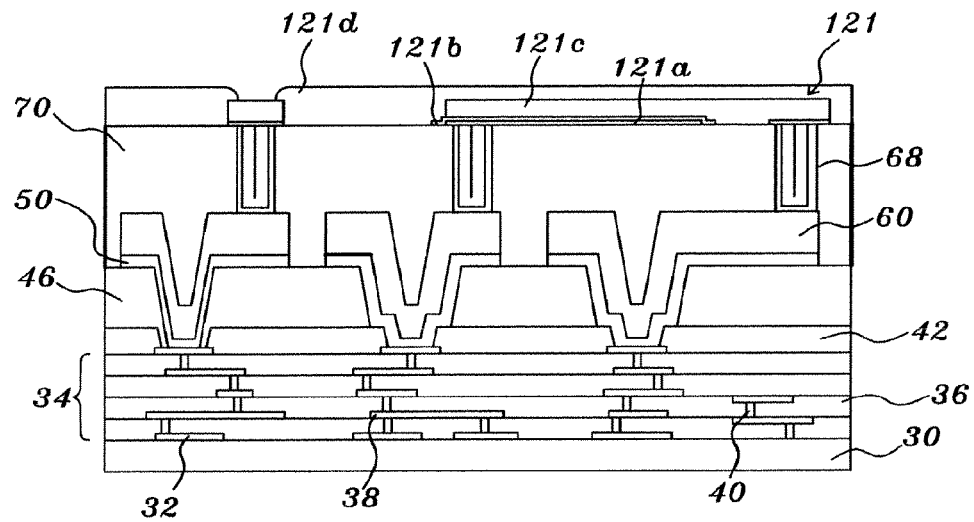
Figure 25:
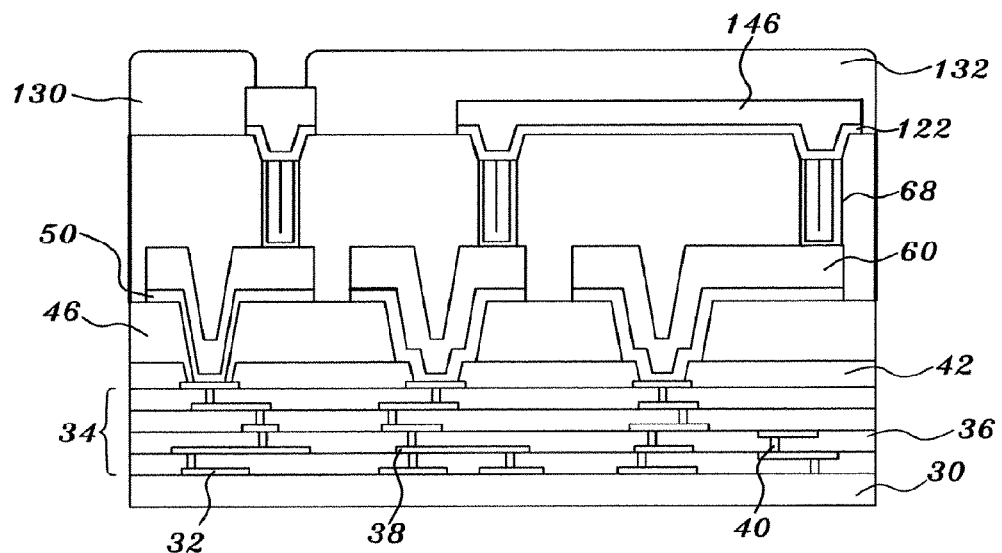

As shown in FIG. 20d, the ninth metallic layer 162, the seed layer and the seventh adhesion/barrier layer 160 outside the openings in the ninth patterned polymer layer 158 are removed with a chemical mechanical polishing (CMP) method or a mechanical grinding method. Thereby, the metallic posts 68 are formed. The ratio of the maximum horizontal dimension Hw of the metallic post 68 to the height Ht of the metallic post 68 is less than 4 or even less than 1. The maximum horizontal dimension of the metallic post 68 is 3~50 microns; the spacing between the centers of the neighboring metallic posts 68 is 10~250 microns.

The metallic post 68 formed with the Damascene method has a similar profile to that disclosed in FIG. 8c; therefore, the method to fabricate other elements above the ninth patterned polymer layer 158 and the metallic posts 68 is the same as those formed in the abovementioned embodiments.

FIG. 21a through FIG. 21d disclose the bumps, contact pads, solder balls and RDL's formed on the ninth patterned polymer layer 158 and the metallic posts 68. Herein, only the completed structures are disclosed; the fabrication methods thereof have been stated in the above-mentioned embodiments and will not be described repeatedly.

FIG. 22 to FIG. 25 disclose the interconnection metal trace, coil, capacitor element, and resistor element formed on the ninth patterned polymer layer 158 and on the metallic posts 68. Herein, only the completed structures are disclosed; the fabrication methods thereof have been stated in the above-mentioned embodiments and will not be described repeatedly.

The present invention can apply to release stress and reduce the spacing between metal posts to be less than 250 microns. Further, the present invention can increase the pin count to be more than 400. Furthermore, the present invention can greatly reduce the impedance and loading of the metallic connection circuit of low-power IC elements and then effectively promote the performance of IC elements.

Those embodiments described above are to clarify the present invention to enable the persons skilled in the art to understand, make and use the present invention. However, it is not intended to limit the scope of the scope of the present invention, and any equivalent modification and variation according to the spirit of the present invention is to be also included within the scope of the claims of the present invention stated below.

What is claimed is:

1. A circuit component comprising:
   a semiconductor substrate;
   multiple transistors on said semiconductor substrate;
   a first dielectric layer coupled to said semiconductor substrate;
   a conductive structure coupled to said first dielectric layer, wherein said conductive structure comprises a first circuit layer and a second circuit layer coupled to said first circuit layer;
   a second dielectric layer between said first and second circuit layers;
   an insulating layer coupled to said conductive structure and coupled to said first and second dielectric layers, wherein said insulating layer comprises a nitride layer, wherein a first opening in said insulating layer exposes a contact point of said conductive structure;
   a first conductive layer on said contact point and coupled to said insulating layer, wherein said first conductive layer is coupled to said contact point through said first opening, wherein said first conductive layer having a thickness between 2 and 30 micrometers and coupled to said contact point and coupled to said insulating layer;
   a first conductive post on said first conductive layer, wherein said first conductive post contacts said first conductive layer, wherein said first conductive post is coupled to to said contact point through said first conductive layer;
   a first polymer material on said first conductive layer and coupled to said insulating layer, wherein said first polymer material contacts a sidewall of said first conductive post, wherein said first polymer material has a first surface at a same level as a second surface of said first conductive post;

a second polymer material on said first polymer material, wherein an opening in said second polymer material exposes said second surface of said first conductive post;

a second conductive layer coupled to said second surface of said first conductive post and within said opening that exposes said second surface of said first conductive post; and a tin-containing solder on said second conductive layer, wherein said tin-containing solder is connected to said second conductive layer and is connected to said first conductive layer through said first conductive post, at least a portion of said tin-containing solder being within said opening that exposes said second surface of said first conductive post.

2. The circuit component of claim 1 further comprising a second conductive post coupled to said semiconductor substrate and in said first polymer material, wherein said second conductive post has a third surface at a same horizontal level as said first and second surfaces, wherein a pitch between said first conductive post and said second conductive post is between 10 and 250 micrometers.

3. The circuit component of claim 1, wherein said second circuit layer comprises electroplated copper.

4. The circuit component of claim 1, wherein said nitride layer has a thickness between 0.2 and 1.2 micrometers.

5. The circuit component of claim 1, wherein said second conductive layer has a thickness between 1 and 100 micrometers.

6. The circuit component of claim 1 further comprising a polymer layer on said insulating layer, wherein a second opening in said polymer layer exposes said contact point, wherein said first conductive layer is further on said polymer layer and in said second opening.

7. The circuit component of claim 1, wherein said first conductive layer further comprises a titanium-containing layer on said contact point and coupled to said insulating layer, wherein said first conductive layer is further coupled to said titanium-containing layer.

8. The circuit component of claim 1 further comprising a nickel layer on said second conductive layer, wherein said tin-containing solder is further coupled to said nickel layer.

9. The circuit component of claim 8, wherein said nickel layer has a thickness between 1 and 10 micrometers.

10. The circuit component of claim 1, wherein said tin-containing solder comprises a tin-silver alloy.

11. The circuit component of claim 1 further comprising a titanium-containing layer on said second surface, wherein said second conductive layer is further coupled to said titanium-containing layer.

12. The circuit component of claim 1 further comprising a third conductive layer on said second surface, wherein said second conductive layer is further on said third conductive layer.

13. A circuit component comprising:
a semiconductor substrate;
multiple transistors on said semiconductor substrate;
a first dielectric layer coupled to said semiconductor substrate;
a conductive structure coupled to said first dielectric layer, wherein said conductive structure comprises a first circuit layer and a second circuit layer coupled to said first circuit layer;

a second dielectric layer between said first and second circuit layers;

an insulating layer coupled to said conductive structure and coupled to said first and second dielectric layers, wherein said insulating layer comprises a nitride layer, wherein a first opening in said insulating layer exposes a contact point of said conductive structure;

a first conductive layer on said contact point and coupled to said insulating layer, wherein said first conductive layer is connected to said contact point through said first opening, wherein said first conductive layer having a thickness between 2 and 30 micrometers and coupled to said contact point and coupled to said insulating layer;

a first conductive post on said first conductive layer, wherein said first conductive post contacts said first conductive layer, wherein said first conductive post is connected to said contact point through said first conductive layer;

a first polymer material on said first conductive layer and coupled to said insulating layer, wherein said first polymer material contacts a sidewall of said first conductive post, wherein said first polymer material has a first surface at a same horizontal level as a second surface of said first conductive post;

a second polymer material on said first polymer material, wherein an opening in said second polymer material exposes said second surface of said first conductive post; and a second conductive layer coupled to said second surface, wherein said second conductive layer has a thickness between 1 and 100 micrometers, wherein said second conductive layer is connected to said first conductive layer through said first conductive post.

14. The circuit component of claim 13 further comprising a second conductive post coupled to said semiconductor substrate and in said first polymer material, wherein said second conductive post has a third surface at a same horizontal level as said first and second surfaces, wherein a pitch between said first conductive post and said second conductive post is between 10 and 250 micrometers.

15. The circuit component of claim 13, wherein said second circuit layer comprises electroplated copper.

16. The circuit component of claim 13, wherein said nitride layer has a thickness between 0.2 and 1.2 micrometers.

17. The circuit component of claim 13 further comprising a polymer layer on said insulating layer, wherein a second opening in said polymer layer is coupled to said contact point, wherein said first conductive layer is further on said polymer layer and in said second opening.

18. The circuit component of claim 13, wherein said first conductive layer further comprises a titanium-containing layer on said contact point and coupled to said insulating layer, wherein said first conductive layer is further coupled to said titanium-containing layer.

19. The circuit component of claim 13 further comprising a nickel layer on said second conductive layer.

20. The circuit component of claim 19, wherein said nickel layer has a thickness between 1 and 10 micrometers.

21. The circuit component of claim 13 further comprising a titanium-containing layer on said second surface, wherein said second conductive layer is further coupled to said titanium-containing layer.

22. The circuit component of claim 13 further comprising a third conductive layer on said second surface, wherein said second conductive layer is further on said third conductive layer.

* * * * *